(12) United States Patent
Palmstrom et al.

(10) Patent No.: US 11,765,964 B2
(45) Date of Patent: Sep. 19, 2023

(54) COMPOSITIONS AND METHODS FOR STABILIZING PEROVSKITE INTERFACES

(71) Applicant: Alliance for Sustainable Energy, LLC, Golden, CO (US)

(72) Inventors: Axel Finn Palmstrom, Golden, CO (US); Kai Zhu, Littleton, CO (US); Fei Zhang, Tianjin (CN); Joseph Jonathan Berry, Boulder, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 278 days.

(21) Appl. No.: 17/388,235

(22) Filed: Jul. 29, 2021

(65) Prior Publication Data
US 2022/0037597 A1 Feb. 3, 2022

Related U.S. Application Data

(60) Provisional application No. 63/059,441, filed on Jul. 31, 2020.

(51) Int. Cl.
| | |
|---|---|
| *H01L 31/0248* | (2006.01) |
| *H10K 85/30* | (2023.01) |
| *H01G 9/00* | (2006.01) |
| *H01G 9/20* | (2006.01) |
| *H10K 30/30* | (2023.01) |
| *H10K 50/135* | (2023.01) |
| *H10K 71/10* | (2023.01) |

(52) U.S. Cl.
CPC ........... *H10K 85/30* (2023.02); *H01G 9/0036* (2013.01); *H01G 9/2009* (2013.01); *H10K 30/30* (2023.02); *H10K 50/135* (2023.02); *H10K 71/10* (2023.02)

(58) Field of Classification Search
None
See application file for complete search history.

(56) References Cited

U.S. PATENT DOCUMENTS

2018/0351019 A1* 12/2018 Zhu .................. H01L 31/055
2020/0294728 A1* 9/2020 Zhu .................. H10K 30/30
(Continued)

FOREIGN PATENT DOCUMENTS

WO 2015170445 A1 11/2015

OTHER PUBLICATIONS

Abate, A. et al., "Supramolecular Halogen Bond Passivation of Organic-Inorganic Halide Perovskite Solar Cells," Nano Letters, vol. 14, 2014, 8 pages.
(Continued)

*Primary Examiner* — Benjamin P Sandvik
(74) *Attorney, Agent, or Firm* — Michael A. McIntyre

(57) ABSTRACT

The present disclosure relates to a composition that includes a first layer that includes a perovskite defined by $ABX_3$ and a second layer that includes a perovskite-like material defined by at least one of $A'_2B'X'_4$, $A'_3B'_2X'_9$, $A'B'X'_4$, $A'_2B'X'_6$, and/or $A'_2AB'_2X'_7$, where the first layer is adjacent to the second layer, A is a first cation, B is a second cation, X is a first anion, A' is a third cation, B' is a fourth cation, X' is a second anion, and A' is different than A.

20 Claims, 40 Drawing Sheets

(56) References Cited

U.S. PATENT DOCUMENTS

| | | | |
|---|---|---|---|
| 2021/0028381 A1* | 1/2021 | Noh | H10K 30/151 |
| 2023/0157039 A1* | 5/2023 | Zhu | H10K 85/50 |
| | | | 136/263 |

OTHER PUBLICATIONS

Anaraki, E.H. et al., "Highly efficient and stable planar perovskite solar cells by solution-processed tin oxide," Energy & Environmental Science, vol. 9, 2013, 7 pages.

Ashiotis, G. et al., "The fast azimuthal integration Python library: pyFAI," Journal of Applied Crystallography, vol. 48, 2015, 10 pages.

Han, N. et al., "Boosting the efficiency of quasi two-dimensional perovskite solar cells via an interfacial layer of metallic nanoparticles," Elsevier Organic Electronics, vol. 74, 2019, 7 pages.

Hou, Y. et al., "Efficient tandem solar cells with solution-processed perovskite on textured crystalline silicon," Science, vol. 367, 2020, 6 pages.

Jang, Y.W. et al., "Intact 2D/3D halide junction perovskite solar cells via solid-hase in-plane growth," Nature Energy, vol. 6, 2021, 12 pages.

Jodlowski, A.D. et al., "Large guanidinium cation mixed with methylammonium in lead iodide perovskites for 19% efficient solar cells," Nature Energy, vol. 2, Dec. 2017, 8 pages.

Khenkin, M.V. et al., "Consensus statement for stability assessment and reporting for perovskite photovoltaics based on ISOS procedures," Nature Energy, vol. 5, 2020, 5 pages.

Kim, H. et al., "Optimal Interfacial Engineering with Different Length of Alkylammonium Halide for Efficient and Stable Perovskite Solar Cells," Advanced Energy Materials, 2019, 8 pages.

Lee, K. et al., "A highly stable and efficient carbon electrode-based perovskite solar cell achieved via interfacial growth of 2D PEA2PbI4 perovskite," Journal of Materials Chemistry A, vol. 6, 2018, 9 pages.

Lian, X. et al., "Solvation effect in precursor solution enables over 16% efficiency in thick 2D perovskite solar cells," Journal of Materials Chemistry A, vol. 7, 2019, 7 pages.

Liao, M. et al., "Efficient and Stable FASnI3 Perovskite Solar Cells with Effective Interface Modulation by Low-Dimensional Perovskite Layer," ChemSusChem, vol. 12, 2019, 8 pages.

Lin, Y. et al., "Enhanced Thermal Stability in Perovskite Solar Cells by Assembling 2D/3D Stacking Structures," Journal of Physical Chemistry Letters, vol. 9, 2018, 5 pages.

Lin, D. et al., "Stable and scalable 3D-2D planar heterojunction perovskite solar cells via vapor deposition," Elsevier Nano Energy, vol. 59, 2019, 7 pages.

Lv, Y. et al., "Bromine Doping as an Efficient Strategy to Reduce the Interfacial Defects in Hybrid Two-Dimensional/Three-Dimensional Stacking Perovskite Solar Cells," Applied Materials & Interfaces, vol. 10, 2018, 10 pages.

Perkins, C.L. et al., "Surfactant-assisted growth of CdS thin films for photovoltaic applications," Journal of Vacuum Society Technology A, vol. 24, No. 3, May/Jun. 2006, 8 pages.

Schlipf, J. et al., "Shedding Light on the Moisture Stability of 3D/2D Hybrid Perovskite Heterojunction Thin Films," Applied Energy Materials, vol. 2, 2019, 8 pages.

Uddin, M.A. et al., "Halide exchange and surface modification of metal halide perovskite nanocrystals with alkyltrichlorosilanes," RSC Nanoscale, vol. 10, 2018, 9 pages.

Wang, Z. et al., "Efficient ambient-air-stable solar cells with 2D-3D heterostructured butylammonium-caesium-formamidinium lead halide perovskites," Nature Energy, vol. 2, Aug. 2017, 10 pages.

Wojciechowski, K. et al., "Heterojunction Modification for Highly Efficient Organic-Inorganic Perovskite Solar Cells," vol. 8, No. 12, 2014, 9 pages.

Xiao, C. et al., "Junction Quality of SnO2-Based Perovskite Solar Cells Investigated by Nanometer-Scale Electrical Potential Profiling," ACS Applied Materials & Interfaces, vol. 9, 2017, 8 pages.

Xiao, C. et al., "SMART Perovskite Growth: Enabling a Larger Range of Process Conditions," ACS Energy Letters, vol. 6, 2021, 9 pages.

Ye, J.Y. et al., "Enhancing Charge Transport of 2D Perovskite Passivation Agent for Wide-Bandgap Perovskite Solar Cells Beyond 21%," Wiley Solar RRL, vol. 4, 2020, 8 pages.

Zhang, F. et al., "Enhanced Charge Transport in 2D Perovskites via Fluorination of Organic Cation," Journal of the American Chemical Society, vol. 141, 2019, 8 pages.

Zhang, F. et al., "Surface lattice engineering through three-dimensional lead iodide perovskitoid for high-performance perovskite solar cells," Chem 7, Mar. 11, 2021, 13 pages.

Zhang, Q. et al., "Improved Moisture Stability of 2D Hybrid Perovskite (HOOC-CH2-NH3)2PbI4 by Dehydration Condensation between Organic Components," Applied Energy Materials, vol. 1, 2018, 10 pages.

Jarawila, S. et al., "Approaching the limits of optoelectronic performance in mixed cation mixed halide perovskites by controlling surface recombination," arXiv:2006.04025v1; Jun. 7, 2020, 53 pages.

* cited by examiner a)  C-C bonds: 3   NH₂   C-NH₂ bonds: 1

US 11,765,964 B2

COMPOSITIONS AND METHODS FOR STABILIZING PEROVSKITE INTERFACES

CROSS-REFERENCE TO RELATED APPLICATIONS

This application claims priority from U.S. Provisional Patent Application No. 63/059,441 filed on Jul. 31, 2020, the contents of which is incorporated herein by reference in its entirety.

CONTRACTUAL ORIGIN

This invention was made with government support under Contract No. DE-AC36-08GO28308 awarded by the Department of Energy. The government has certain rights in the invention.

BACKGROUND

Solution processing of two-dimensional (2D) surface layers faces challenges in controlling the structural, chemical, and/or electronic properties of the 2D surface layer and its interface with an underlying 3D perovskite layer. Among other things, the solvent used during solution processing of a 2D surface layer can also negatively affect the underlying 3D perovskite absorber. Thus, there remains a need for improved processing methods capable of producing better quality 2D materials and 2D/3D bilayers.

SUMMARY

An aspect of the present disclosure is a composition that includes a first layer that includes a perovskite defined by $ABX_3$ and a second layer that includes a perovskite-like material defined by at least one of $A'_2B'X'_4$, $A'_3B'_2X'_9$, $A'B'X'_4$, $A'_2B'X'_6$, and/or $A'_2AB'_2X'_7$, where the first layer is adjacent to the second layer, A is a first cation, B is a second cation, X is a first anion, A' is a third cation, B' is a fourth cation, X' is a second anion, and A' is different than A. In some embodiments of the present disclosure, A' may include an ammonium functional group. In some embodiments of the present disclosure, A' may include at least one of butylammonium (BA), phenylethylammonium (PEA), 4-flouorophenethylammonium (F-PEA), N-methyl-1,3-propane diammonium (ME-PDA), 1,4-butane diammonium (BDA), or N,N-dimethyl-1,3-propane diammonium (DMePDA), dipropylammonium, and/or diethylammonium.

In some embodiments of the present disclosure, the second layer may have a thickness between about 1 nm and about 1 µm. In some embodiments of the present disclosure, the thickness may be between about 10 nm and about 100 nm. In some embodiments of the present disclosure, the first layer may have a thickness between about 200 nm and about 1000 nm. In some embodiments of the present disclosure, X may include a halide. In some embodiments of the present disclosure, X may include at least one of iodide, bromide, and/or chloride. In some embodiments of the present disclosure, B may include at least one of tin and/or lead. In some embodiments of the present disclosure, A may include at least one of methylammonium (MA), formamidinium (FA), dimethylammonium, and/or cesium. In some embodiments of the present disclosure, the perovskite may include $FA_{(1-x-y)}MA_xCs_yPbI_{(3-z)}Br_z$.

In some embodiments of the present disclosure, X' may include a halide. In some embodiments of the present disclosure, X' may include at least one of iodide, bromide, and/or chloride. In some embodiments of the present disclosure, B' may include at least one of tin and/or lead. In some embodiments of the present disclosure, the perovskite-like material may include $BA_2(MA_xFA_{1-x})Pb_2(I_{1-y}Br_y)_7$. In some embodiments of the present disclosure, the perovskite-like material may include at least one of $BA_2PbI_4$, $BA_2PbBr_4$, $BA_2MAPb_2I_7$, $BA_2FAPb_2I_7$, $BA_2MAPb_2Br_7$, and/or $BA_2FAPb_2Br_7$.

An aspect of the present disclosure is a device that includes a first layer where the first layer includes a perovskite and has a surface that is substantially planar, where the surface includes a cut into the surface, and the cut penetrates the surface and the first layer and has a width, a depth, a length, and an internal surface. The device also includes a second layer that includes a perovskite-like material, where the second layer covers at least a portion of the internal surface.

An aspect of the present disclosure is a method that includes depositing a second layer onto a first layer, where the first layer includes a perovskite, the second layer includes a perovskite-like layer, and the depositing is performed using at least one of a solution method and/or a vapor-phase method. In some embodiments of the present disclosure, the depositing may be performed using a vapor-phase method while simultaneously heating at least a portion of the first layer. In some embodiments of the present disclosure, the depositing may be performed using an atomic layer deposition (ALD) technique.

BRIEF DESCRIPTION OF DRAWINGS

Some embodiments are illustrated in referenced figures of the drawings. It is intended that the embodiments and figures disclosed herein are to be considered illustrative rather than limiting.

REFERENCE NUMERALS

Figure 1A:
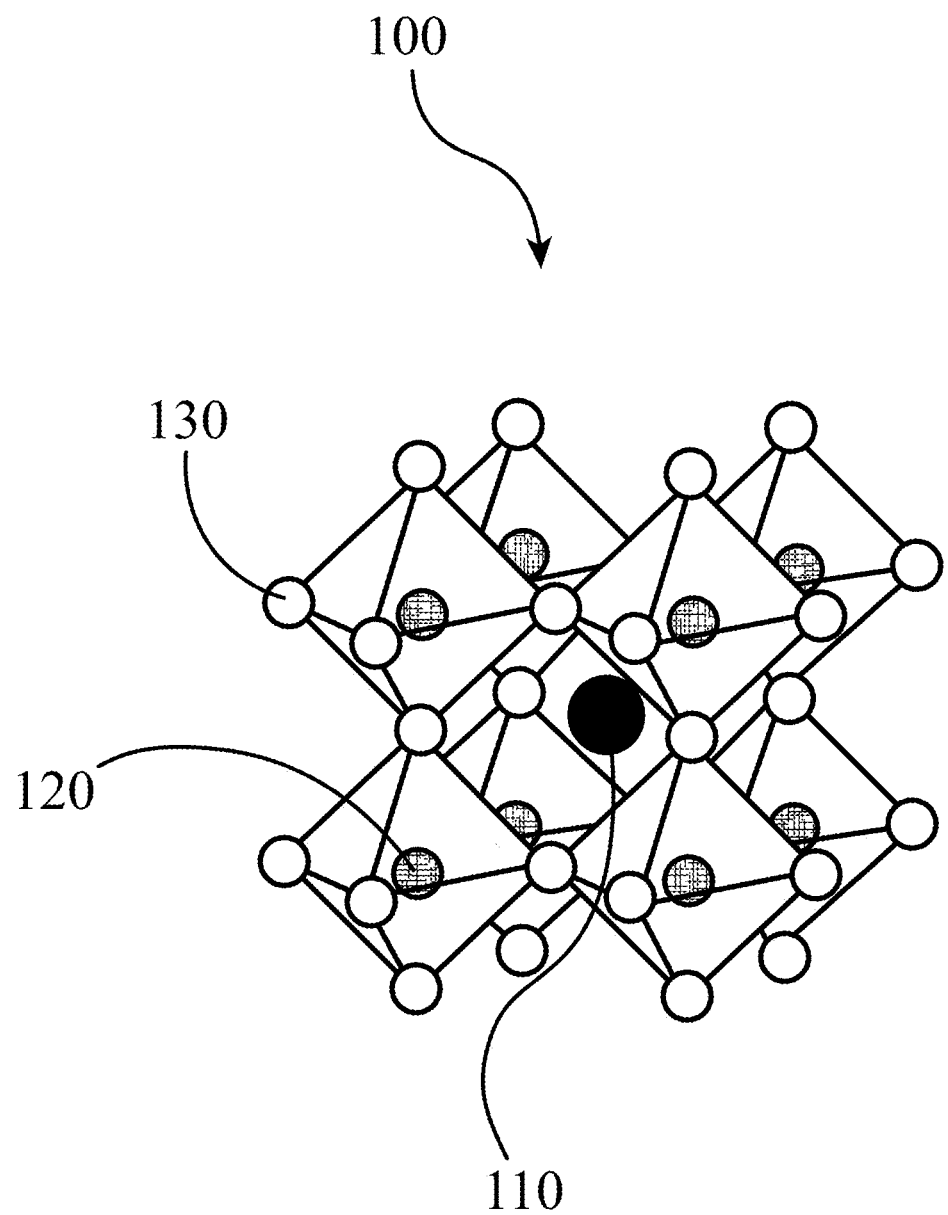
FIGS. 1A and 1B illustrate a perovskite in a corner-sharing, cubic phase arrangement, according to some embodiments of the present disclosure.

100 . . . perovskite
110 . . . A-cation
120 . . . B-cation
130 . . . X-anion
300 . . . device
310 . . . substrate
320 . . . first contact layer
330 . . . first charge transport layer (e.g., ETL)
340 . . . perovskite layer
350 . . . second charge transport layer (e.g., HTL)
360 . . . second contact layer
370 . . . surface and/or interface
500 . . . perovskite-like layer
510 . . . surface

DETAILED DESCRIPTION

The embodiments described herein should not necessarily be construed as limited to addressing any of the particular problems or deficiencies discussed herein. References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

The present disclosure relates to the use of organic materials and/or inorganic materials to treat perovskites and/or perovskite-containing materials, resulting in better performing perovskite-containing devices having, among other things, improved long-term stability. In some embodiments of the present disclosure, an organic and/or inorganic material may be applied to a surface of a perovskite resulting in improved long-term stability of the perovskite and in the perovskite-containing device, for example, a solar cell, or a light-emitting diode (LED). Control of the surfaces and/or interfaces of halide PSCs is critical for both their efficiency and stability. For example, the impact of the scribing process used to create individual cells creating a "monolithically" integrated module is important for high-speed manufacturing of halide PSCs. However, creating a stable halide PSC depends on, among other things, the control and passivation of the functional surfaces and/or interfaces of the device stack. The scribing process to create a monolithically integrated module introduces additional interfaces, that if not controlled, can negatively impact module stability and overall module performance. The materials and methods described herein address these and other problems.

Figure 1B:
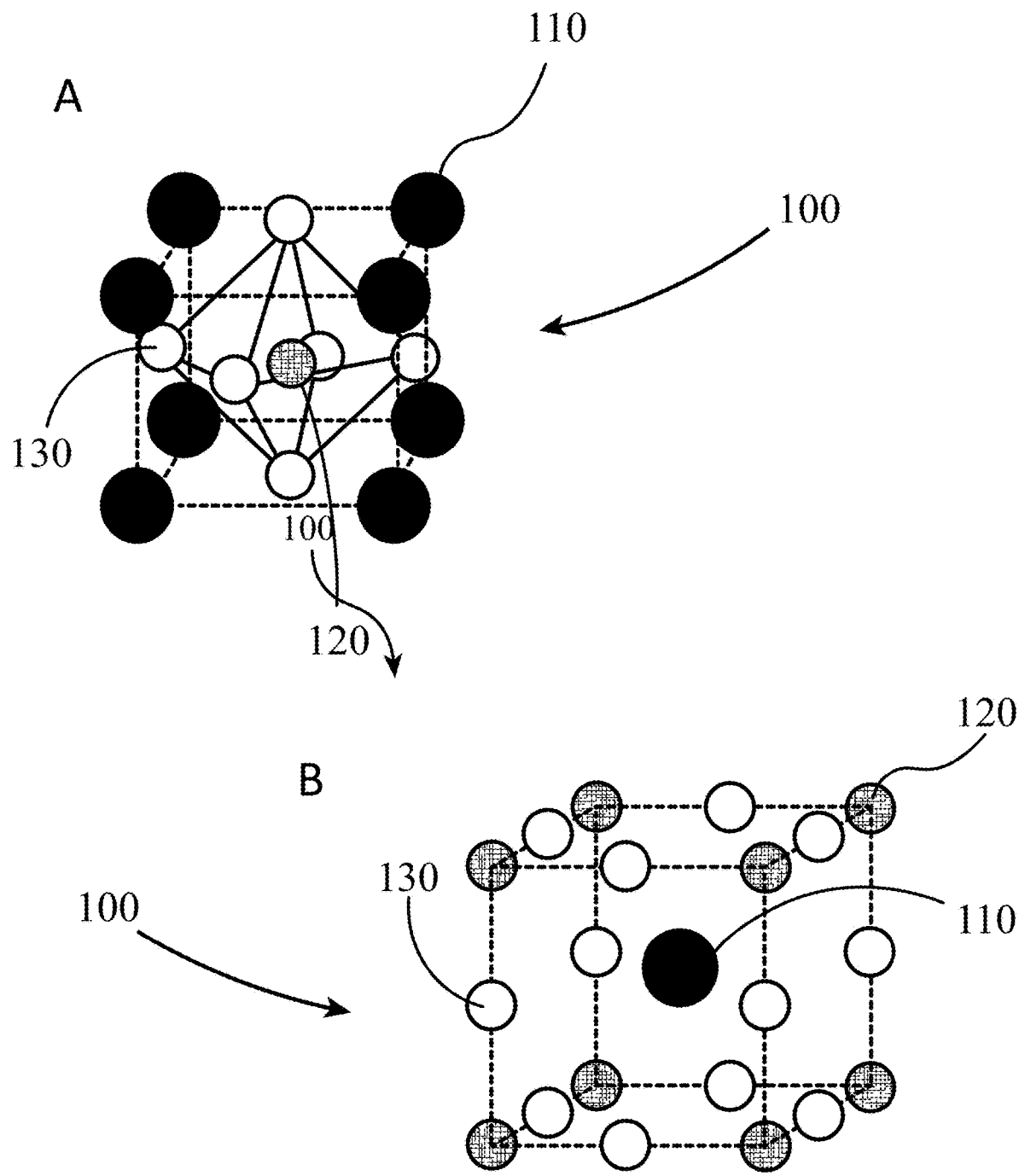

As defined herein, the term "perovskite" refers to compositions having a network of corner-sharing $BX_6$ octahedra resulting in the general stoichiometry of $ABX_3$. FIGS. 1A and 1B illustrate that perovskites 100, for example metal halide perovskites, may organize into a three-dimensional (3D) cubic crystalline structures (i.e., α-phase or α-$ABX_3$) constructed of a plurality of corner-sharing $BX_6$ octahedra. In the general stoichiometry for a perovskite, $ABX_3$, X (130) is an anion and A (110) and B (120) are cations, typically of different sizes. FIG. 1A illustrates that a perovskite 100 having an α-phase structure may be further characterized by eight $BX_6$ octahedra surrounding a central A-cation 110, where each octahedra is formed by six X-anions 130 surrounding a central B-cation 120 and each of the octahedra are linked together by "corner-sharing" of anions, X (130).

Panel A of FIG. 1B provides another visualization of a perovskite 100 in the α-phase, also referred to as the cubic phase. This is because, as shown in FIG. 1B, a perovskite in the α-phase may be visualized as a cubic unit cell, where the B-cation 120 is positioned at the center of the cube, an A-cation 110 is positioned at each corner of the cube, and an X-anion 130 is face-centered on each face of the cube. Panel B of FIG. 1B provides another visualization of the cubic unit cell of an α-phase perovskite, where the B-cation 120 resides at the eight corners of a cube, while the A-cation 110 is located at the center of the cube and with 12 X-anions 130 centrally located between B-cations 120 along each edge of the unit cell. For both unit cells illustrated in FIG. 1B, the A-cations 110, the B-cations 120, and the X-anions 130 balance to the general formula $ABX_3$ of a perovskite, after accounting for the fractions of each atom shared with neighboring unit cells. For example, referring to Panel A of FIG. 1B, the single B-cation 120 atom is not shared with any of the neighboring unit cells. However, each of the six X-anions 130 is shared between two unit cells, and each of the eight A-cations 110 is shared between eight unit cells. So, for the unit cell shown in Panel A of FIG. 1B, the stoichiometry simplifies to B=1, A=8*0.125=1, and X=6*0.5=3, or $ABX_3$. Similarly, referring again to Panel B of FIG. 1B, since the A-cation is centrally positioned, it is not shared with any of the unit cells neighbors. However, each of the 12 X-anions 130 is shared between four neighboring unit cells, and each of the eight B-cations 120 is shared between eight neighboring unit cells, resulting in A=1, B=8*0.125=1, and X=12*0.25=3, or $ABX_3$. Referring again to Panel B of FIG. 1B, the X-anions 130 and the B-cations 120 of a perovskite in the α-phase are aligned along an axis; e.g. where the angle at the X-anion 130 between two neighboring B-cations 120 is exactly 180 degrees, referred to herein as the tilt angle. However, as shown in FIG. 2A, a perovskite 100 may assume other corner-sharing crystalline phases having tilt angles not equal to 180 degrees.

Figure 2A:
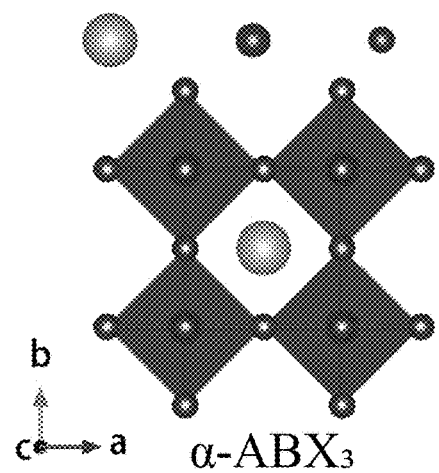
FIG. 2A illustrates three possible corner-sharing phases for perovskites, Panel (a) cubic phase (i.e., α-$ABX_3$), Panel (b) a tetragonal crystalline phase (i.e., β-$ABX_3$), and Panel (c) an orthorhombic crystalline phase (i.e., γ-$ABX_3$), according to some embodiments of the present disclosure.
Figure 2A:
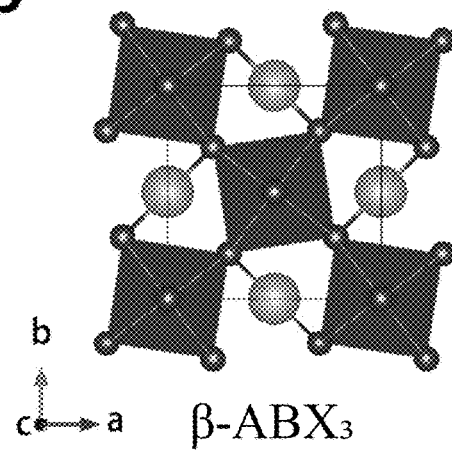
Figure 2A:
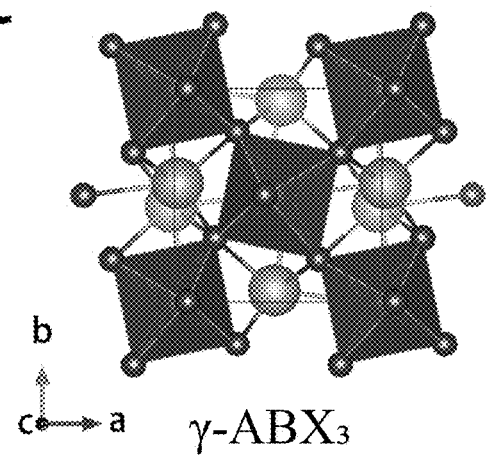

FIG. 2A illustrates that a perovskite can assume other crystalline forms while still maintaining the criteria of an $ABX_3$ stoichiometry with neighboring $BX_6$ octahedra maintaining X anion (130) corner-sharing. Thus, in addition to α-$ABX_3$ perovskites (in the cubic phase) having a tilt angle of 180 degrees, shown in Panel (a) of FIG. 2A, a perovskite may also assume a tetragonal crystalline phase (i.e., β-$ABX_3$) (see Panel (b) of FIG. 2A) and/or an orthorhombic crystalline phase (i.e., γ-$ABX_3$) (see Panel (c) of FIG. 2A), where the adjacent octahedra are tilted relative to the reference axes a, b, and c.

Figure 2B:
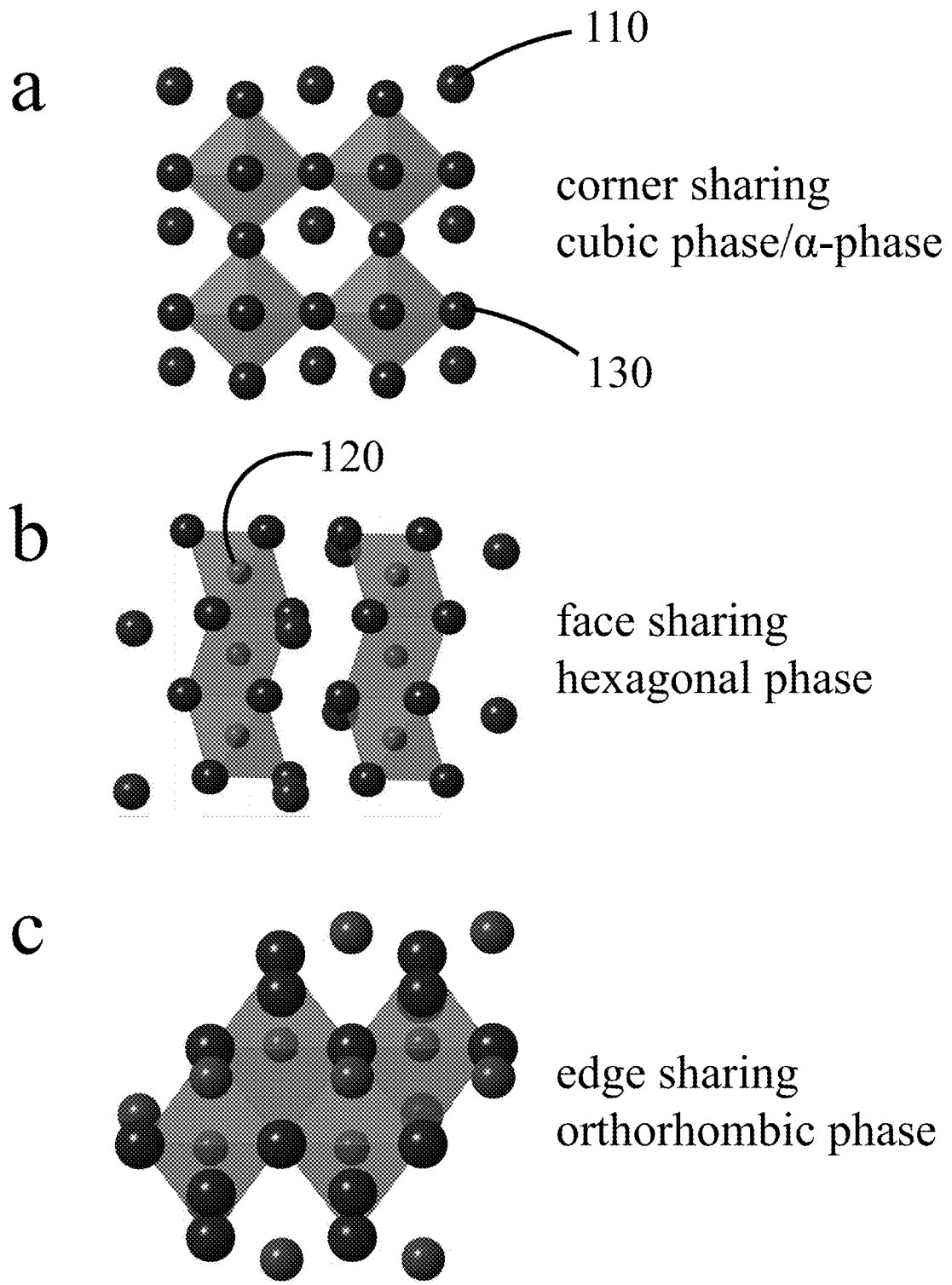
FIG. 2B illustrates a perovskite in one of the three possible arrangements, the cubic phase (i.e., α-phase) also illustrated in FIGS. 1A, 1, and 2A, compared to two non-perovskite phases (i.e., non-corner sharing), according to some embodiments of the present disclosure.

FIG. 2B illustrates that the elements used to construct a perovskite, as described above, A-cations 110, B-cations 120, and X-anions 130, may result in 3D non-perovskite structures; i.e., structures where neighboring $BX_6$ octahedra are not X-anion 130 corner-sharing and/or do not have a unit structure that simplifies to the $ABX_3$ stoichiometry. Referring to FIG. 2B, Panel (a) illustrates a perovskite in the cubic phase, i.e., α-$ABX_3$, compared to a non-perovskite structure constructed of face-sharing $BX_6$ octahedra resulting in a hexagonal crystalline structure (see Panel (b) of FIG. 2B) and a non-perovskite structure constructed of edge-sharing $BX_6$ octahedra resulting in an orthorhombic crystalline structure (see Panel (c) of FIG. 2B).

Figure 3:
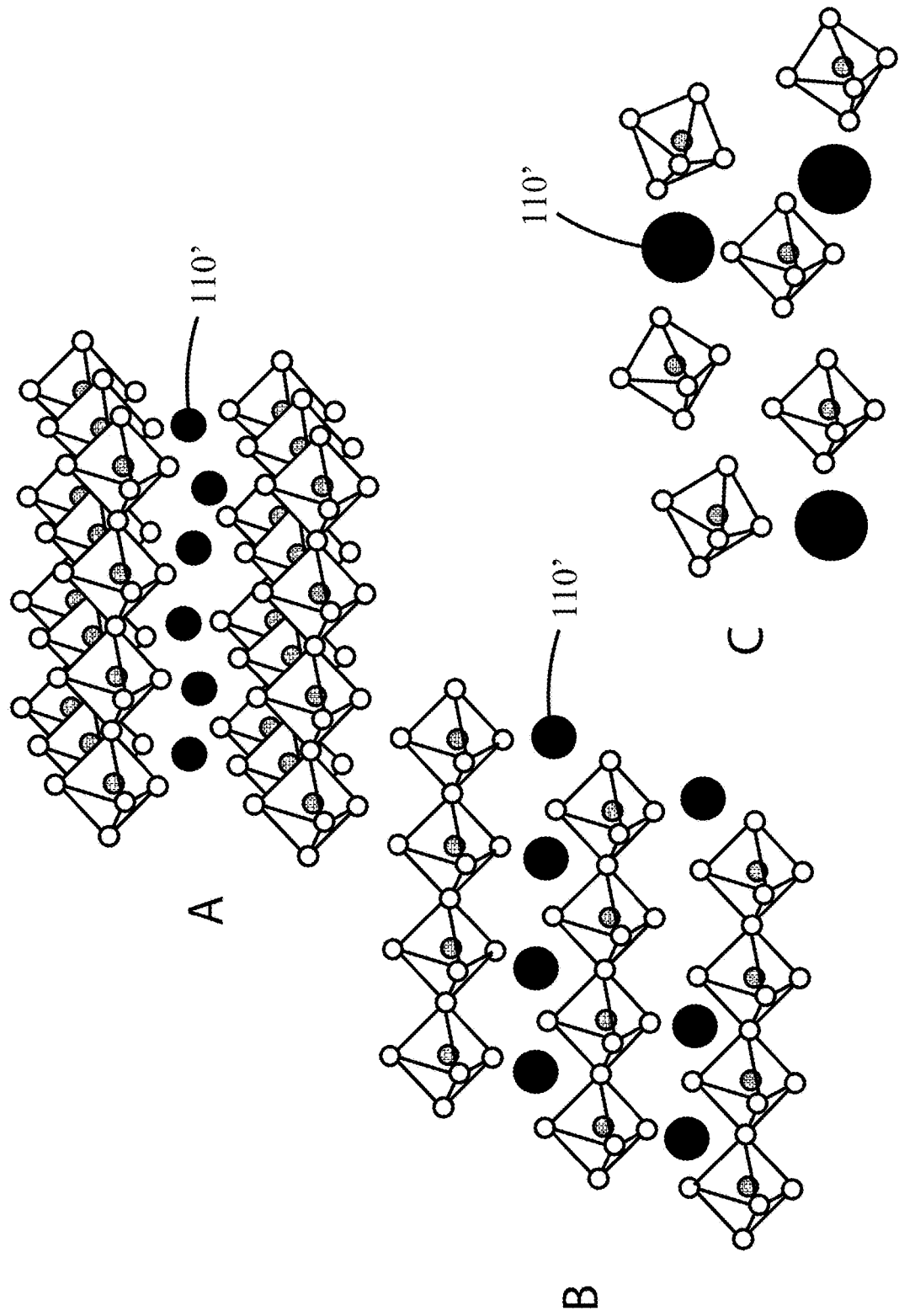
FIG. 3 illustrates 2D, 1D, and 0D perovskite-like structures, in Panels A, B, and C, respectively, according to some embodiments of the present disclosure.

Further, referring now to FIG. 3, the elements used to construct a perovskite, as described above, A-cations 110, B-cations 120, and X-anions 130, may result in non-3D (i.e., lower dimensional structures) perovskite-like structures such as two-dimensional (2D) structures, one-dimensional (1D) structures, and/or zero-dimensional (0D) structures. As shown in FIG. 3, such lower dimensional, perovskite-like structures still include the $BX_6$ octahedra, and depending on the dimensionality, e.g., 2D or 1D, may still maintain a degree of X-anion corner-sharing. However, as shown in FIG. 3, the X-anion 130 corner-sharing connectivity of neighboring octahedra of such lower dimensional structures, i.e., 2D, 1D, and 0D, is disrupted by intervening A-cations 110. Such a disruption of the neighboring octahedra, can be achieved by, among other things, varying the size of the intervening A-cations 110.

Referring to Panel A of FIG. 3, a 3D perovskite may be transformed to a 2D perovskite-like structure, 1D perovskite-like structure, and/or 0D perovskite-like structure. Where the degree of X-anion 130 corner sharing decreases and the stoichiometry changes according to the formula $(A')_m(A)_{n-1}B_nX_{3n+1}$, where monovalent (m=2) or divalent (m=1) A' cations 110' can intercalate between the X-anions of 2D perovskite-like sheets. Referring to Panel B of FIG. 3, 1D perovskite-like structures are constructed by $BX_6$ octahedral chained segments spatially isolated from each other by surrounding bulky organic A'-cations 110', leading to bulk assemblies of paralleled octahedral chains. Referring to Panel C of FIG. 3, typically, the 0D perovskite-like structures are constructed of isolated inorganic octahedral clusters and surrounded by small A'-cations 110', which may be connected via hydrogen bonding. In general, as n approaches infinity the structure is a pure 3D perovskite and when n is equal to 1, the structure is a pure 2D perovskite-like structure. More specifically, when n is greater than 10 the structure is considered to be essentially a 3D perovskite material and when n is between 1 and 5, inclusively, the structure is considered substantially a 2D perovskite-like material.

Figure 4:
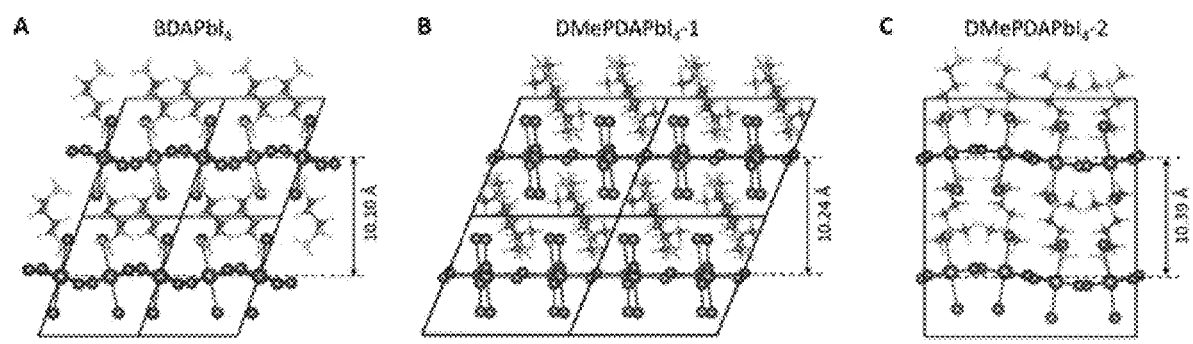
FIG. 4 illustrates side views of the crystal structures of exemplary 2D perovskite-like structures (A) $BDAPbI_4$, (B) $DMePDAPbI_4$-1, and (C) $DMePDAPbI_4$-2 single crystals, according to some embodiments of the present disclosure. The average interlayer distances are indicated. (BDA=1,4-butane diamine and DMePDA=N,N-dimethyl-1,3-propane diammonium, both having a 2+ charge.)

FIG. 4 compares the crystal structure of $DMePDAPbI_4$, an exemplary 2D perovskite with $BDAPbI_4$, another 2D perovskite. (BDA=1,4-butane diamine and DMePDA=N,N-dimethyl-1,3-propane diammonium, both having a 2+ charge.) Thus, a non-perovskite structure may have a composition defined by $ABX_4$ as shown in FIG. 4, where the A-cation has a 2+ charge. In some embodiments of the present disclosure, the A-cation of a 2D non-perovskite material may have a characteristic length between about 2.53 Å and about 7.62 Å or between about 2.72 Å and about 7.06 Å.

In some embodiments of the present invention, the A-cation 110 may include a nitrogen-containing organic compound such as an alkyl ammonium compound. The B-cation 120 may include a metal and the X-anion 130 may include a halogen. Additional examples for the A-cation 110 include organic cations and/or inorganic cations, for example Cs, Rb, K, Na, Li, and/or Fr. Organic A-cations 110 may be an alkyl ammonium cation, for example a $C_{1-20}$ alkyl ammonium cation, a $C_{1-6}$ alkyl ammonium cation, a $C_{2-6}$ alkyl ammonium cation, a $C_{1-5}$ alkyl ammonium cation, a $C_{1-4}$ alkyl ammonium cation, a $C_{1-3}$ alkyl ammonium cation, a $C_{1-2}$ alkyl ammonium cation, and/or a $C_1$ alkyl ammonium cation. Further examples of organic A-cations 110 include methylammonium ($CH_3NH_3^+$), ethylammonium ($CH_3CH_2NH_3^+$), propylammonium ($CH_3CH_2CH_2NH_3^+$), butylammonium ($CH_3CH_2CH_2CH_2NH_3^+$), formamidinium ($NH_2CH=NH_2^+$), hydrazinium, acetylammonium, dimethylammonium, imidazolium, guanidinium, benzylammonium, phenethylammonium, butylammonium and/or any other suitable nitrogen-containing or organic compound. In other examples, an A-cation 110 may include an alkylamine. Thus, an A-cation 110 may include an organic component with one or more amine groups. For example, an A-cation 110 may be an alkyl diamine halide such as formamidinium ($CH(NH_2)_2$). Thus, the A-cation 110 may include an organic constituent in combination with a nitrogen constituent. In some cases, the organic constituent may be an alkyl group such as straight-chain or branched saturated hydrocarbon group having from 1 to 20 carbon atoms. In some embodiments, an alkyl group may have from 1 to 6 carbon atoms. Examples of alkyl groups include methyl ($C_1$), ethyl ($C_2$), n-propyl ($C_3$), isopropyl ($C_3$), n-butyl ($C_4$), tert-butyl ($C_4$), sec-butyl ($C_4$), iso-butyl ($C_4$), n-pentyl ($C_5$), 3-pentanyl ($C_5$), amyl ($C_5$), neopentyl ($C_5$), 3-methyl-2-butanyl ($C_5$), tertiary amyl ($C_5$), and n-hexyl ($C_6$). Additional examples of alkyl groups include n-heptyl ($C_7$), n-octyl ($C_8$) and the like.

Examples of metal B-cations 120 include, for example, lead, tin, germanium, and or any other 2+ valence state metal that can charge-balance the perovskite 100. Further examples include transition metals in the 2+ state such as Mn, Mg, Zn, Cd, and/or lanthanides such as Eu. B-cations may also include elements in the 3+ valence state, as described below, including for example, Bi, La, and/or Y. Examples for X-anions 130 include halogens: e.g., fluorine, chlorine, bromine, iodine and/or astatine. In some cases, the perovskite halide may include more than one X-anion 130, for example pairs of halogens; chlorine and iodine, bromine and iodine, and/or any other suitable pairing of halogens. In other cases, the perovskite 100 may include two or more halogens of fluorine, chlorine, bromine, iodine, and/or astatine.

Thus, the A-cation 110, the B-cation 120, and X-anion 130 may be selected within the general formula of $ABX_3$ to produce a wide variety of perovskites 100, including, for example, methylammonium lead triiodide ($CH_3NH_3PbI_3$), and mixed halide perovskites such as $CH_3NH_3PbI_{3-x}Cl_x$ and $CH_3NH_3PbI_{3-x}Br_x$. Thus, a perovskite 100 may have more than one halogen element, where the various halogen elements are present in non-integer quantities; e.g., x is not equal to 1, 2, or 3. In addition, perovskite halides, like other organic-inorganic perovskites, can form three-dimensional (3-D), two-dimensional (2-D), one-dimensional (1-D) or zero-dimensional (0-D) networks, possessing the same unit structure. As described herein, the A-cation 110 of a perovskite 100, may include one or more A-cations, for example, one or more of cesium, FA, MA, etc. Similarly, the B-cation 120 of a perovskite 100, may include one or more B-cations, for example, one or more of lead, tin, germanium, etc. Similarly, the X-anion 130 of a perovskite 100 may include one or more anions, for example, one or more halogens (e.g., at least one of I, Br, Cl, and/or F), thiocyanate, and/or sulfur. Any combination is possible provided that the charges balance.

For example, a perovskite having the basic crystal structure illustrated in FIGS. 1A and 1B, in at least one of a cubic, orthorhombic, and/or tetragonal structure, may have other compositions resulting from the combination of the cations having various valence states in addition to the $2^+$ state and/or $1^+$ state described above for lead and alkyl ammonium cations; e.g. compositions other than $AB^{2+}X_3$ (where A is one or more cations, or for a mixed perovskite where A is two or more cations). Thus, the methods described herein may be utilized to create novel mixed cation materials having the composition of a double perovskite (i.e., elpasolites), $A_2B^{1+}B^{3+}X_6$, with an example of such a composition being $Cs_2BiAgCl_6$ and $Cs_2CuBiI_6$. Another example of a composition covered within the scope of the present disclosure is described by $A_2B^{4+}X_6$, for example $Cs_2PbI_6$ and $Cs_2SnI_6$. Yet another example is described by $A_3B_2^{3+}X_9$, for example $Cs_3Sb_2I_9$. For each of these examples, A is one or more cations, or for a mixed perovskite, A is two or more cations.

As used herein, the term "surface" refers to the outermost layer of a solid, a liquid, or a gas. In the case of a gas, its outermost layer is defined by the solid and/or liquid boundaries surrounding the gas. As used herein, the term "interface" refers to a plane (or other 2D shape) resulting from the physical placement of a first surface adjacent to a second surface. Thus, as in interface requires by definition two surfaces, and because any surface inherently forms an interface with something (e.g., the atmosphere, a vacuum, etc.), the terms "surface" and "interface" will be used interchangeably herein, unless specified otherwise.

As used herein, a second layer of material two deposited onto a first layer of material one may result in an interface between to the two layers, where on one side of the interface is essentially pure material one and on the other side is essentially pure material two (e.g. described by a step-function change in material concentrations). However, in some embodiments of the present disclosure, there may be a concentration gradient at and/or near the interface. Such a gradient may penetrate into the surface (i.e., near surface) of the first layer and/or penetrate into the surface of the second layer. However, for simplicity, when referring to the depositing of one layer onto another, an interface will be considered to have a step-function change in concentration at the interface, unless noted otherwise.

Typically, an A-cation, e.g., methylammonium (MA), formamidinium (FA), and cesium, of a typical three-dimensional (3D) perovskite active layer (PAL) is relatively mobile and/or volatile, depending on the local conditions (e.g., sun exposure, temperature, etc.). Therefore, perovskite interfaces and/or surfaces, for example those resulting from scribing for module interconnect construction can provide locations where undesirable chemistry occurs. As described herein, in some embodiments of the disclosure, the use of bulky organic A-cations, which preclude the growth of a 3D inorganic metal-halide lattice may be used to create lower dimensional, e.g., two-dimensional (2D) and/or one-dimensional (1D), structures. These larger organic molecules (and/or inorganic molecules), referred to herein as surface modifiers, may be engineered to fill the A-cation site at a surface and/or interface to limit carrier recombination, preclude A-cation mass transport from the bulk 3D perovskite to the interface, and/or create robust hydrophobic surfaces that may act as a barrier to the egress of water, oxygen, and/or other undesirable compounds present in the local environment. As shown herein, the application of at least one A-cation such as, phenethylammonium (PEA), fluorinated variants (e.g., 4-flouorophenethylammonium F-PEA), and/or a number of other A-cation site filling organic cations may be used, resulting in the forming of lower dimensional structures, e.g., 2D and/or quasi-2D structures. Others include N-methyl-1,3-propane diammonium (ME-PDA), 1,4-butane diamine and/or N,N-dimethyl-1,3-propane diammonium (DMePDA).

In some embodiments of the present disclosure, other materials may be employed as surface modifiers, such as phosponic acid linker, which, among other things, may enable control of a perovskite surface and/or interface (e.g., surface tension, and/or a wetting property), and/or and the subsequent application of additional organics and/or inorganics (e.g., by providing of a functional linker to connect two dissimilar materials). Similarly, carbon and/or various inorganics (e.g., $SiO_x$, $Al_2O_x$, $SnO_x$, $MoO_x$, $NiO_x$, $TiO_2$, and/or $CuI_x$) may be employed as surface modifiers to passivate the surfaces and/or interfaces of 3D perovskite, resulting in, among other things, improved stability of the overall system (e.g., solar cell, LED, etc.). In some embodiments of the present disclosure, layers of any one or combination of these surface modifiers may provide at least one of a passivating effect, a blocking effect (e.g., to the diffusion of atoms and/or molecules), and/or an electrical transfer effect (e.g., allowing carrier mobility and/or tunneling). As shown herein, surface treatments using surface modifying materials, e.g., bulky A-site cations, organics, and/or inorganics, may be applied to a perovskite surface (e.g., 3D perovskite active layer) by either solution and/or vapor-phase approaches, as long as the method has the ability to deliver the surface modifier(s) to the surface and/or interface of interest.

Figure 5:
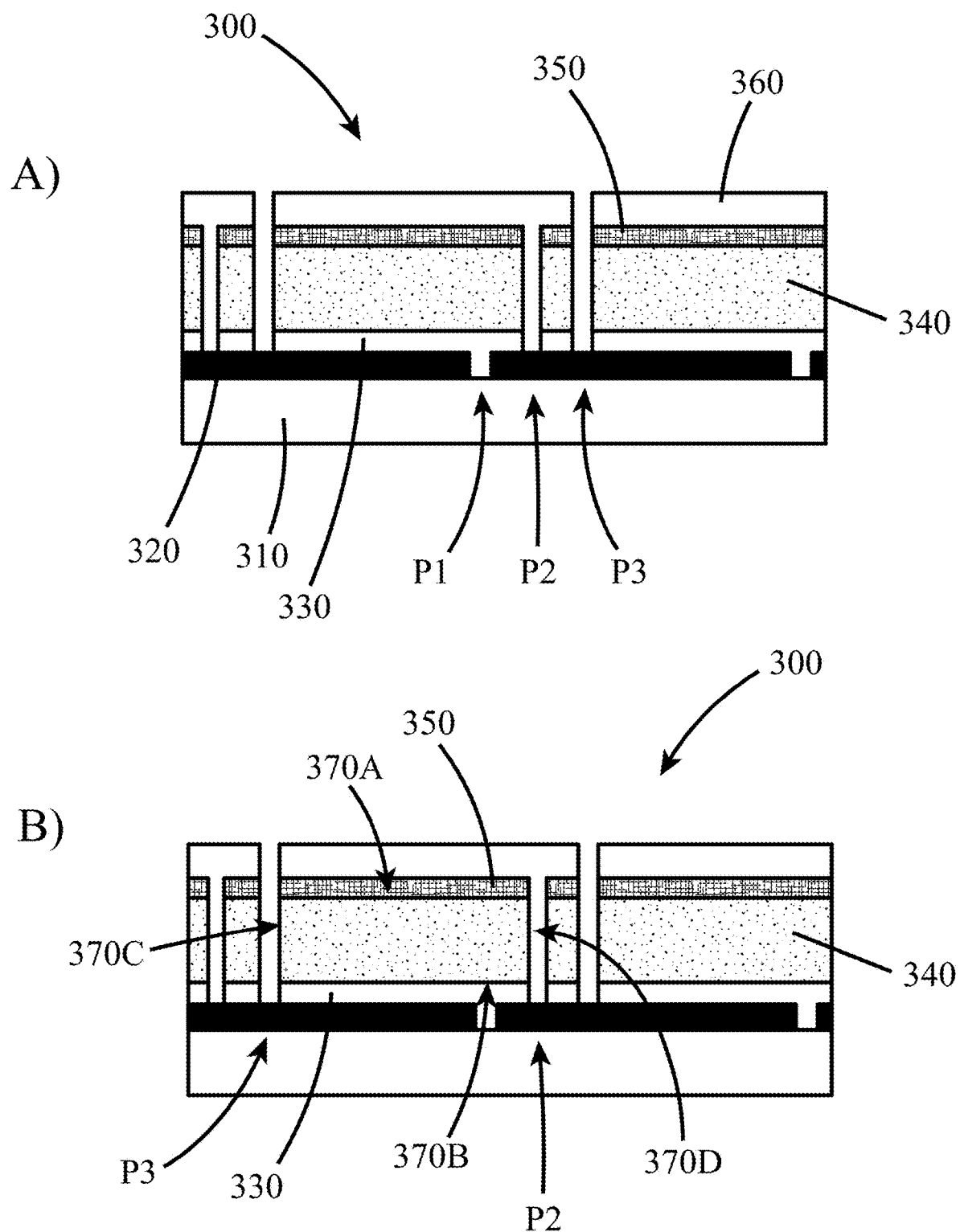
FIG. 5 illustrates surfaces and interfaces found in devices, resulting from the stacking of layers and scribe lines, according to some embodiments of the present disclosure.

FIG. 5 illustrates an exemplary device 300 that includes examples of scribe lines and the surfaces and/or interfaces resulting from the scribing process. Panel A) of FIG. 5 illustrates that a device 300 may be constructed of a stack of different layers. For example, a device 300 may include a substrate 310 with a first contact layer 320 positioned on the substrate 310. The first contact layer 320 may be positioned between a first charge transport layer 330 and the substrate 310. Further, a device 300 may include a perovskite layer 340 positioned between the first charge transport layer 330 and a second charge transport layer 350. Finally, a device 300 may include a second contact layer 360, where the second charge transport layer 350 is positioned between the second contact layer 360 and the perovskite layer 340.

Referring again to FIG. 5, Panel A) also illustrates the position of exemplary scribe lines, P1, P2, and P3. These scribe lines cut through the various layers making up the device 300 and extend through the layers in a direction perpendicular to the page. Thus, P1 is a scribe line that may cut through the first contact layer 320 to terminate at the substrate 310. P1 may be subsequently filled with the material making up the first charge transport layer 330. P2 is a scribe line that may cut through the second charge transport layer 350, the perovskite layer 340, and the first charge transport layer 330. P2 may be subsequently filled with the material making up the second contact layer 360. P3 is a scribe line that may cut through the second contact layer 360, the second charge transport layer 350, the perovskite layer 340, and the first charge transport layer 330. In some cases, P3 may remain open, or may be subsequently filled with a material, e.g., a protective material, an anti-reflective material, etc.

Panel B) of FIG. 5 illustrates various surfaces and/or interfaces 370 between a perovskite layer 340 and the other layers in the device 300 that may result from the production of the device 300, as well as additional surfaces and/or interfaces 370 that may result from the formation of scribe lines (e.g., P1, P2, and/or P3) on the device. For example, a first a horizontal interface 370A may be formed by the depositing of the second charge transport layer 350 onto the perovskite layer 340 (or vice versa depending on the order of manufacture). Similarly, a second horizontal interface 370B may be formed by the depositing of the perovskite layer 340 onto the first charge transport layer 330 (or vice versa depending on the order of manufacture). Further, the manufacture of scribe lines P2 and P3 may result in two additional pairs of vertically oriented surfaces and/or interfaces, 370C and 370D. The P2 scribe line may produce a pair of interfaces 370D between the perovskite layer 340 and the second contact layer 360, formed by filling the P2 scribe line with the material making up the second contact layer 360. Similarly, the P3 scribe line may produce a pair of interfaces 370C between the perovskite layer 340 and the environment and/or any material used to fill the P3 scribe line; e.g., a protective coating, an anti-reflective coating, etc.

Figure 6:
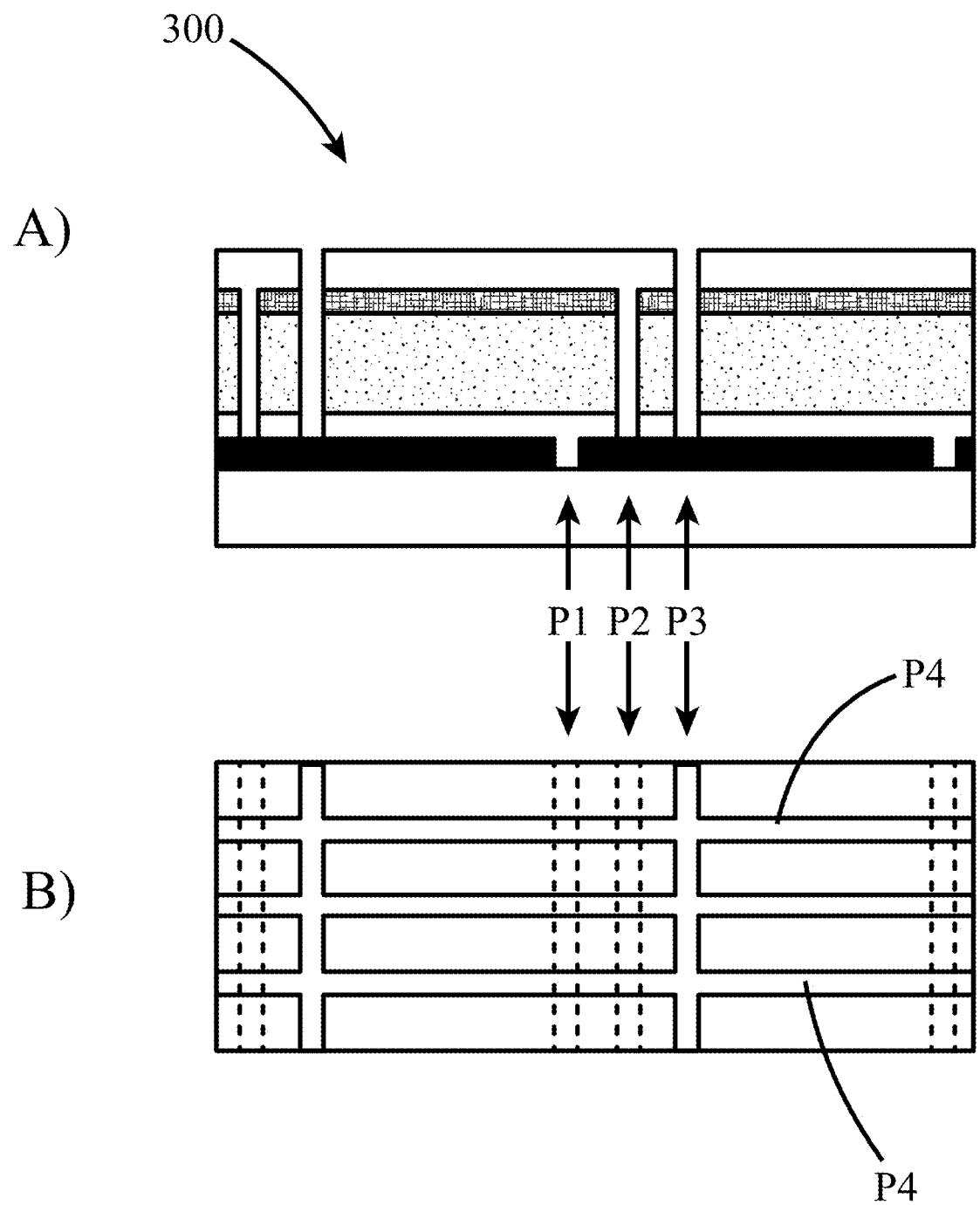
FIG. 6 illustrates surfaces and interfaces found in devices, resulting from the stacking of layers and scribe lines, according to some embodiments of the present disclosure.

FIG. 6 illustrates another example of a scribe line, P4, which may be cut into the device 300 substantially perpendicular to the P1, P2, and/or P3 scribe lines. As is the case for the P1, P2, and P3 scribe lines, the forming of P4 scribe lines may result in the forming of additional surfaces and/or interfaces with the perovskite layer 340, at which undesirable reactions may occur if not treated according to the methods described herein. All of these examples of scribe lines and perovskite surfaces and/or interfaces with neighboring material are provided for illustrative purposes and other scribe line types, locations, orientations, and perovskite surfaces and/or interfaces resulting from devices having different design features and/or elements fall within the scope of the present disclosure. Referring again to FIG. 6, in some embodiments of the current disclosure, the scribing width may be between about 20 micrometers and about 30 micrometers, or between about 50 micrometers and about 100 micrometers. Regarding the scribing depth: in some embodiments of the present disclosure, a P1 scribe may be utilized to isolate the TCO layer on top of glass. Therefore, a depth of a P1 scribe may be equal to the TCO layer thickness, which is normally a few hundred nanometers. In some embodiments of the present disclosure, a P2 scribe may be used to isolate the device stack above the TCO layer. Therefore, a P2 scribe may include the thicknesses of one or more of the perovskite layer, the HTL, and/or the ETL layer on top of perovskite. These thickness together may result in a scribe depth between a few hundred nanometers to a few micrometers. In some embodiments of the present disclosure, a P3 scribe may be used to isolate the top metal contact layer. Thus, a P3 scribe may pass through a PSC from the front side all the way to top surface of the TCO layer, just like a P2 scribe. In this case, the depth of a P3 scribe can be from a few tens of nanometers to a few hundred nanometers (for the metal layer) to the metal layer thickness plus P2 scribing thickness.

As described above, undesirable reactions may occur at any of these surfaces and/or interfaces 370. Among other things, the present disclosure provides various surface modifiers that may be deposited onto a perovskite material (e.g., a 3D perovskite layer) in order to minimize and/or eliminate these reactions, thereby increasing the performance metrics and/or lifespan of the devices utilizing the perovskite materials. Thus, referring again to Panel B) of FIG. 5, at least one surface modifier (not shown) as described herein, may be applied to any of the surfaces and/or interface (e.g., 370A, 370B, 370C, and/or 370D) of the perovskite layer 340 and/or positioned between the perovskite layer and some other layer (e.g., 320, 330, 350, and/or 360) placed adjacent to the perovskite layer 340, such that the resultant surfaces and/or interfaces 370 are "passivated", less reactive, more stable, etc., resulting in a better performing device (e.g., solar cell and/or LED).

Figure 7:
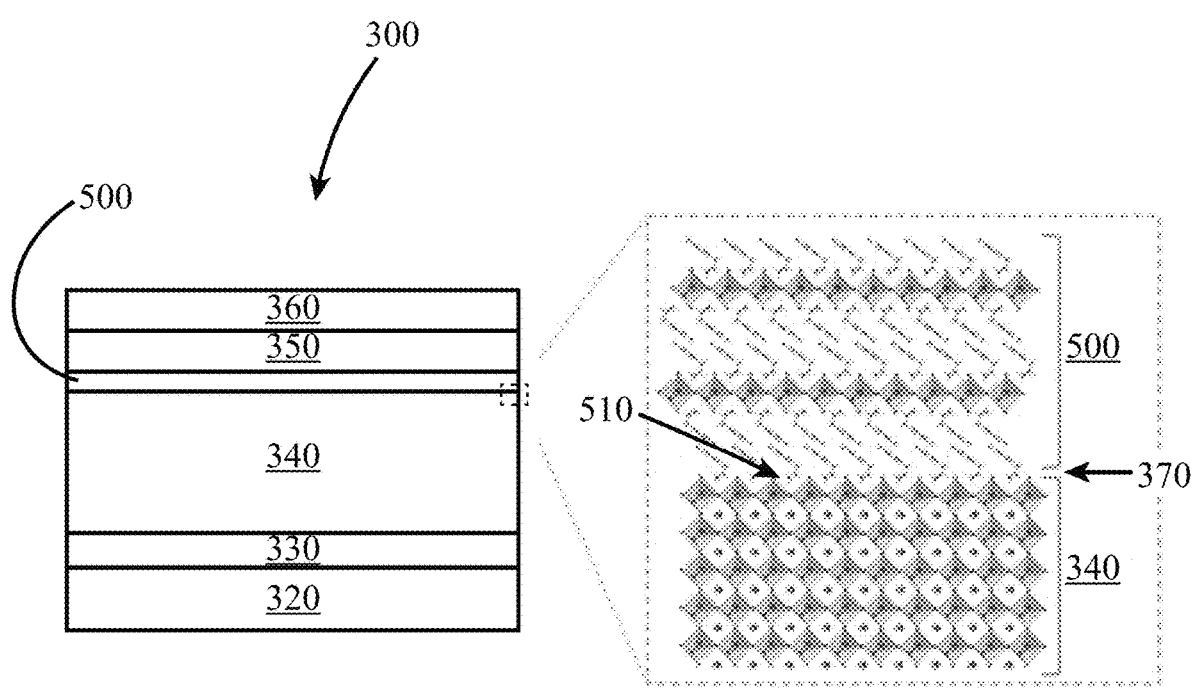
FIG. 7 illustrates the location of a treated layer in an exemplary device, according to some embodiments of the present disclosure.
Figure 8A:
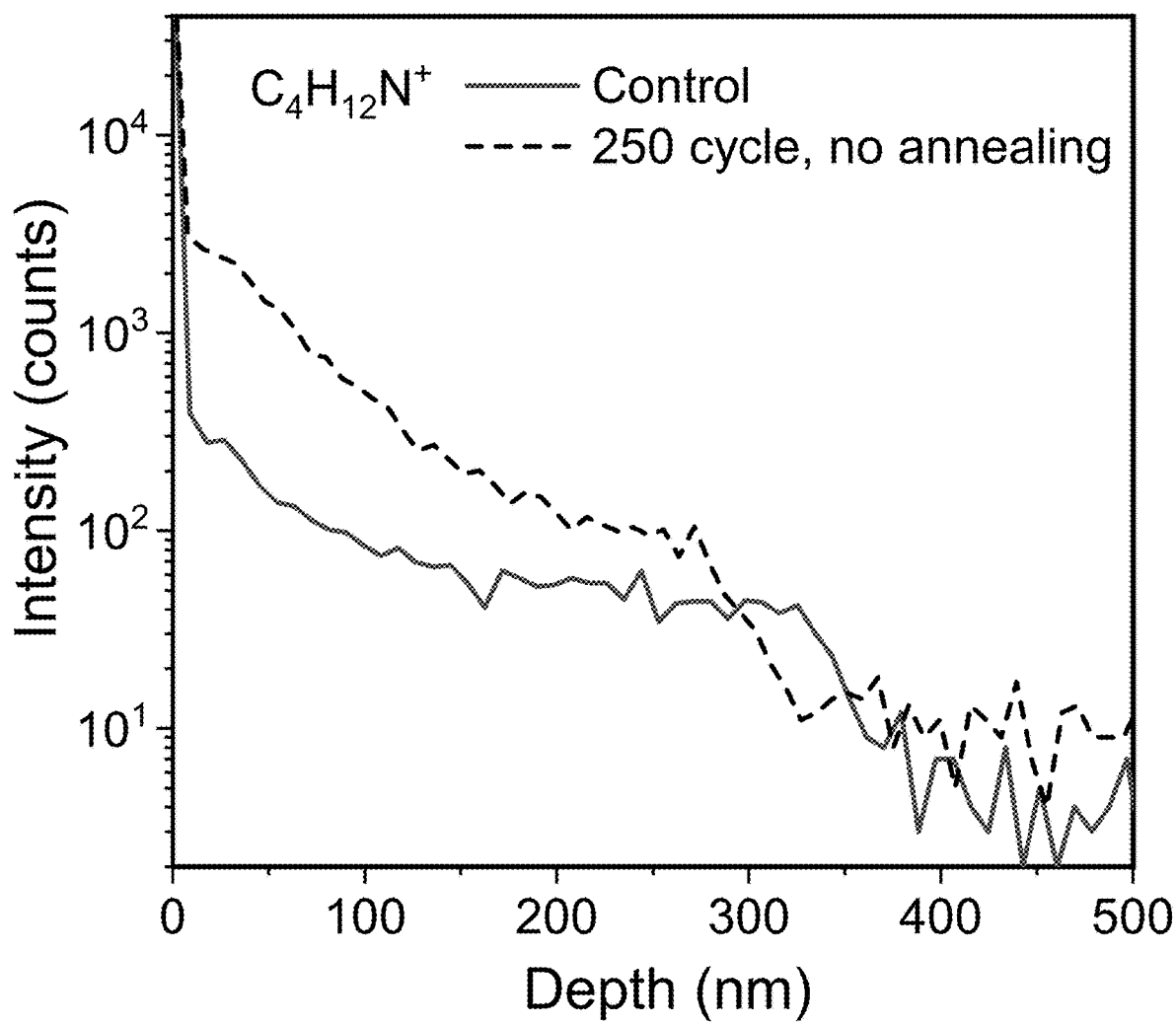
FIG. 8A illustrates a time-of-flight secondary ion mass spectrometry (TOF-SIMS) comparison of the $C_4H_{12}N^+$ (associated with BA) depth profiles of the control (i.e., no vapor-phase treatment) and BA vapor-phase treated (250 cycle, no annealing) perovskite layers, according to some embodiments of the present disclosure.
Figure 8B:
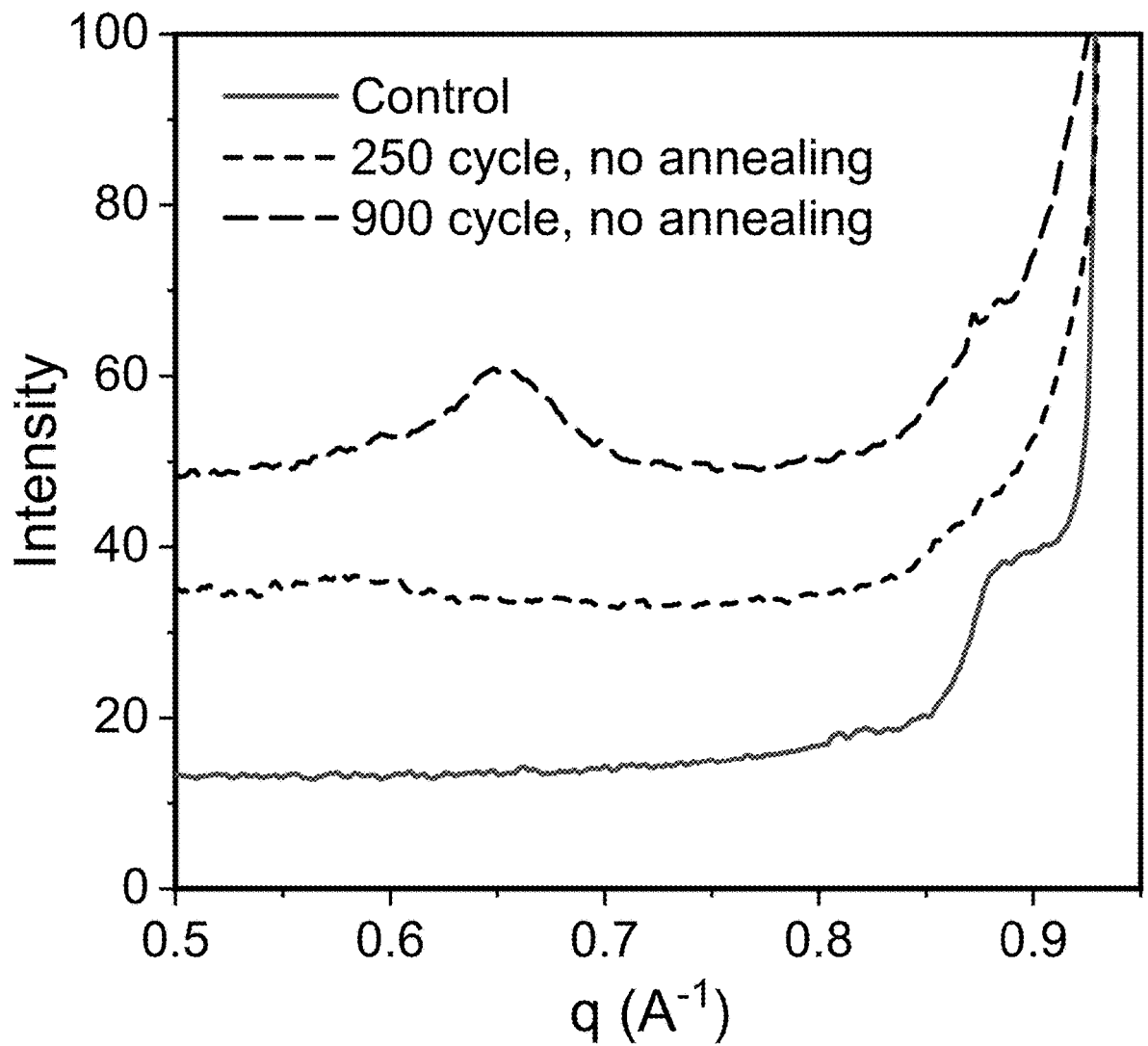
FIG. 8B illustrates a grazing-incidence wide-angle X-ray scattering (GIWAXS) comparison of the control (i.e., untreated) and vapor-phase treated (250 and 900 cycles) perovskite films, according to some embodiments of the present disclosure.
Figure 8C:
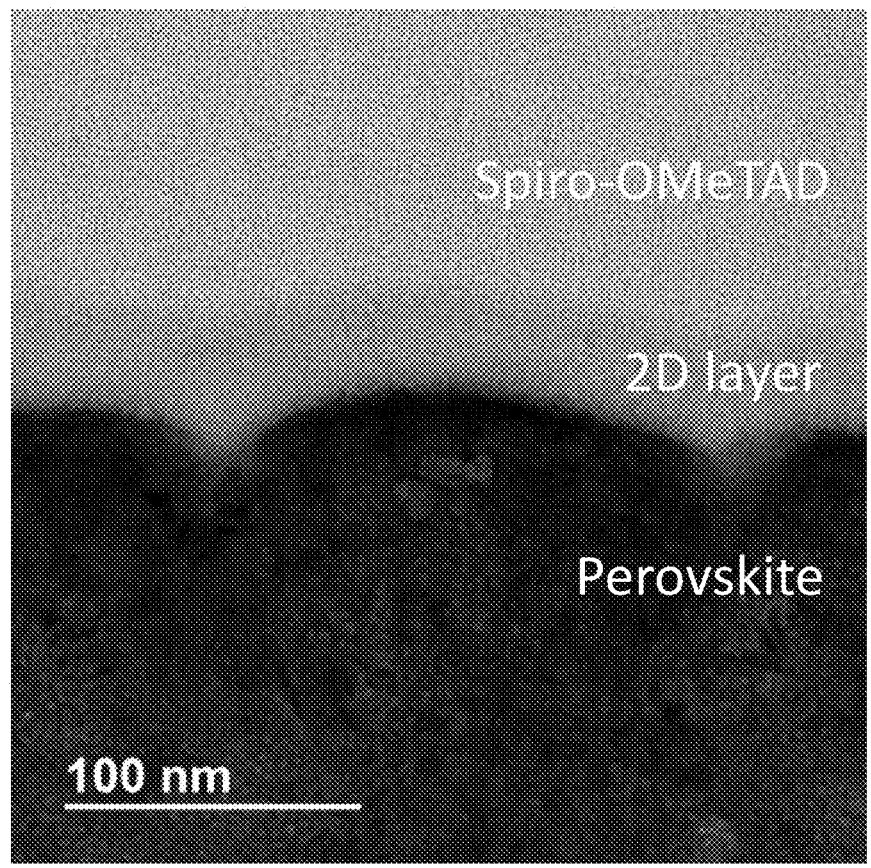
FIG. 8C illustrates a high-resolution transmission electron microscope (HRTEM) image of the cross-section of a vapor-phase treated perovskite layer, according to some embodiments of the present disclosure.
Figure 8D:
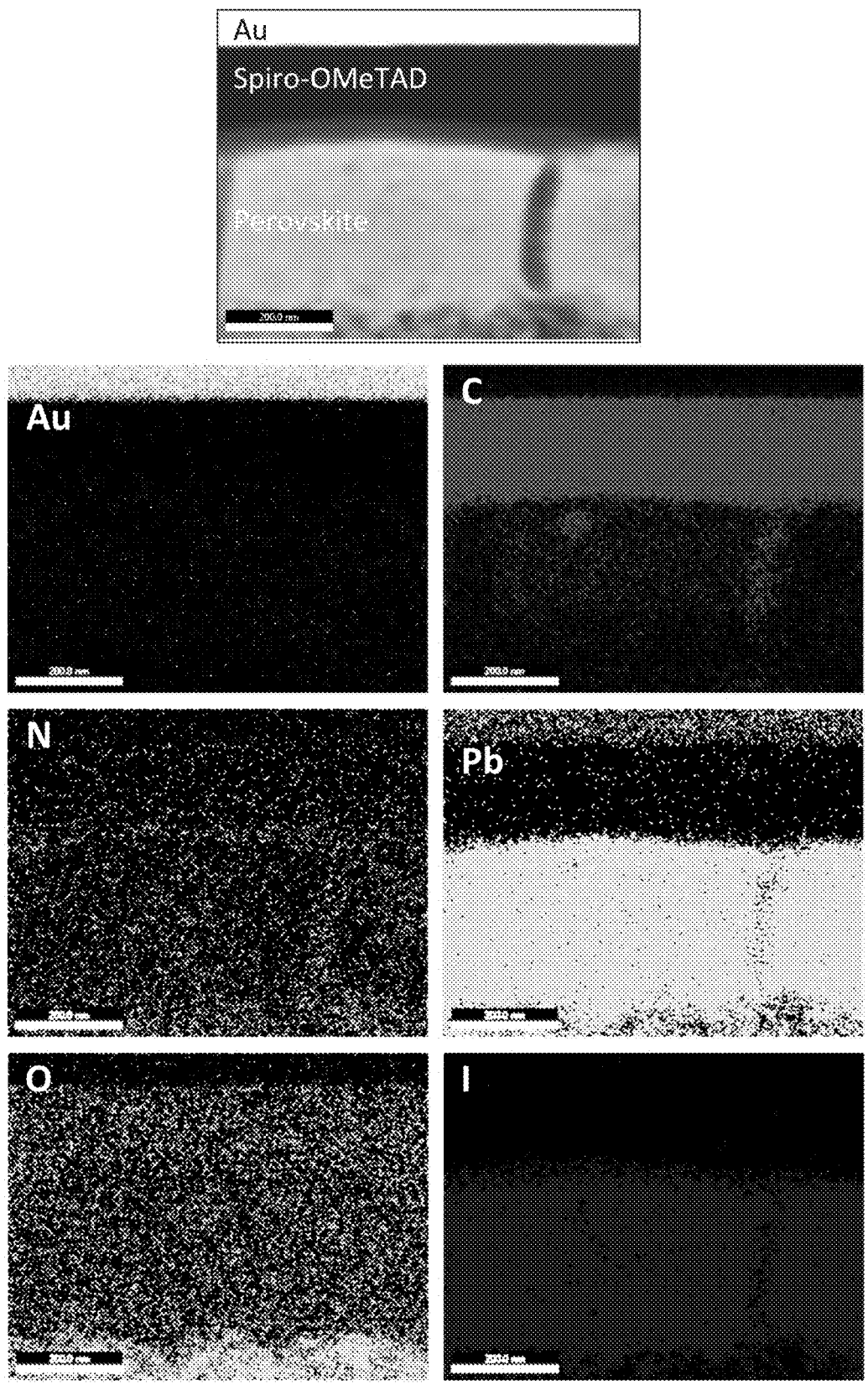
FIG. 8D illustrates element mapping of the cross-section of a perovskite solar cell (PSC) based on a vapor-phase treatment of the 3D perovskite layer, according to some embodiments of the present disclosure. Scale-bars are 200 nm.

As shown herein, the application of surface modifiers to a 3D perovskite layer may result in the forming of a perovskite-like layer 500, e.g., a 2D and/or quasi-2D perovskite-like layer, on the outer surface of the 3D perovskite layer and/or the treatment may result in the transforming of at least a portion of the 3D perovskite's original outer surface to a perovskite-like layer 500, e.g., a 2D and/or quasi-2D perovskite-like layer. In some embodiments of the present disclosure a perovskite-like layer 500 may be a 2D perovskite-like material and/or a quasi-2D perovskite-like material. Thus, a perovskite-like layer 500 may be an actual layer having a distinct composition across a thickness, a perovskite-like layer 500 may be a modified surface of the underlying treated 3D layer, e.g., perovskite layer, a perovskite-like layer 500 may be a modified interface between the treated perovskite layer and a layer adjacent to the treated perovskite layer, and/or a combination of these. FIG. 7 illustrates a simplified device 300, according to some embodiments of the present disclosure. This device 300 utilizes many of the same features illustrated in FIGS. 5 and 6 (e.g., contact layers, charge transport layers, etc.). Importantly, the device 300 of FIG. 7 contains a perovskite layer 340 that form interfaces with neighboring layers. FIG. 7 illustrates an exemplary use and location of a treated layer 500, positioned between the perovskite layer 340 and a charge transport layer 350. The illustration on the right side of FIG. 7 shows a magnified view of the treated layer 500 and its relationship to the perovskite layer 360. This view illustrates that the depositing of a perovskite-like layer 500 onto a surface 510 of a perovskite layer 340 (or vice versa) may result in the formation of an interface 370 (e.g., the plane resulting from the physical placement of two opposing surfaces against one another). In addition, although FIGS. 5-7 illustrate single junction devices, the concepts described in the present disclosure are applicable to multi-junction devices. Although the exemplary device 300 of FIG. 7 illustrates only a single perovskite-like layer 500 applied between the perovskite layer 340 and the second charge transport layer 350, additional perovskite-like layers of one or more surface modifiers, e.g., in the form of 2D materials and/or quasi-2D materials, may be applied to such a device. For example, in some embodiments of the present disclosure, a second perovskite-like layer 500 of surface modifier may be positioned between the perovskite layer 340 and the first charge transport layer 330 and/or to the exposed vertical sides of the perovskite layer 340 at the edges of the device 300 and/or vertical surfaces created by scribe lines.

Thus, in summary, critical interfaces and/or surfaces, including those made by scribing processes, may be modified and/or coated using surface modifiers to improve the overall device stability and performance. In some embodiments of the present disclosure, bulky A-cation surface modifiers may be utilized to modify 3D perovskite surfaces and/or interfaces, including those resulting from scribing. Among other things, a bulky A-cation surface modifier can modify the surface as well as a near surface region, enabling improved environmental robustness (e.g. hydrophobicity), while simultaneously reducing surface defects responsible for, among other things, recombination and/or efficiency losses. In addition, the electrochemical properties of an interface treated using the methods described herein can reduce corrosion and/or degradation between the scribe interfaces. Further, the effectiveness of subsequent metallization may be tuned as a function of the surface modifier chosen. In contrast to simply passivating a scribe with a dielectric and/or 3D cation to address process damage issues, the present disclosure results in the creation of at least one additional layer of surface modifier(s) (i.e., perovskite-like layer) and/or the modification of the interfaces between a perovskite active layer and its neighboring device layers, resulting in a final device stack that can be more electronically, chemically, and/or environmentally robust.

In some embodiments of the present disclosure, for the case of bulky A-cation surface modifiers, their application to a perovskite surface may be solution based. For the case where a modified layer includes a dielectric, the application to a scribe line will permit their use where they might otherwise compromise device performance. Deposition of a perovskite-like layer resulting from the application of a surface modifier to a 3D perovskite layer may follow routes similar to methods used to deposit active layers such as slot, gravure, spray, inkjet and/or other solution processing methods. These methods may be used to introduce a solution with bulky cations that can convert portions of 3D perovskite surfaces to 2D surfaces and/or passivate surfaces, such as exposed scribe surfaces. In some embodiments of the present disclosure, as a result of the treatment methods described herein, subsequent scribing normally employed to remove material at the bottom of a P2 scribe before metallization and prior to the P3 scribe may be omitted. These benefits may result regardless of whether the 3D perovskite layer is treated by vapor-phase and/or a solution processing method.

In contrast to the solution approach, a vapor-phase approach to introduce a bulky A-cation surface modifier to a 3D perovskite surface to convert at least a portion of the surface to a 2D perovskite-like material and/or deposit a 2D perovskite-like layer onto the 3D surface may be used either in place of, or in addition to the solution processing methods described above. Processing of a perovskite film immediately after scribing by passing it through an air/vapor knife or air/vapor atmosphere could also be used to expose interfaces to bulky A-cations surface modifiers (and/or other surface modifiers) and convert and/or coat the exposed 3D perovskite (and/or in some cases $PbI_x$) into a passivated 2D perovskite-like layer that includes the surface modifier in its structure.

Thus, vapor-phase deposition can be used to achieve a modified surface layer with specific controls by treating a formed perovskite layer with 2D surface modifiers, such as bulky A-cations, in the vapor-phase (see FIG. 7). As shown herein, this approach can selectively form 2D phases on the perovskite surfaces, rather than throughout the bulk. Further, the extent of 2D phase formation can be controlled with process variables such as temperature and exposure times. In some embodiments of the present disclosure, 2D surface modifiers may be volatilized at a low temperature and at low pressures and/or at vacuum (e.g., using surface modifiers having a vapor pressure greater than about 1 torr while at a processing temperature of less than about 150° C.), without the precursor condensing on process surfaces (e.g., as a result of hot vapor coming into contact with cold surfaces). In some embodiments of the present disclosure, volatilization of a surface modifier may occur through the heating of a high vapor pressure surface modifier and/or surface modifier precursor and/or by aerosolization of a surface modifier and/or surface modifier precursor in a solvent. Examples of 2D surface modifiers, according to some embodiments of the present disclosure, include phenylethylammonium, butylammonium, 4-flouorophenethylammonium, N-methyl-1,3-propane diammonium, 1,4-butane diammonium, N,N-dimethyl-1,3-propane diammonium choline chloride, glycine, 5-aminovaleric acid, other amino acids, methylviologen, other amine-containing small molecules, and/or self-assembled monolayer materials (e.g., phosphonic acids). Each of these surface modifiers can be applied to a surface (e.g., a perovskite surface) by vapor-phase processing and/or solution processing methods.

In some embodiments of the present disclosure, thermal and/or laser-initiated conversion and passivation may be used in which either the latent thermal energy of the scribe in the film or via photoinitiation of the conversion by the laser itself in the case of laser-based scribing could be used to assist/direct the passivation/conversion of the perovskite. Such an approach could lead to selective passivation at the scribe lines, enabling the use of electrically insulating passivation layers (as opposed to electrically conductive layers if the passivation process were to occur on other 3D perovskite surfaces). One method to achieve selective scribe passivation through thermal and/or photoinitiated processes during a laser scribing procedure may include performing the scribing process in a passivating atmosphere, for example, utilizing photo-initiated molecular layer deposition reactions through iodo-ene coupling chemistry. In this scenario, selective growth may be achieved by laser scribing with a UV laser in an atmosphere of ethylene glycol dimethacrylate and 1,3-diiodopropane. The iodo-ene and other photoactivated chemistries can take advantage of the presence of intense, localized, UV illumination, specifically at the location of a scribe. Similarly, in some embodiments of the present disclosure, localized heating at the location of the scribe may be used to initiate passivation chemistry through the thermal decomposition of a vapor-phase passivant, for example, the chemical vapor deposition of fluorocarbon polymers through the decomposition of hexafluoropropylene oxide. Alternatively, these processing approaches could also be used with a solution processing approach to provide the requisite thermal energy to cure the passivation layers; e.g., scribe through a solution instead of using a vapor-phase passivant.

Thus, among other things, the present disclosure demonstrates the efficacy of vapor-phase approaches for depositing a perovskite-like layer or layers of quasi-2D materials onto 3D perovskites. In a model system, a vapor-phase method is shown herein that successfully deposited a perovskite-like layer of quasi-2D perovskite-like material constructed of $BA_2FA_xMA_{1-x}Pb_2I_yBr_{7-y}$ (n=2) onto a 3D perovskite absorber layer (BA=butylamine; FA=formamidinium; MA=methylammonium). This resulted in the construction of a state-of-the-art perovskite solar cell (PSC) configuration, demonstrating an extended lifetime and higher charge carrier mobility. As a result of this exemplary vapor-phase surface treatment of the underlying 3D perovskite absorber layer, the efficiency of the device having the perovskite-like layer was enhanced for both double- and triple-cations perovskite compositions, with the best performing device reaching a device efficiency of ~24.3% in a small area device (0.12 cm$^2$). Moreover, when expanded to 7.5 cm$^2$ mini-modules, which require additional processes that complicate fabrication (e.g., scribing), the devices whose fabrication included the vapor-phase treatment using the surface modifier, maintained a device efficiency of about 19.9%. Further, as shown herein, the surface treatment using the surface modifier resulted in significant improvements to sustained performance by the device receiving the treatment. For example, a device having a triple-cation-mixed-halide perovskite absorber layer, maintained 81% of the initial performance after 1008 hours of operation with environmental conditions equivalent to one-sun at open circuit in air. Importantly, the vapor-treated devices exhibited enhanced device stability and efficiency than the solution-treated devices.

As described herein, the effects of several surface modifiers, including ammonium salts such as butylammonium iodide (BAI), phenethylammonium iodide (PEAI), and 4-fluorophenethylammonium iodide (FPEAI), were studied. These amino-halide salt surface modifiers were initially investigated by depositing them onto 3D perovskite surfaces using atomic layer deposition (ALD) methods. 2D diffraction features were observed for both PEAI and BAI vapor treatments on perovskite films, however, only at dosing conditions above 150° C. due to the low volatility of the amino-halide salts. At these temperatures under vacuum, ALD device performance was poor, likely from thermal instability of the perovskite layer. While ALD excels at providing precise and reproducible vapor treatments, one limitation is that the vapor stream cannot decrease in temperature between the precursor source and the reaction chamber without condensation and build-up in the dosing lines. For this reason, ALD was limited to higher reaction temperatures for these surface modifiers. However, this does not rule out the possibility of using ammonium salts such as PEAI and/or BAI as surface modifiers when using different vapor phase delivery systems and/or the use of ALD with higher volatility ammonium salt surface modifiers. Next, non-halogenated amines were studied as surface modifiers, which provide a higher vapor pressures than their halide-salt analogs (e.g., butylamine in place of BAI). Five non-halogenated amines were investigated: phenethylamine, 4-fluorophenethylamine, butylamine (BA), dipropylamine, and diethylamine. As shown herein, BA was observed to be the most effective surface/interface modifier and was, therefore, selected for in-depth study and development. However, the selection of BA as a preferred surface modifier is not intended to limit the scope of the present disclosure to just that specific amine.

Figure 9:
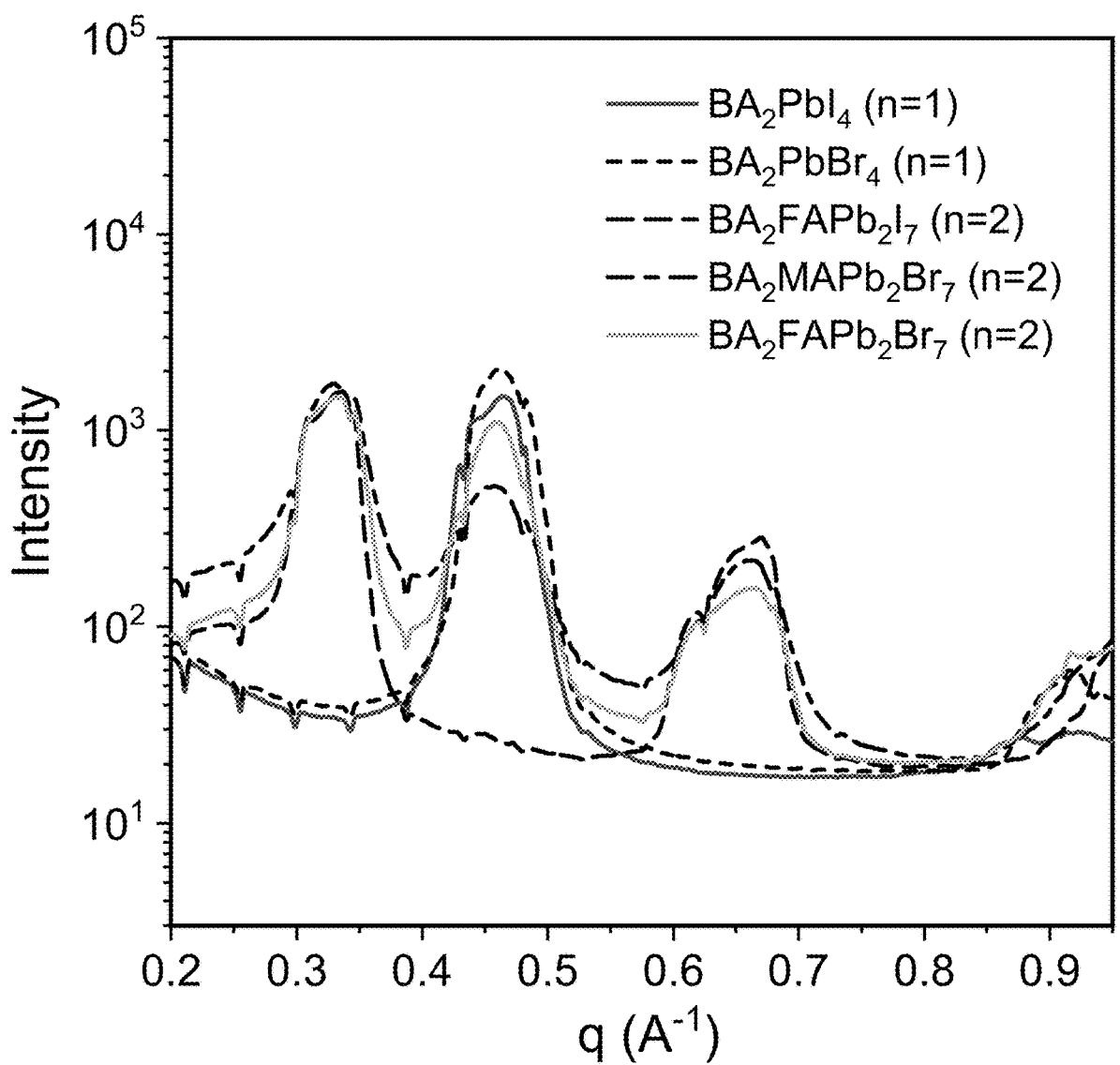
FIG. 9 illustrates a GIWAXS comparison of various n=1 and n=2 2D perovskite-like structures, including $BA_2PbI_4$ (n=1), $BA_2PbBr_4$ (n=1), $BA_2FAPb_2I_7$ (n=2), $BA_2MAPb_2Br_7$ (n=2), and $BA_2FAPb_2Br_7$ (n=2), according to some embodiments of the present disclosure.

FIG. 8A through 8D shows the structural analysis of the as-deposited ALD vapor-phase coated BA-based surface perovskite-like layer on top of a 3D perovskite absorber layer constructed of $FA_{0.85}MA_{0.1}Cs_{0.05}Pb I_{2.9}Br_{0.1}$ without additional annealing. The time-of-flight secondary ion mass spectrometry (TOF-SIMS) depth profiles of $C_4H_{12}N^+$ (associated with BA) for perovskite films with and without the BA vapor treatment are compared in FIG. 8A. About a factor of ten increase of $C_4H_{12}N^+$ signal is observed in the film that was treated with the BA surface modifier. A characteristic low-angle diffraction peak (about q=0.65 Å$^{-1}$) is observed with 900 cycle treatment, not observed with 250 cycle treatment, which is likely caused by the detection limit due to the thin surface layer (see FIG. 8B). The low-angle diffraction peak is typical for a quasi-2D perovskite $BA_2FA_xMA_{1-x}Pb_2I_yBr_{7-y}$ (n=2) structure (see FIG. 9).

Figure 10:
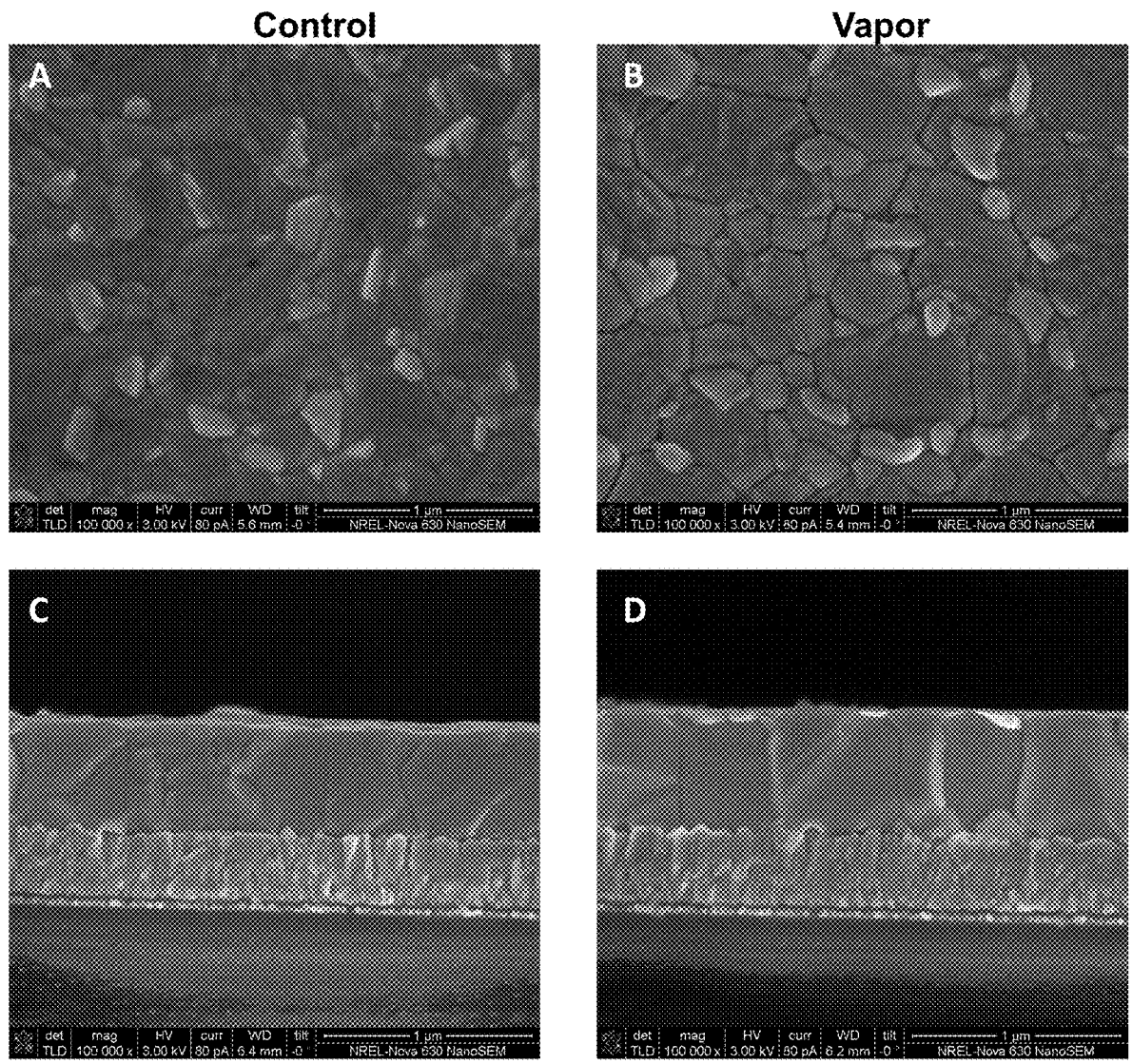
FIG. 10 illustrates SEM images of (Panel A) a control (i.e., untreated), (Panel B) vapor-phase treated perovskite layers (scale bar: 1 μm), (Panel C) cross-sectional view SEM images of the control, and (Panel D) vapor-phase modified perovskite layers on FTO glass, according to some embodiments of the present disclosure.
Figure 11A:
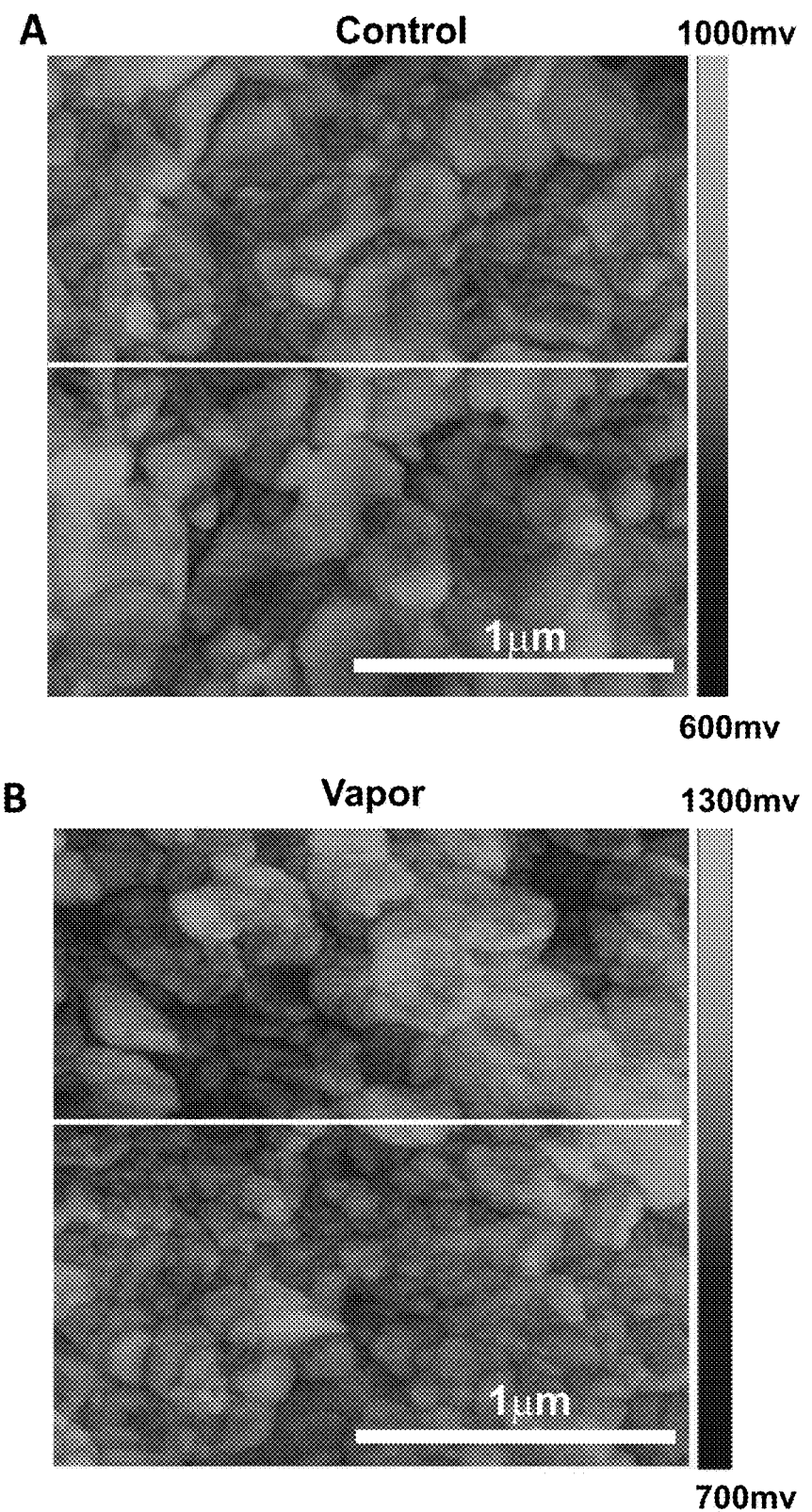
FIG. 11A illustrates Kelvin probe force microscopy (KPFM) measurement of (Panel A) the control and (Panel B) vapor-phase modified perovskite layers (scale bar: 1 μm), according to some embodiments of the present disclosure.
Figure 11B:
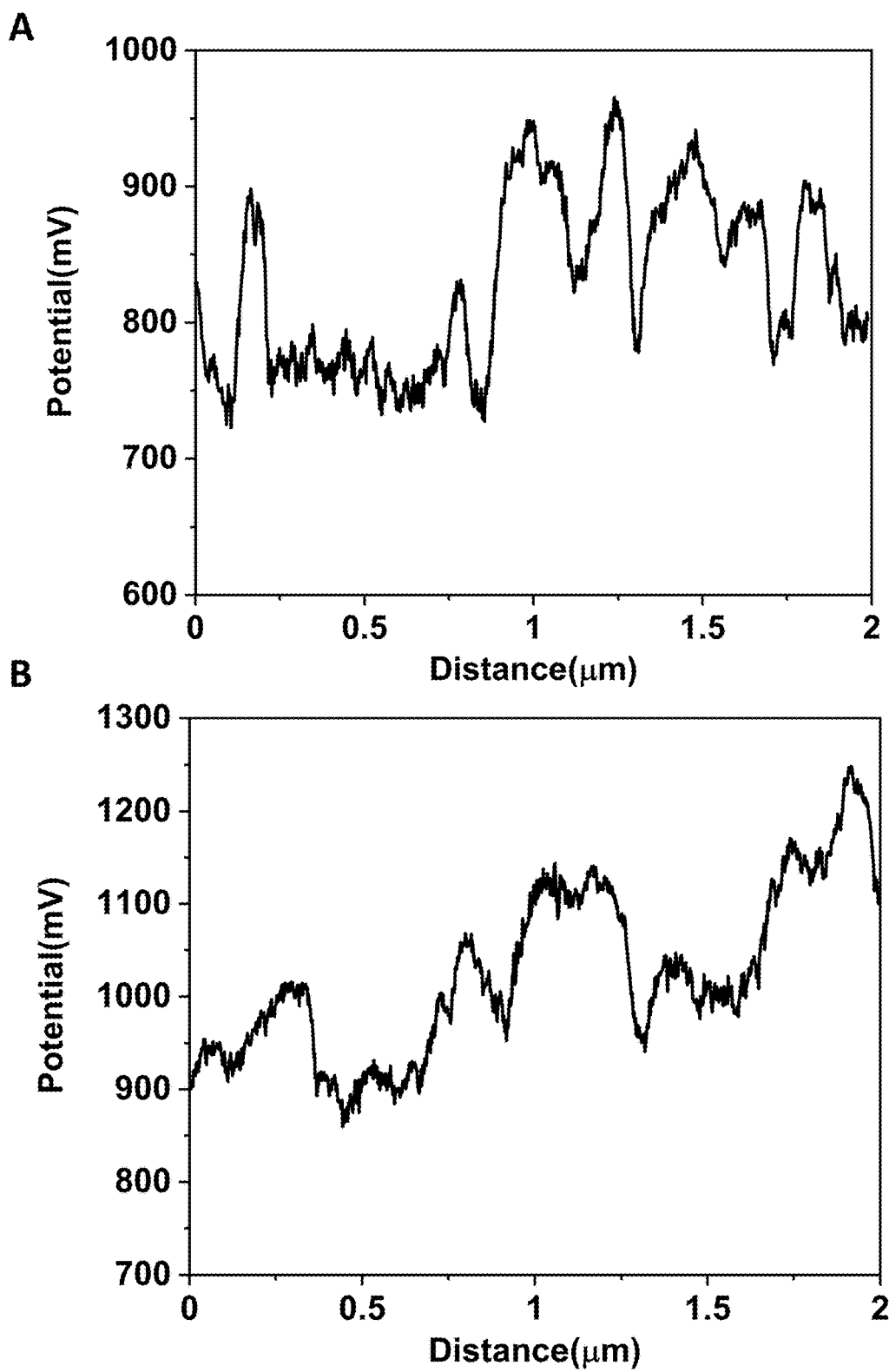
FIG. 11B illustrates the corresponding line profiles of the KPFM illustrates in FIG. 11B for (Panel A) the control and (Panel B) vapor-phase modified perovskite layers, according to some embodiments of the present disclosure.
Figure 12A:
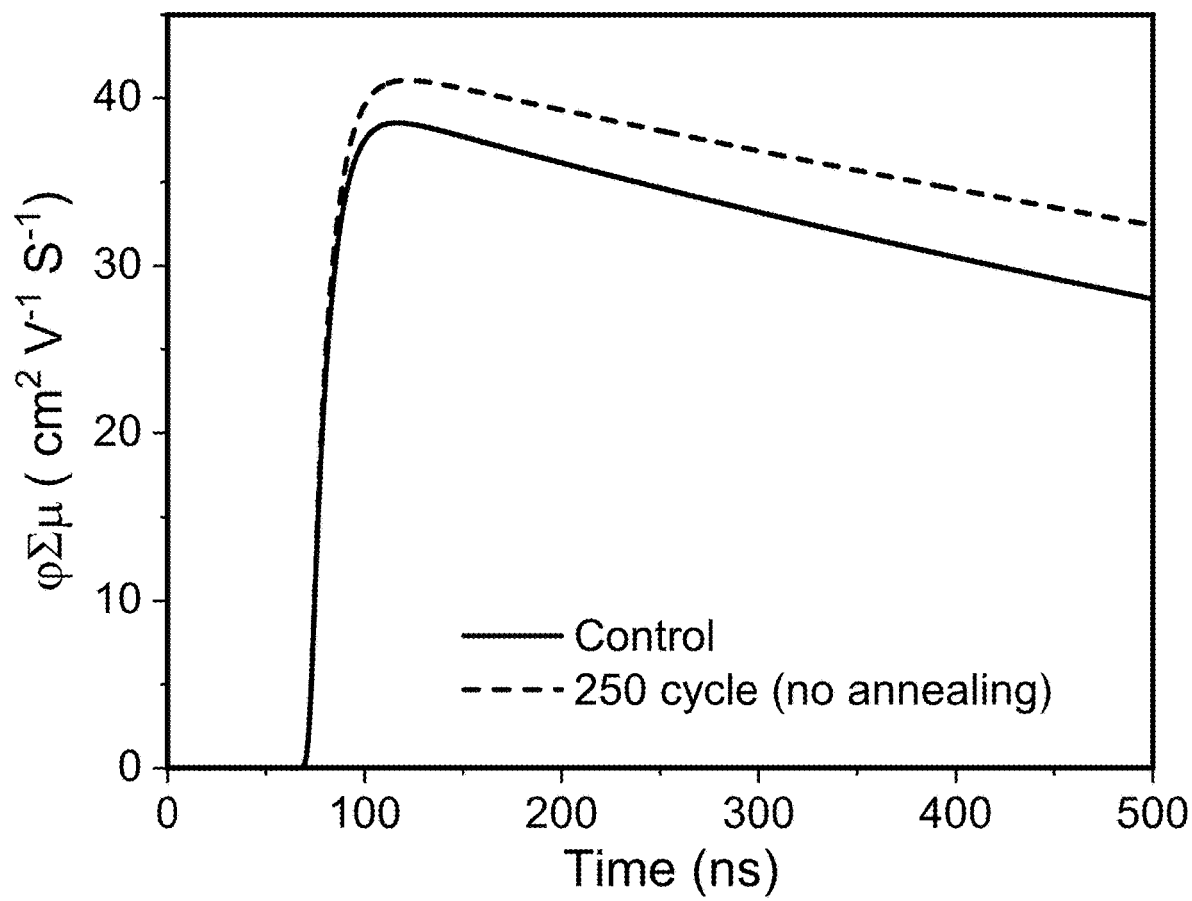
FIG. 12A illustrates time-resolved microwave conductivity (TRMC) data of perovskite layers with and without vapor-phase surface treatment, according to some embodiments of the present disclosure.
Figure 12B:
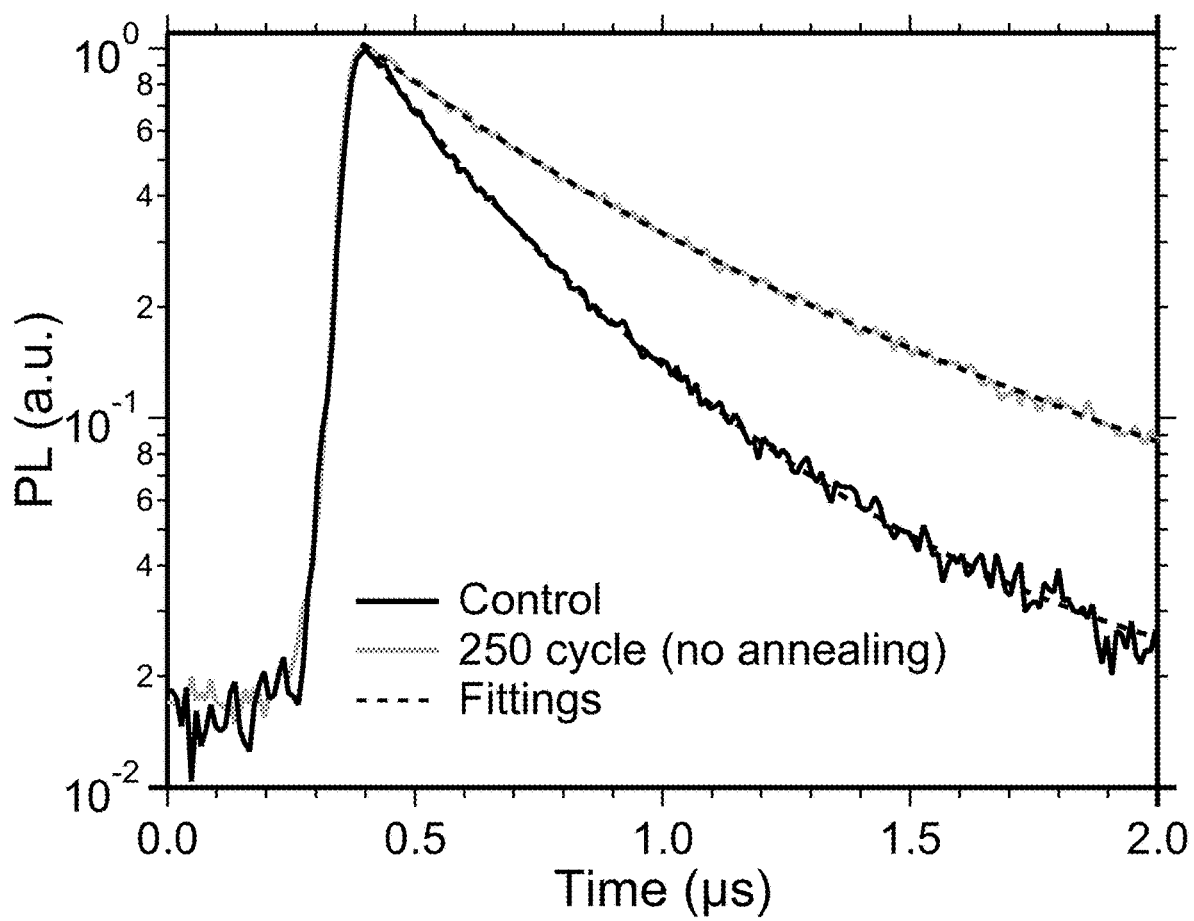
FIG. 12B illustrates time-resolved photoluminescence (TRPL) data of perovskite layers with and without vapor-phase surface treatment, according to some embodiments of the present disclosure.
Figure 12C:
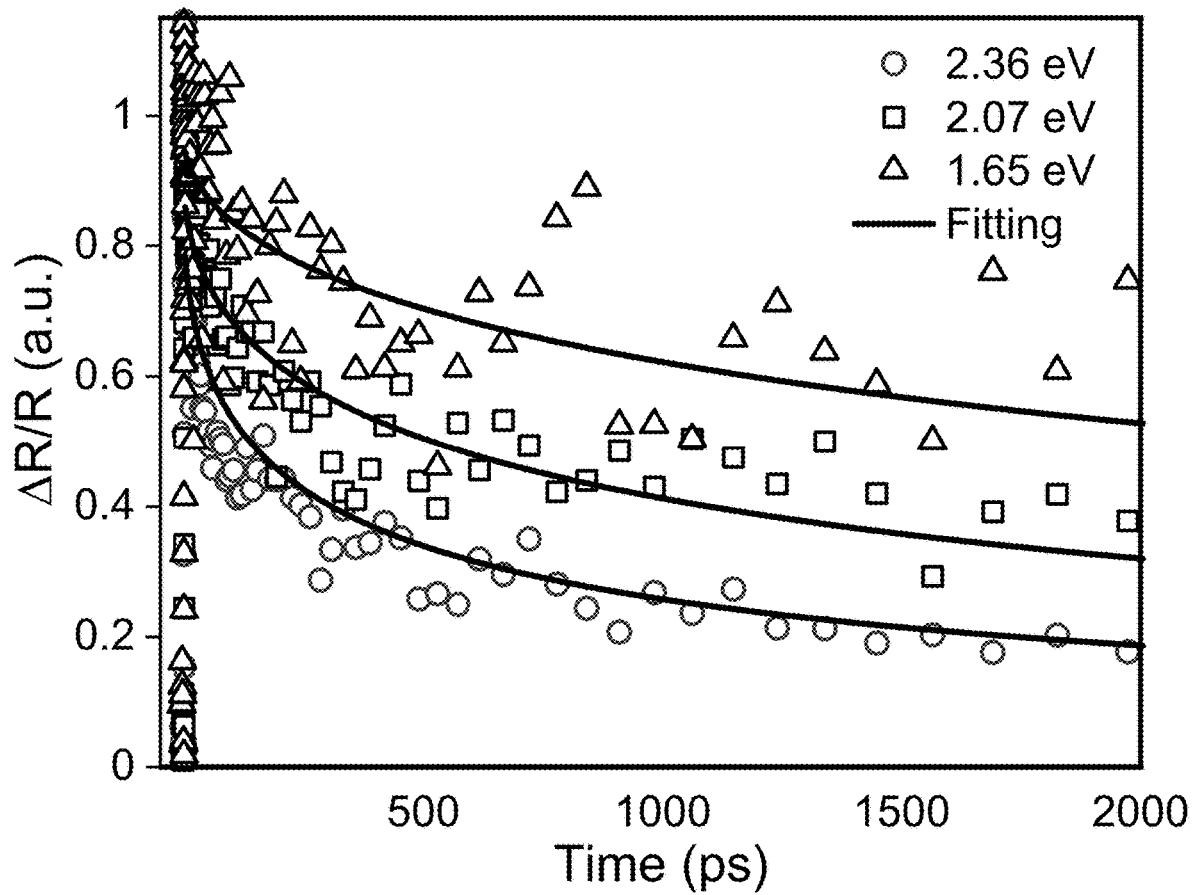
FIG. 12C illustrates a transient reflection comparison of untreated perovskite layers, according to some embodiments of the present disclosure.
Figure 12D:
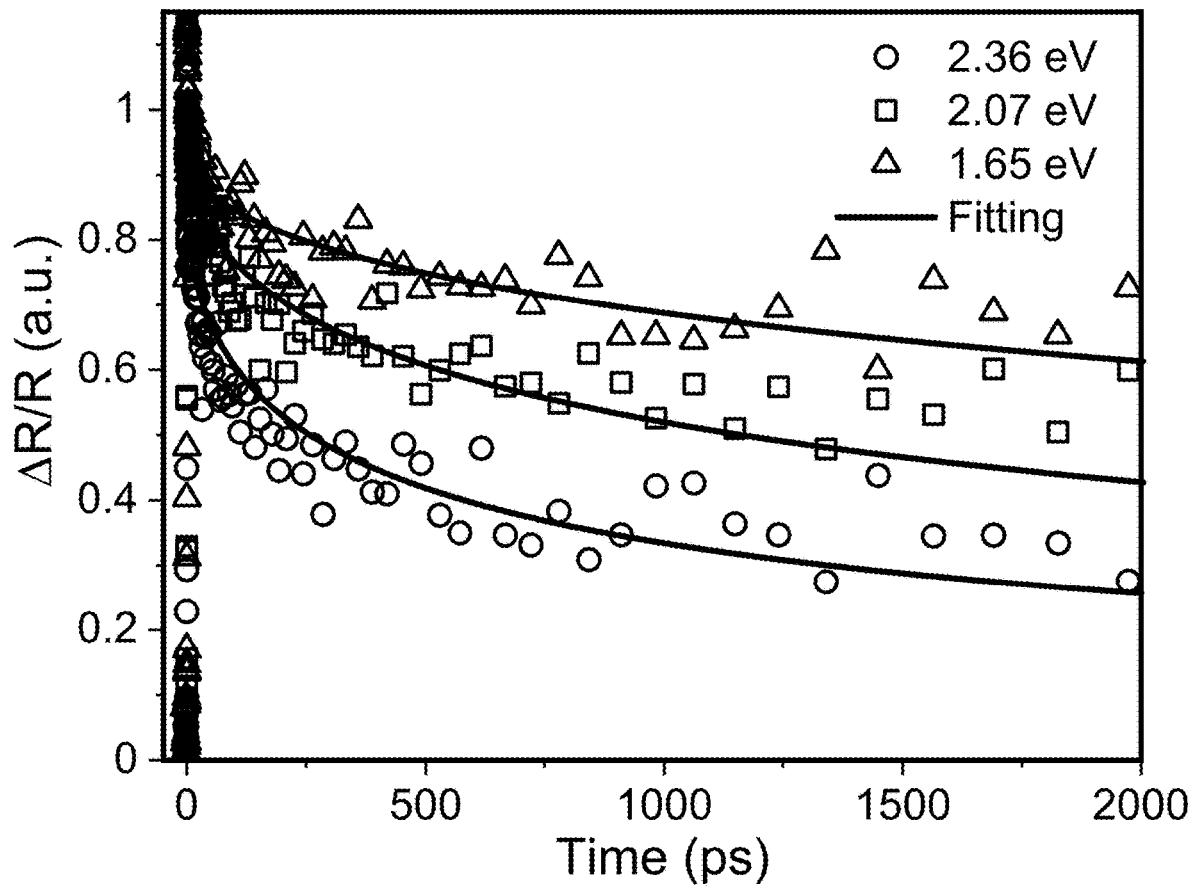
FIG. 12D illustrates a transient reflection comparison of vapor-phase treated perovskite layers, according to some embodiments of the present disclosure.

The surface morphologies of the untreated 3D perovskite film and the BA surface modifier vapor-phase treated perovskite film were characterized by scanning electron microscopy (SEM), and the results are shown in FIG. 10. The untreated perovskite film shows a compact and pinhole-free morphology with the appearance of some bright PbI$_2$ components. In comparison, after receiving the BA vapor treatment, the PbI$_2$ features on the surface of the treated perovskite film decreased, likely due to a reaction between the BA cation and PbI$_2$ resulting in the formation of a $BA_2FA_x MA_{1-x}Pb_2I_yBr_{7-y}$ (n=2) perovskite-like layer. Thus, in some embodiments of the present disclosure, the presence of PbI$_2$ can help facilitate the formation of a perovskite-like layer on the perovskite layer. In some embodiments, PbI$_2$ may form during the treating step, enabling the formation of the perovskite-like layer. Additionally, the BA vapor-phase treatment increased the surface potential value of the resultant 3D perovskite layer/2D perovskite-like layer composite (see FIGS. 11A and 11B), indicating that the treated 3D perovskite was less p-type or closer to n-type, which should form a better junction at the perovskite/HTL (hole transport layer) interface. The high-resolution transmission electron microscope (HRTEM) image of the cross-section of a vapor-treated perovskite film indicates the thickness of the 2D perovskite-like layer to have a thickness of about 30 nm, resulting from a 250-cycle ALD treatment (see FIG. 8C). The element mapping further confirms the composition of the 2D perovskite-like layer resulting from the vapor treatment (see FIG. 8D).

A set of optoelectronic characterizations were conducted to investigate the effect of the vapor-phase surface treating of the 3D perovskite thin films using surface modifiers. FIGS. 12 and 12 compare the time-resolved microwave conductivity (TRMC) and photoluminescence (TRPL) measurements of the perovskite films with and without the vapor-phase surface treatment. Both TRMC and TRPL suggest an improvement (higher mobility and longer recombination lifetime) resulting from the vapor surface treatments (see Tables 1 and 2). Transient reflection (TR) studies were also conducted to extract the charge diffusion coefficient (D) and surface recombination velocity (S) for the untreated perovskite layer (see FIG. 12C) and the vapor-phase surface treated (see FIG. 12D) perovskite layers. D and S values of 0.1 cm$^2$/s and 640 cm/s were obtained for the untreated perovskite sample and 0.07 cm$^2$/s and 50 cm/s for the vapor-phase BA surface-treated sample. The significantly reduced surface recombination velocity indicates much-improved surface properties resulting from the vapor-phase treatment of the surface of the 3D perovskite with the BA surface modifier.

TABLE 1

The yield-mobility ($\varphi\Sigma\mu$) and lifetimes of the control, and vapor-phase modified perovskite thin films extracted by fitting with a bi-exponential decay function. Since the yield is normally close to unity in high-performance PSCs, the yield-mobility product can be viewed as a measurement of the charge mobility.

| Samples | Mobility (cm$^2$/Vs) | Average lifetime ($\mu$s) |
|---|---|---|
| Control | 38.5 | 1.09 |
| Vapor | 41.2 | 1.49 |

TABLE 2

TRPL lifetimes of the control, and vapor-phase modified perovskite thin films extracted by fitting the PL decay curve with a bi-exponential decay function.

| Samples | fast component $\tau_1$ (ns) | slow component $\tau_2$ (ns) |
|---|---|---|
| Control | 192 | 445 |
| Vapor | 291 | 784 |

Figure 13:
FIG. 13 illustrates C 1s and N 1s XPS spectra taken on the control and vapor-phase modified perovskite layers, which show clear indications of the BA cation on the surface of the layers, according to some embodiments of the present disclosure.
Figure 13:
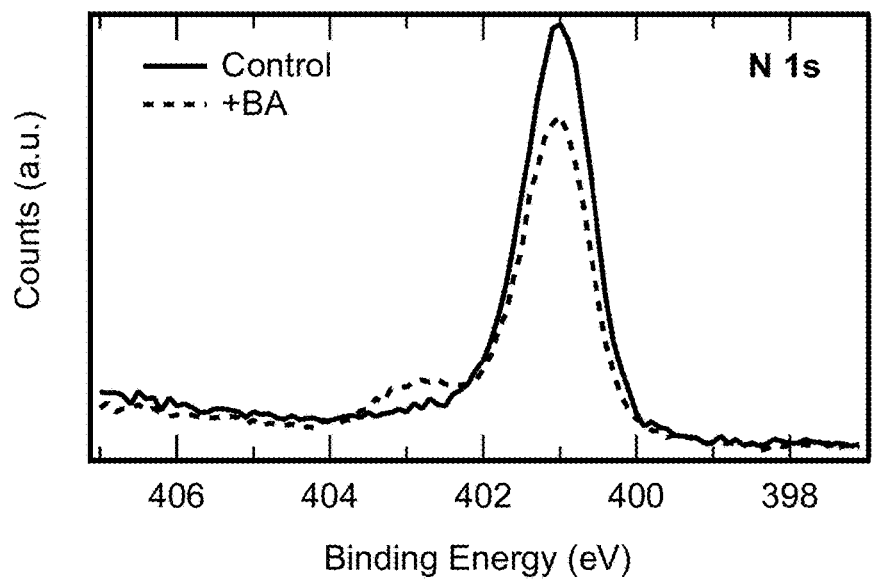
Figure 13:
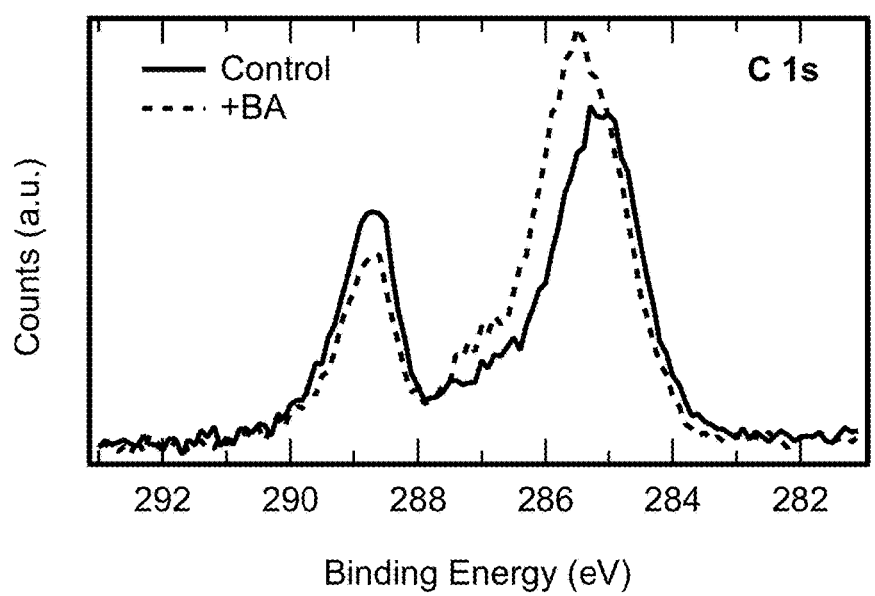
Figure 14:
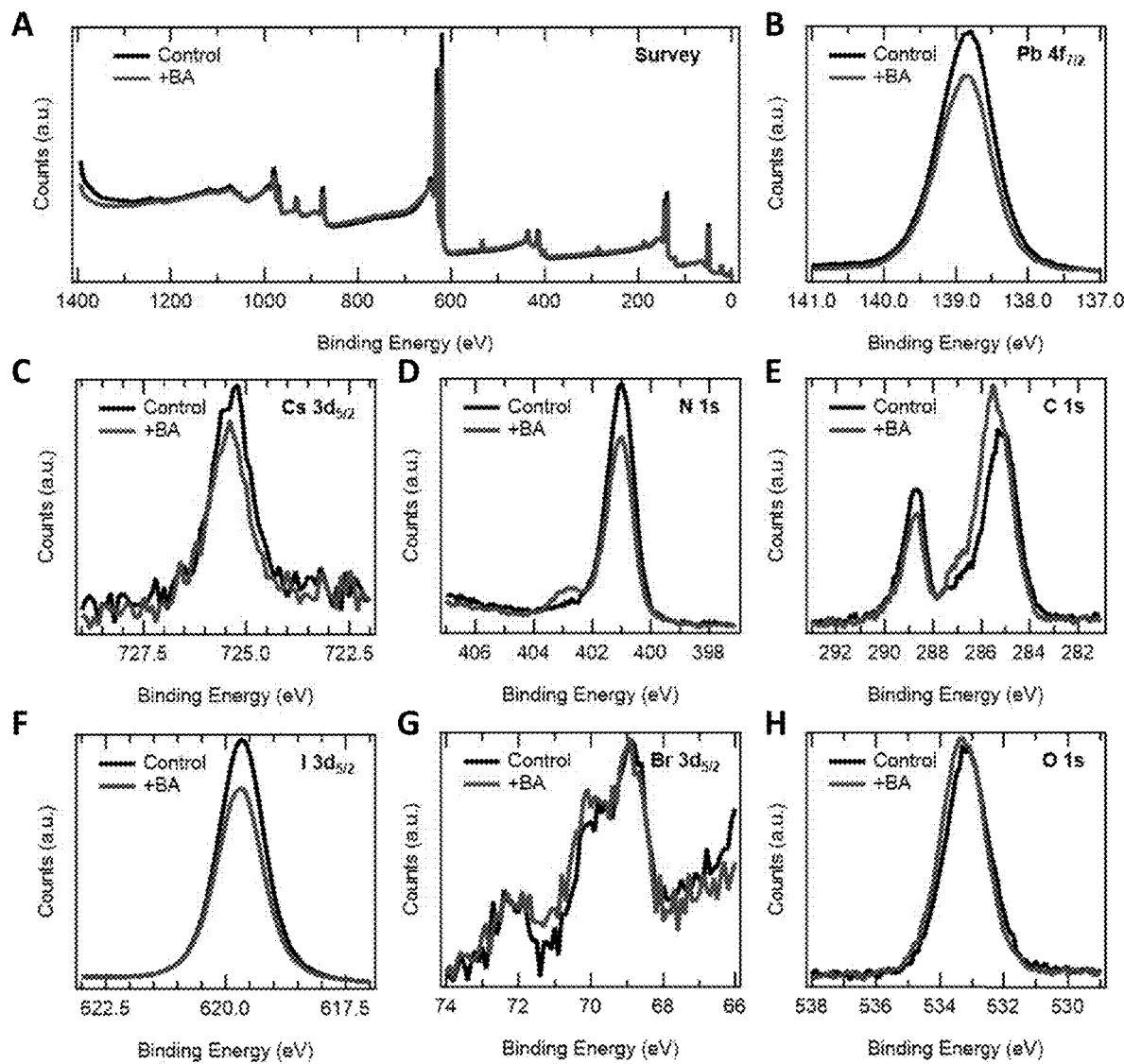
FIG. 14 illustrates survey and core level spectra obtained for untreated and BA vapor-phase treated perovskite samples, according to some embodiments of the present disclosure.

To further characterize the effect of the BA surface modifier (see Panel a) of FIG. 13) vapor-phase treatment on the surface chemistry of perovskite layers, X-ray Photoelectron Spectroscopy (XPS) was performed on the treated/modified and untreated/unmodified perovskite layers deposited on FTO/TiO$_2$ substrates. C is and N is results with peak assignments and indication of how many bonds should be involved in each cation is shown in Panel b) of FIG. 13, while the rest of the core levels and a survey scan are displayed in FIG. 14. As can be seen, vapor deposition of the BA cation surface modifier results in an increase in the C—C (285 eV) and C—NH$_x$ (~287 eV, 401 eV) on the surface and a reduction of the C=NH$_x$ (401 eV, 289 eV), consistent with replacing some of the 3D A-site cation with the BA cation. This leaves the rest of the core level spectral shapes relatively unchanged but results in obvious variations in relative ratios of organic to non-organic species that are primarily visible with respect to C is due to replacing FA (two nitrogen atoms) with BA (one nitrogen atom) counteracts any trends that would be seen in nitrogen.

Figure 15A:
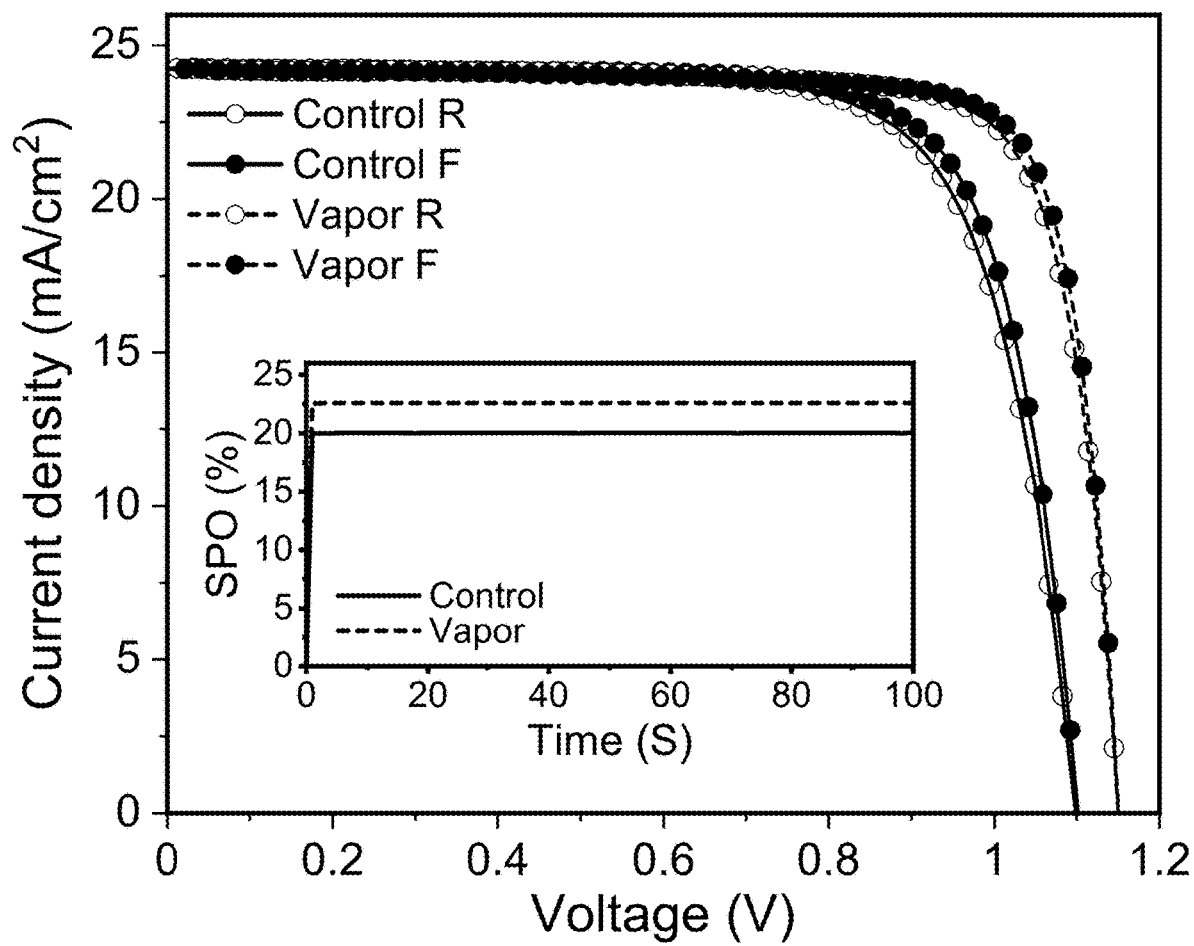
FIG. 15A illustrates J-V characteristics of PSCs based on the perovskite composition $FA_{0.85}MA_{0.1}Cs_{0.05}PbI_{2.9}Br_{0.1}$, for both treated and untreated perovskite layers, according to some embodiments of the present disclosure. The insets are stabilized power outputs (SPOs) of the corresponding devices.
Figure 15B:
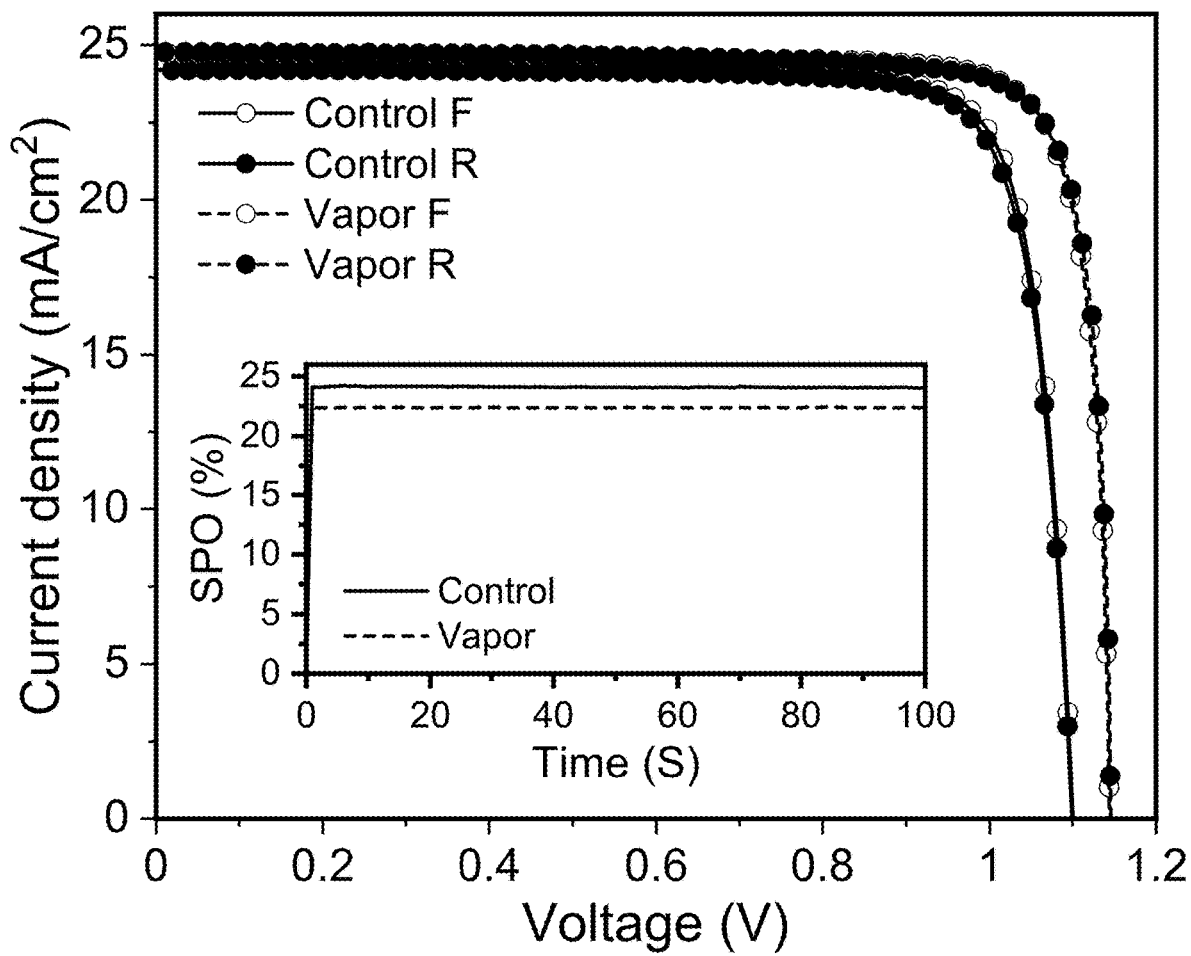
FIG. 15B illustrates J-V characteristics of PSCs based on the perovskite composition $FA_{0.97}MA_{0.03}PbI_{2.91}Br_{0.09}$, for both treated and untreated perovskite layers, according to some embodiments of the present disclosure. The insets are stabilized power outputs (SPOs) of the corresponding devices.
Figure 16:
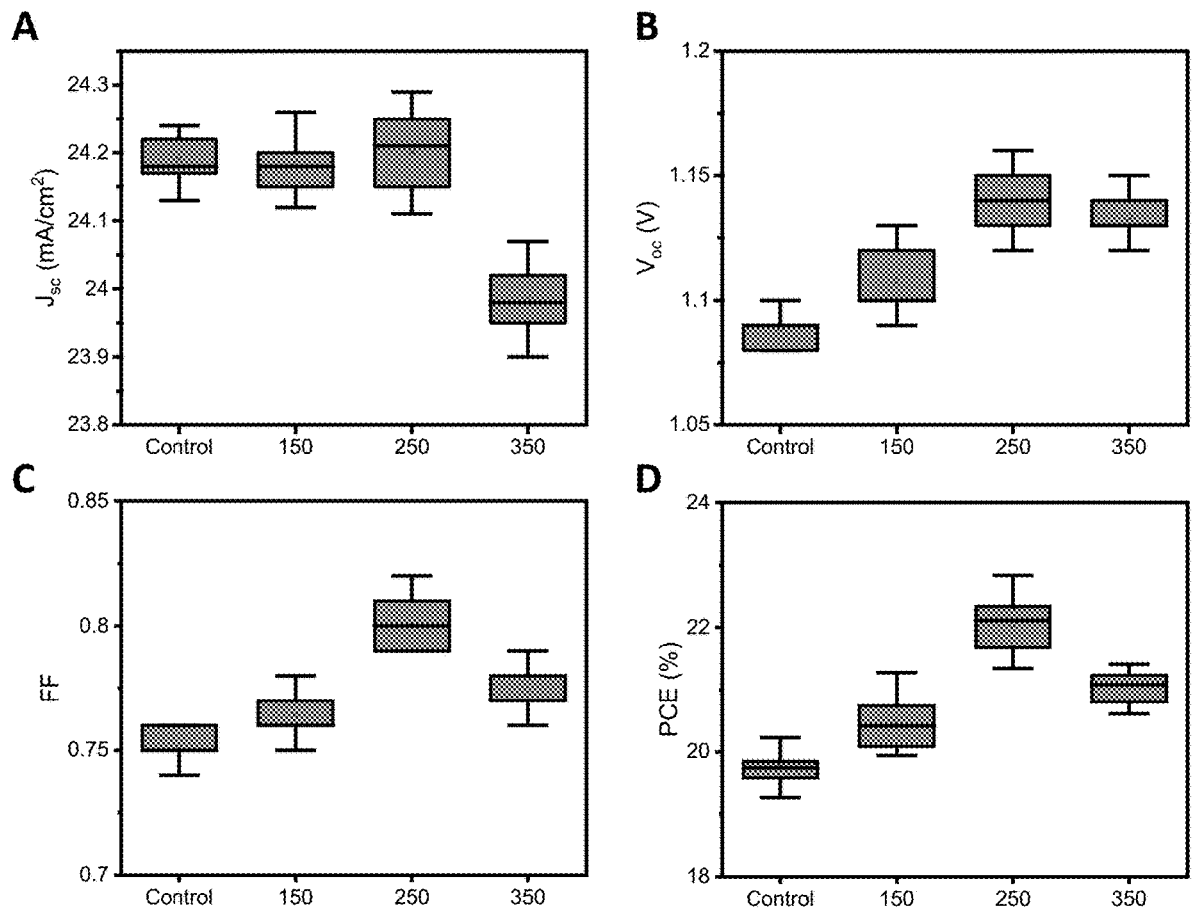
FIG. 16 illustrates a statistical comparison of devices based on $FA_{0.85}MA_{0.1}Cs_{0.05}PbI_{2.9}Br_{0.1}$ perovskite layers with different cycles of BA vapor-phase treating without heating, according to some embodiments of the present disclosure. Panels A) $J_{SC}$; B) $V_{OC}$; C) FF; D) PCE.
Figure 17:
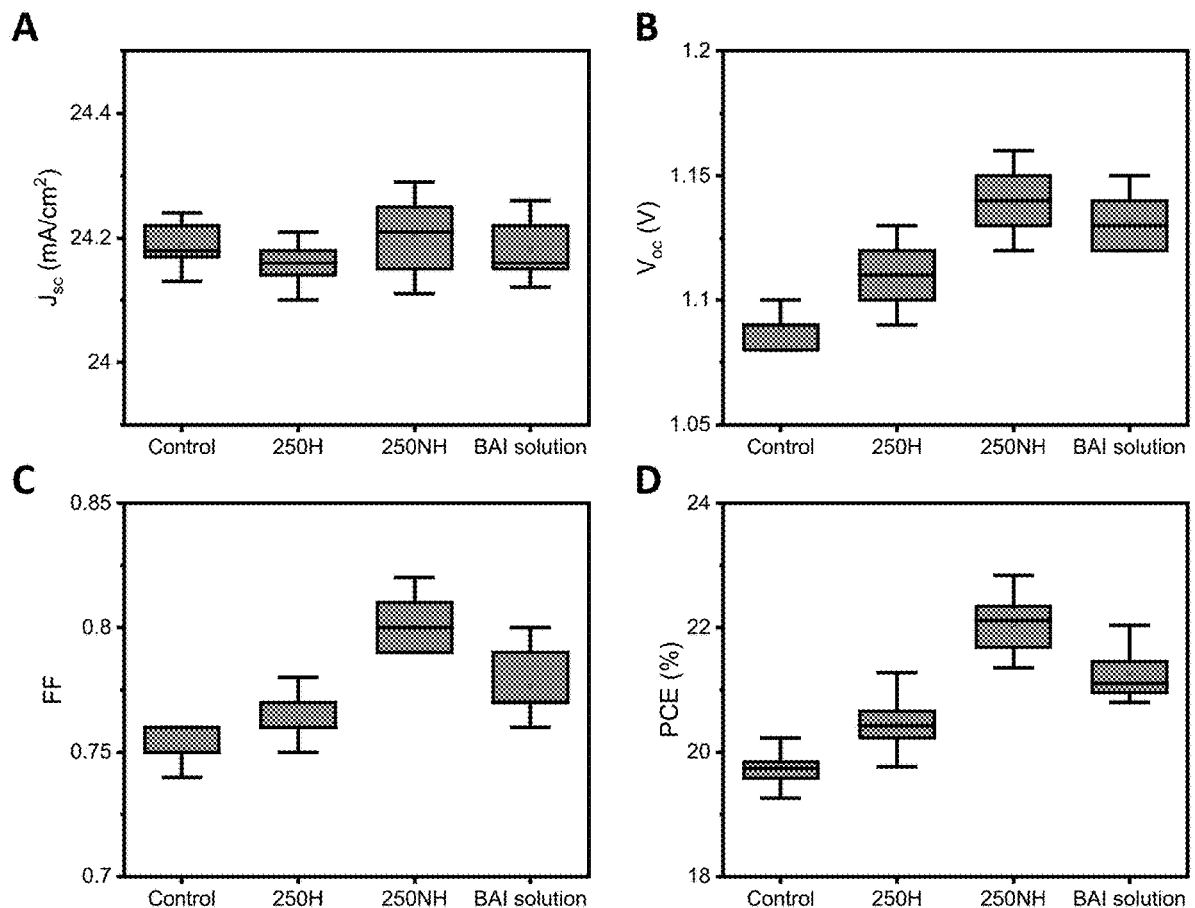
FIG. 17 illustrates a statistical comparison of devices based on corresponding $FA_{0.85}MA_{0.1}Cs_{0.05}PbI_{2.9}Br_{0.1}$ perovskite layers with different treatments, according to some embodiments of the present disclosure. Panels A) $J_{SC}$; B) $V_{OC}$; C) FF; D) PCE. 250H represents 250 cycles with heating and 250NH represents 250 cycles without heating.
Figure 18:
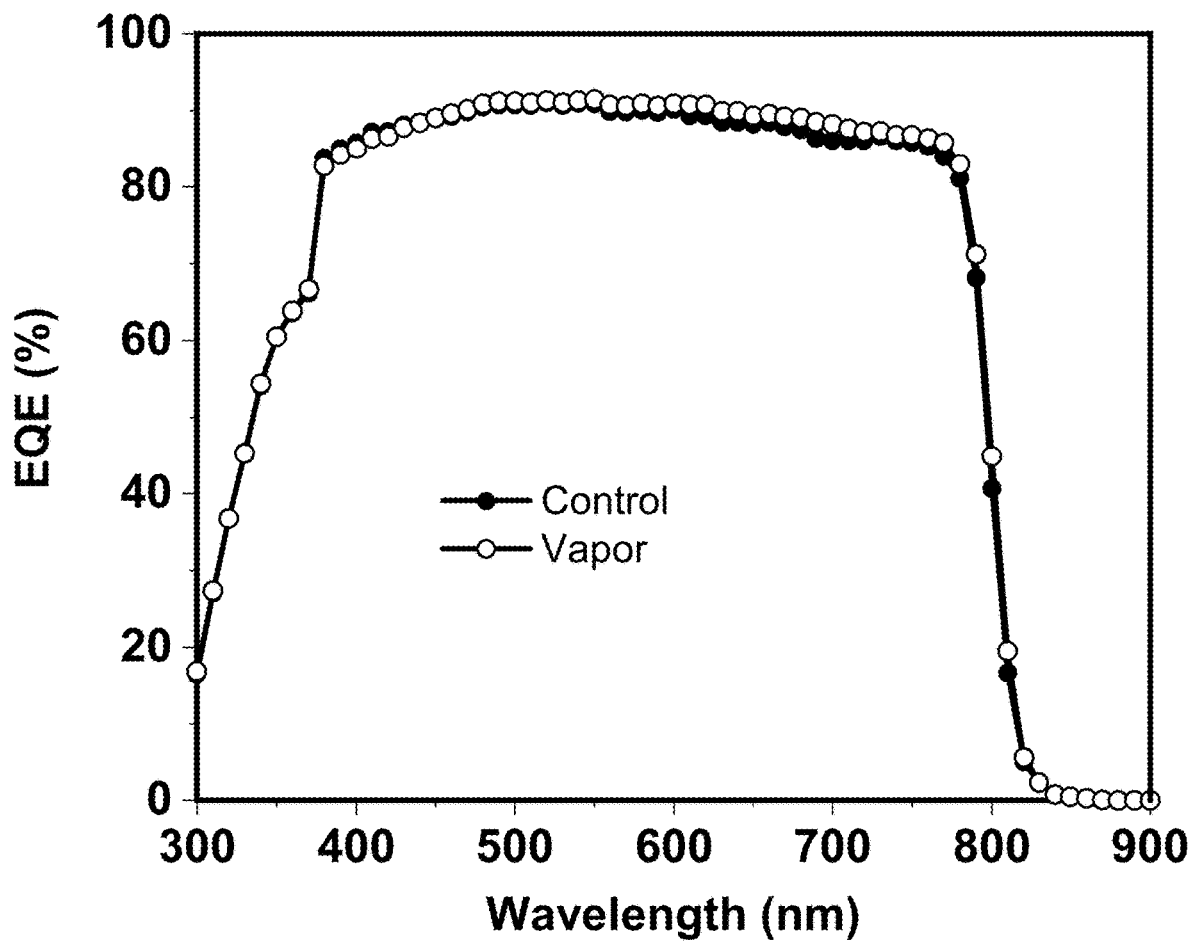
FIG. 18 illustrates EQE spectra of devices based on $FA_{0.85}MA_{0.1}Cs_{0.05}PbI_{2.9}Br_{0.1}$ perovskite absorber layers without (control) and with the BA vapor-phase treatment (vapor), according to some embodiments of the present disclosure.
Figure 19:
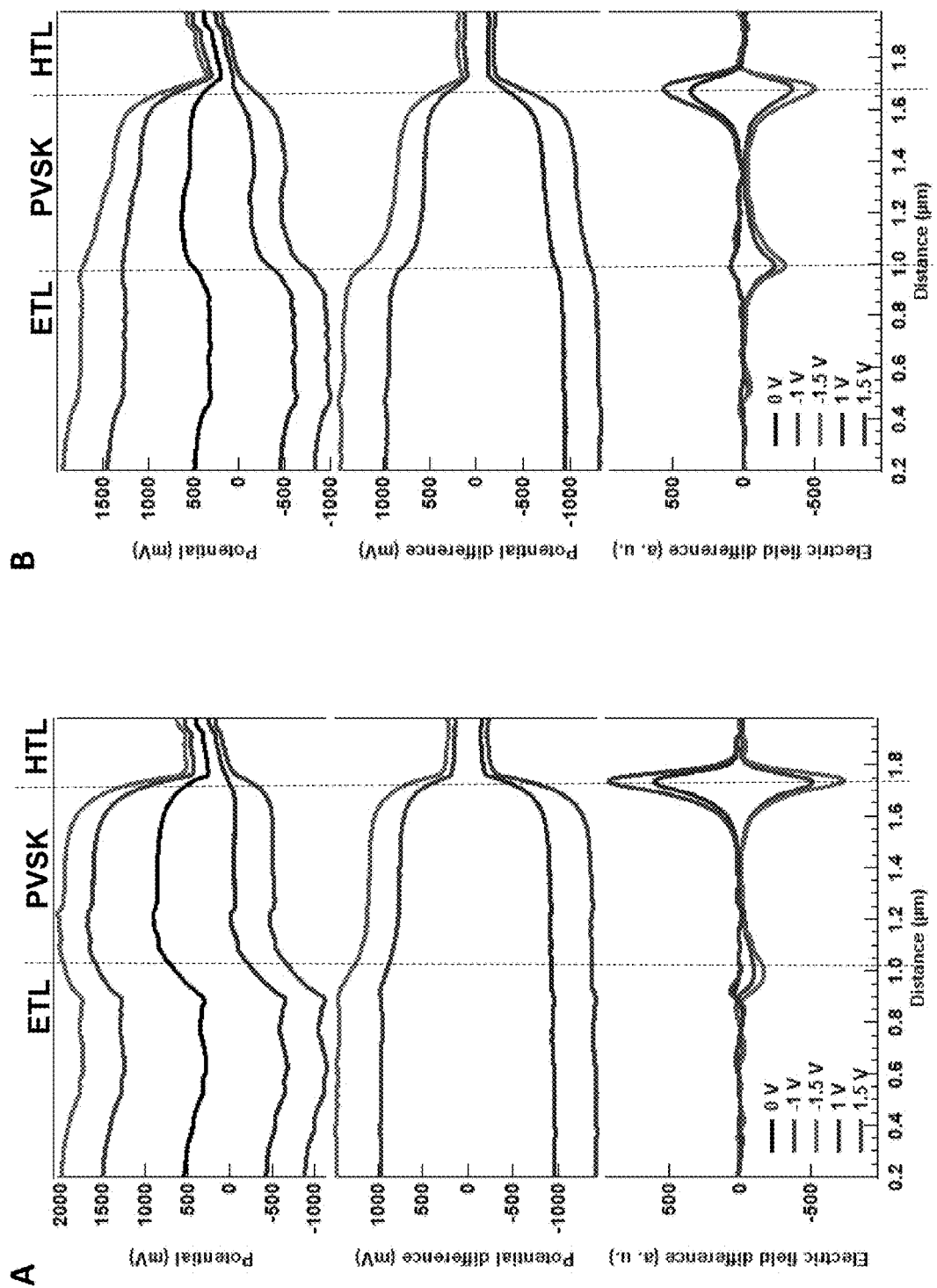
FIG. 19 illustrates KPFM electrical potential and field profiling on the cross-sectional surface for devices based on (Panel A) the control and (Panel B) vapor-phase modified perovskite layers, according to some embodiments of the present disclosure.
Figure 20:
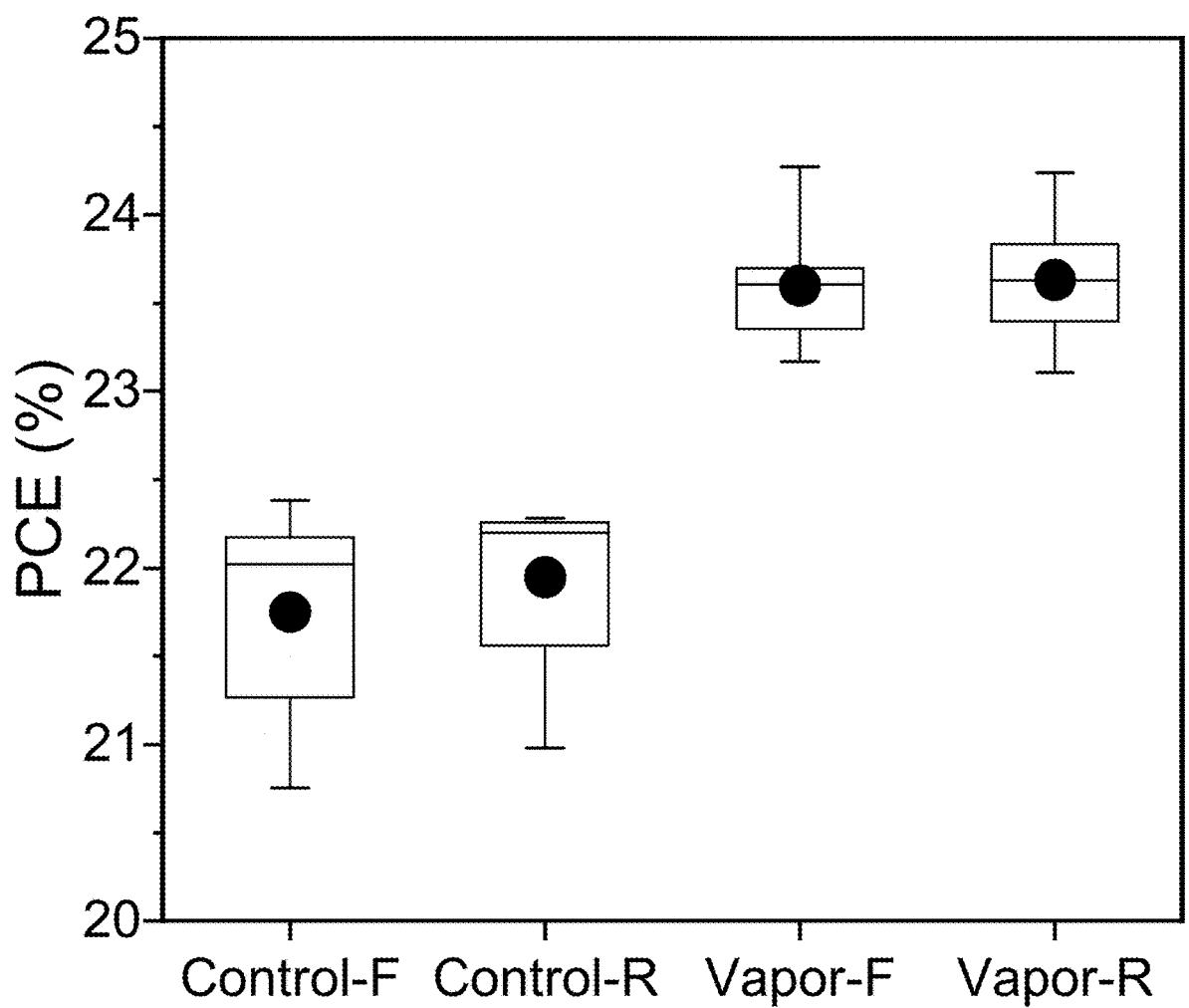
FIG. 20 illustrates a statistical distribution of PCE of perovskite solar cells based on control $FA_{0.97}MA_{0.03}PbI_{2.91}Br_{0.09}$ perovskite layers and vapor-phase modified $FA_{0.97}MA_{0.03}PbI_{2.91}Br_{0.09}$ perovskite layers, according to some embodiments of the present disclosure. F and R indicate forward and reverse scans, respectively.
Figure 22A:
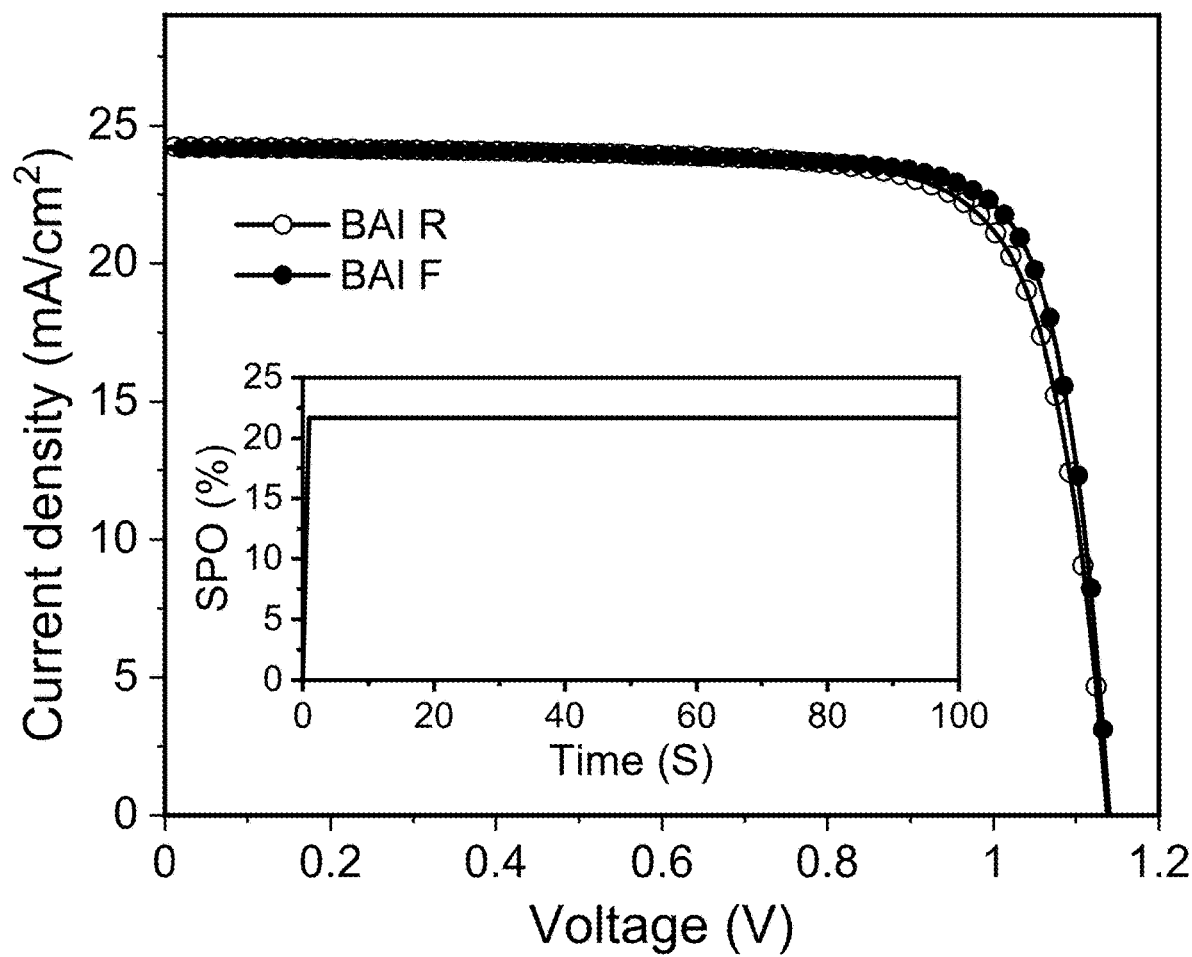
FIG. 22A illustrates J-V characteristics of PSCs based on different BAI solution treated perovskite compositions of $FA_{0.85}MA_{0.1}Cs_{0.05}PbI_{2.9}Br_{0.1}$, according to some embodiments of the present disclosure. The inset is stabilized power outputs (SPOs).
Figure 22B:
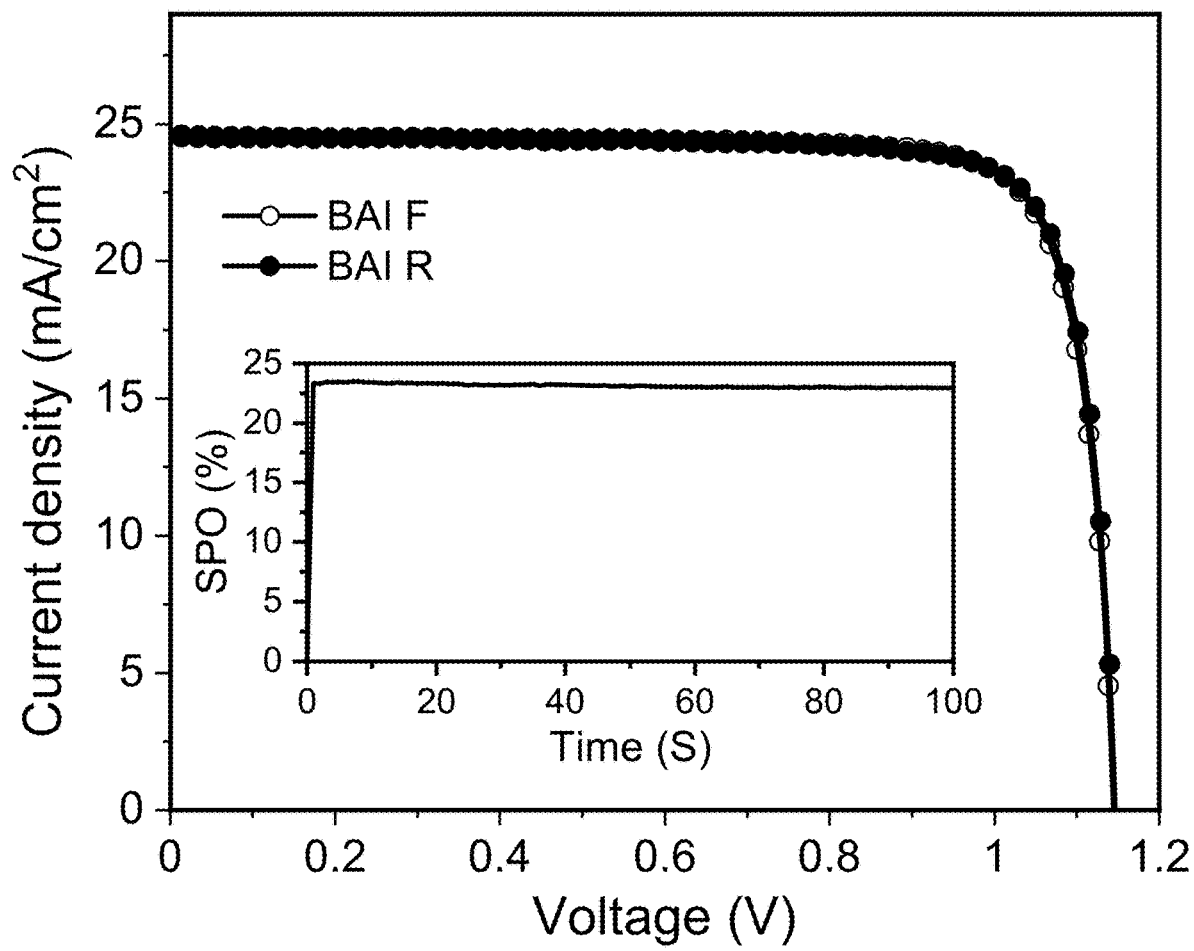
FIG. 22B illustrates J-V characteristics of PSCs based on different BAI solution treated perovskite compositions of $FA_{0.97}MA_{0.03}PbI_{2.91}Br_{0.09}$, according to some embodiments of the present disclosure. The inset is stabilized power outputs (SPOs).

To investigate the impact of vapor-phase treatment of perovskite surface using surface modifiers on the PV performance, PSCs were fabricated using mesoporous or planar n-i-p device architecture, glass/FTO/ETL/perovskite/HTL/Au, where ETL (electron transfer layer) is TiO$_2$ or SnO$_2$, and HTL (hole transfer layer) is spiro-OMeTAD, with more details below. The device characteristics for the untreated device and BA vapor-phase treated triple-cation-mixed-halide FA$_{0.85}$MA$_{0.1}$Cs$_{0.05}$PbI$_{2.9}$Br$_{0.1}$ perovskite layers are compared in FIG. 15A. The corresponding PV parameters are summarized in Table 3. The vapor-phase surface treatment improved the device efficiency to 22.3% and 22.8% with the reverse and forward voltage scans, in comparison to the untreated device (i.e., control device) which yielded 19.7% and 20.2% from the reverse and forward voltage scans. Note that the optimum number of cycles for BA ALD vapor treatment was found to be 250 cycles (see FIG. 16). For this number of cycles, the performance was decreased with annealing compared to the devices without annealing of the vapor-phase treated 3D perovskite and/or the 3D/2D bilayer (see FIG. 17). The short-circuit current density (J$_{sc}$) is slightly increased for the vapor-treated PSC, which is also consistent with the external quantum efficiency (EQE) spectra shown in FIG. 18. The statistical comparison of the PV parameters is further illustrated in FIG. 16. It is evident that the vapor surface treatment enhanced all four PV parameters, with the most significant improvement in both the open-circuit voltage (V$_{oc}$) and fill factor (FF), which is consistent with the improved surface property with vapor-phase surface treatment. The PCE improvement is also consistent with a better perovskite/HTL junction based on the cross-sectional Kelvin probe force microscopy (KPFM) measurements (see FIG. 19). In addition to the FAMACs-based perovskite composition, the impact of vapor-phase treatment on planar SnO$_2$PSCs based on double-cation-mixed-halide perovskite (FA$_{0.97}$MA$_{0.03}$PbI$_{2.91}$Br$_{0.09}$) was studied, which yielded PCE improvements from 22.4% to 24.3% from the forward scan and from 22.2% to 24.2% from the reverse scan. For both perovskite compositions, the stabilized power outputs (SPOs) for PSCs based on the control (i.e., untreated) and vapor-phase modified perovskite layers match well with the J-V measurements (insets of FIGS. 22A and 22B, and Table 3). The PCE improvement for these two perovskite compositions is reproducible based on the statistical comparison (see FIGS. 16 and 20).

TABLE 3

PV parameters of PSCs based on control, vapor-phase and BAI solution-modified perovskite thin films using different perovskite compositions. (V$_{oc}$: open-circuit voltage; J$_{sc}$: short-circuit current density; FF: fill factor; PCE: power conversion efficiency).

| Device | Scan | J$_{sc}$ (mA/cm$^2$) | V$_{oc}$ (V) | FF | PCE (%) | SPO (%) |
|---|---|---|---|---|---|---|
| FA$_{0.85}$MA$_{0.1}$Cs$_{0.05}$PbI$_{2.9}$Br$_{0.1}$ | Forward | 24.21 | 1.10 | 0.76 | 20.2 | 20.0 |
|  | Reverse | 24.24 | 1.10 | 0.74 | 19.7 |  |
| FA$_{0.85}$MA$_{0.1}$Cs$_{0.05}$PbI$_{2.9}$Br$_{0.1}$/ BAI solution | Forward | 24.16 | 1.14 | 0.80 | 22.0 | 21.7 |
|  | Reverse | 24.21 | 1.13 | 0.78 | 21.3 |  |

TABLE 3-continued

PV parameters of PSCs based on control, vapor-phase and BAI solution-modified perovskite thin films using different perovskite compositions. ($V_{oc}$: open-circuit voltage; $J_{sc}$: short-circuit current density; FF: fill factor; PCE: power conversion efficiency).

| Device | Scan | $J_{sc}$ (mA/cm$^2$) | $V_{oc}$ (V) | FF | PCE (%) | SPO (%) |
|---|---|---|---|---|---|---|
| FA$_{0.85}$MA$_{0.1}$Cs$_{0.05}$PbI$_{2.9}$Br$_{0.1}$/ Vapor-phase | Forward | 24.22 | 1.15 | 0.82 | 22.8 | 22.6 |
| | Reverse | 24.27 | 1.15 | 0.80 | 22.3 | |
| FA$_{0.97}$MA$_{0.03}$PbI$_{2.91}$Br$_{0.09}$ | Forward | 24.20 | 1.100 | 0.841 | 22.4 | 22.3 |
| | Reverse | 24.22 | 1.100 | 0.832 | 22.2 | |
| FA$_{0.97}$MA$_{0.03}$PbI$_{2.91}$Br$_{0.09}$/ BAI solution | Forward | 24.63 | 1.1427 | 0.829 | 23.3 | 23.0 |
| | Reverse | 24.52 | 1.148 | 0.830 | 23.4 | |
| FA$_{0.97}$MA$_{0.03}$PbI$_{2.91}$Br$_{0.09}$/ Vapor-phase | Forward | 24.72 | 1.144 | 0.858 | 24.3 | 24.1 |
| | Reverse | 24.77 | 1.146 | 0.854 | 24.2 | |

Figure 15C:
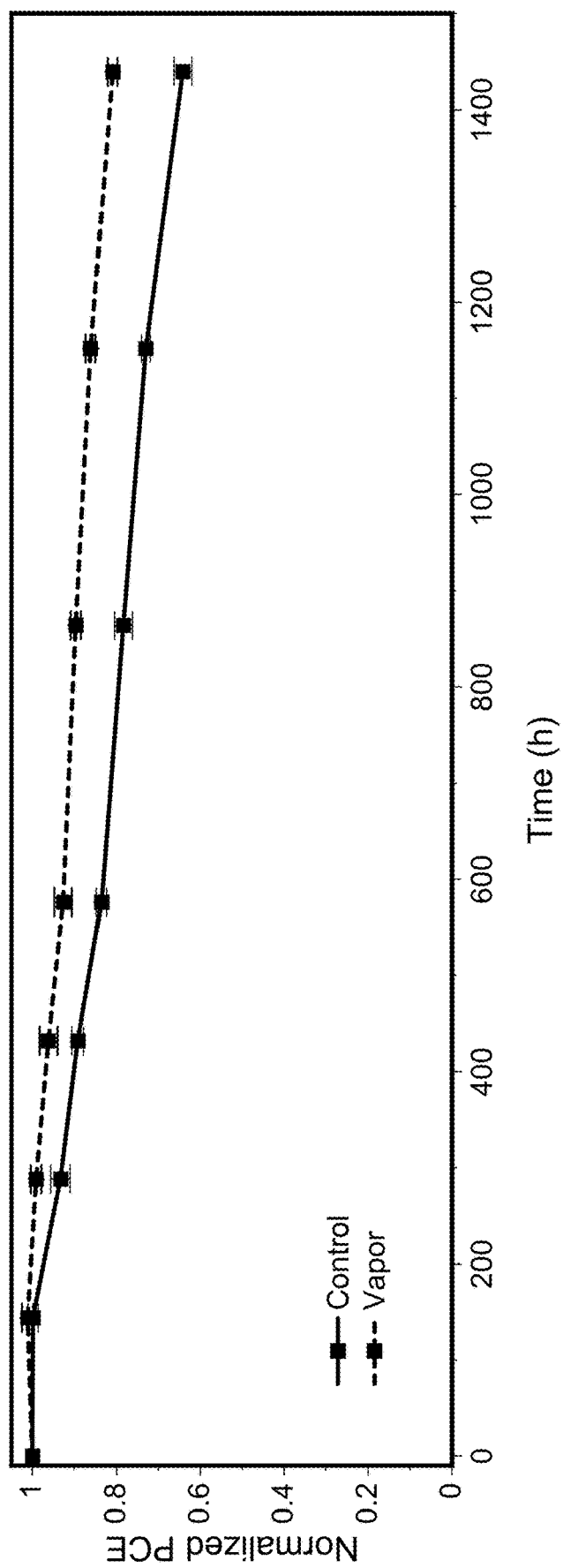
FIG. 15C illustrates a device stability comparison of devices based on the control and vapor-phase treated perovskite layers, tested under dark conditions, 10-20% RH, ~55° C. in air, according to some embodiments of the present disclosure.
Figure 15D:
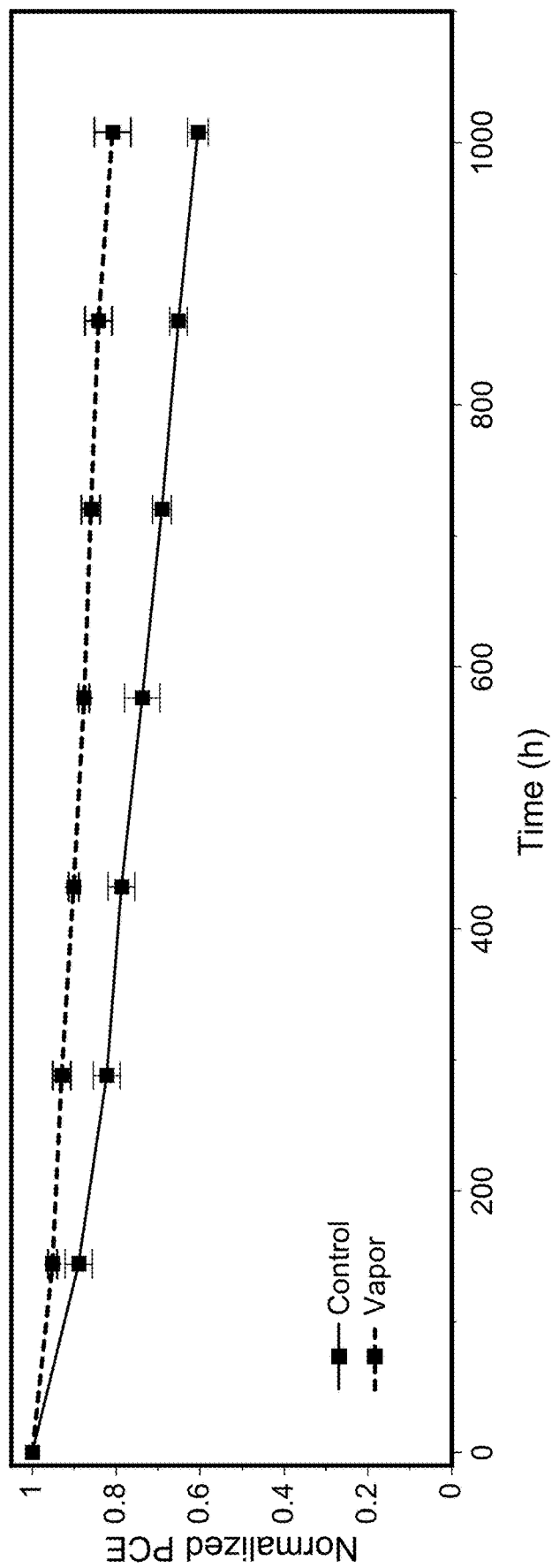
FIG. 15D illustrates a device stability comparison of devices based on the control and vapor-phase treated perovskite layers, tested under ~one-sun illumination, open circuit, 10-20% RH in air, according to some embodiments of the present disclosure.
Figure 21:
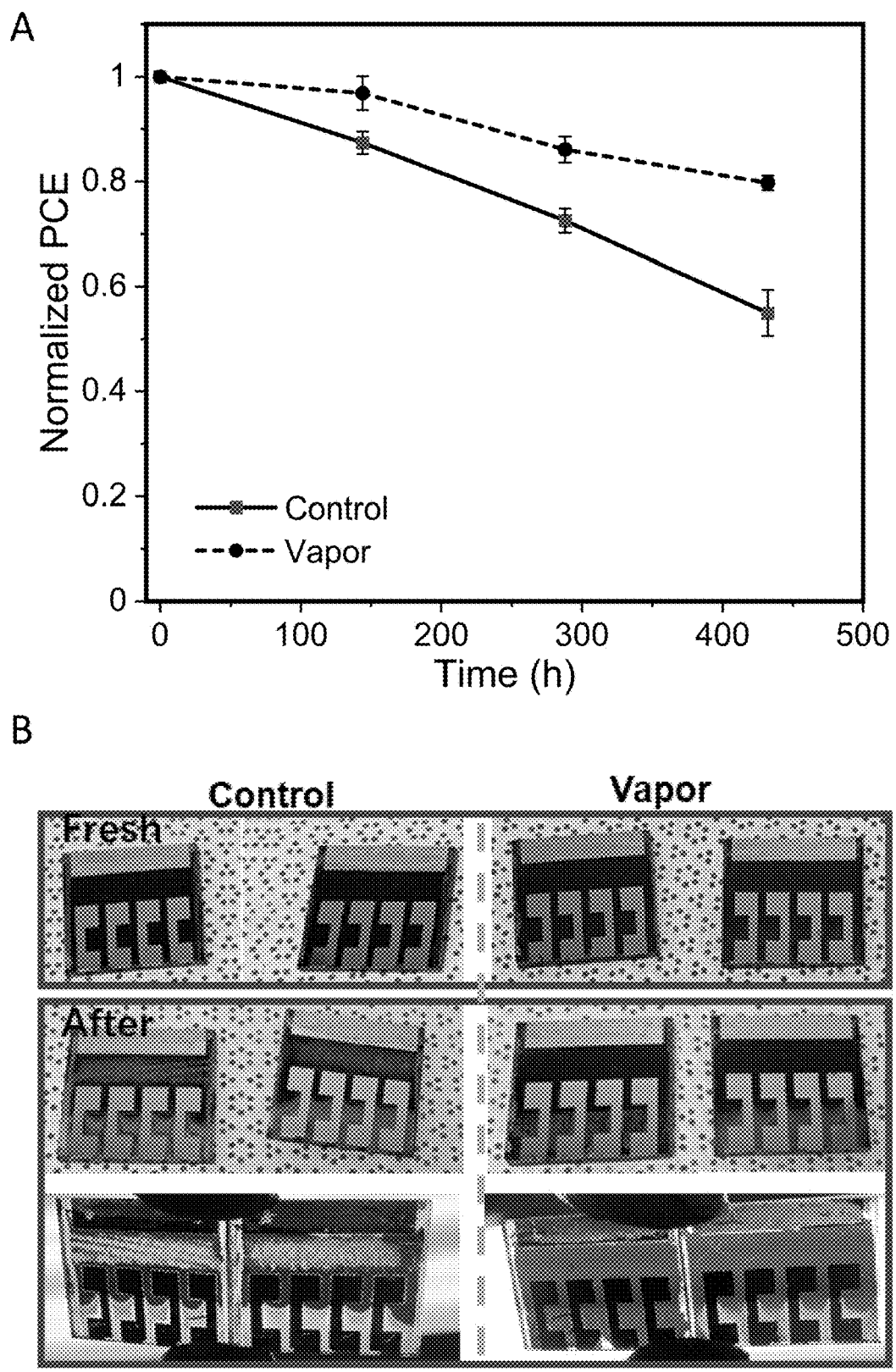
FIG. 21 illustrates in Panel A the stability of corresponding perovskite solar cells in ambient environment of 55%-75% relative humidity (RH) dark storage without any encapsulation at room temperature, according to some embodiments of the present disclosure. Panel B illustrates of the corresponding devices before and after aging to ambient 55%-75% relative humidity for 432 hours, according to some embodiments of the present disclosure; the first row are fresh films and the second and third lines are frontside and backside of aged devices, respectively.

The long-term stability of PSCs remains a challenging issue. The initial stability data of a PSC is shown in FIGS. 15C and 15D for tests of the corresponding PSCs without encapsulation under an ambient environment of 100%-20% relative humidity at 55° C. and under continuous full-sun illumination and open circuit condition of 10-20% RH. FIG. 15C shows the device with vapor-phase treatment using BA maintained 8100 of its initial PCE after 1440 hours without encapsulation; under the same conditions, the measured PCEs decreased to 64% of their initial values for the untreated perovskite devices. The vapor-phase treated perovskite solar cells also presented better stability than the untreated perovskite-based solar cells at 55%-75% relative humidity (RH) dark storage without any encapsulation at room temperature, as shown in FIG. 21.

Figure 22C:
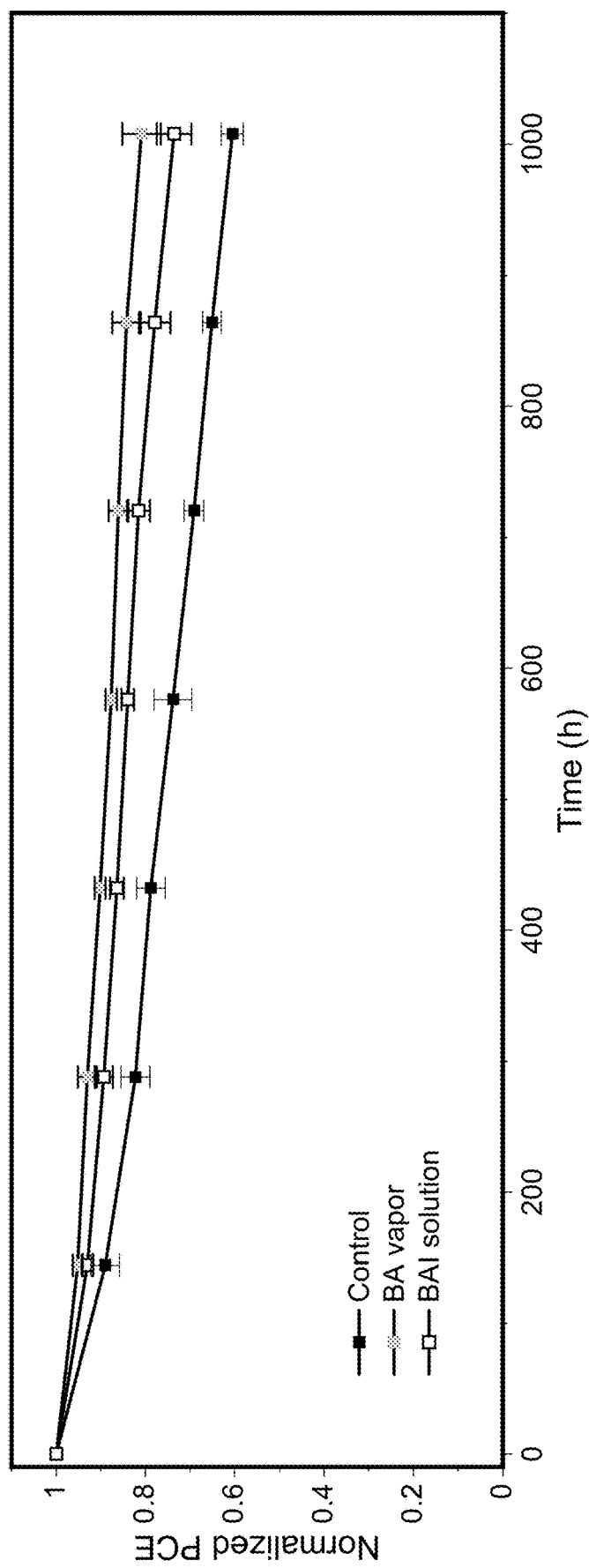
FIG. 22C illustrates a comparison of devices stability based on the control, vapor-phase treated, and BAI-solution-treated perovskite layers, according to some embodiments of the present disclosure. The stability was tested under ~one-sun illumination in air (10-20% RH), under open circuit condition.

Device stability of PSCs based on the control (i.e., untreated), vapor-phase treated, and BAI-solution-treated perovskite layers were also studied (see FIG. 15D and FIG. 22C). Note the BAI-solution-based treatment was conducted a BAI solution in IPA. The BAI-solution-treatment also improved the device performance to 22.0% and 23.3% from forward voltage scans for triple- and double-cation-mixed-halide perovskite, respectively. This performance level is higher than the control but lower than the vapor-phase treated PSCs. Note that open circuit under illumination typically represents a more stressful condition for stability testing than the load condition or maximum power point tracking. After 1000 hours testing, the vapor-treated PSCs exhibited <20% degradation from the initial efficiency values. In contrast, the BAI-solution treated PSCs exhibited about 27% degradation, whereas the control PSCs displayed about 40% degradation. These results suggest the vapor-phase surface treatment resulting in the formation of a perovskite-like layer of a bulky-organic-cation-based quasi-2D surface layer represents a promising approach to enhance the efficiency and stability of PSCs.

Figure 23A:
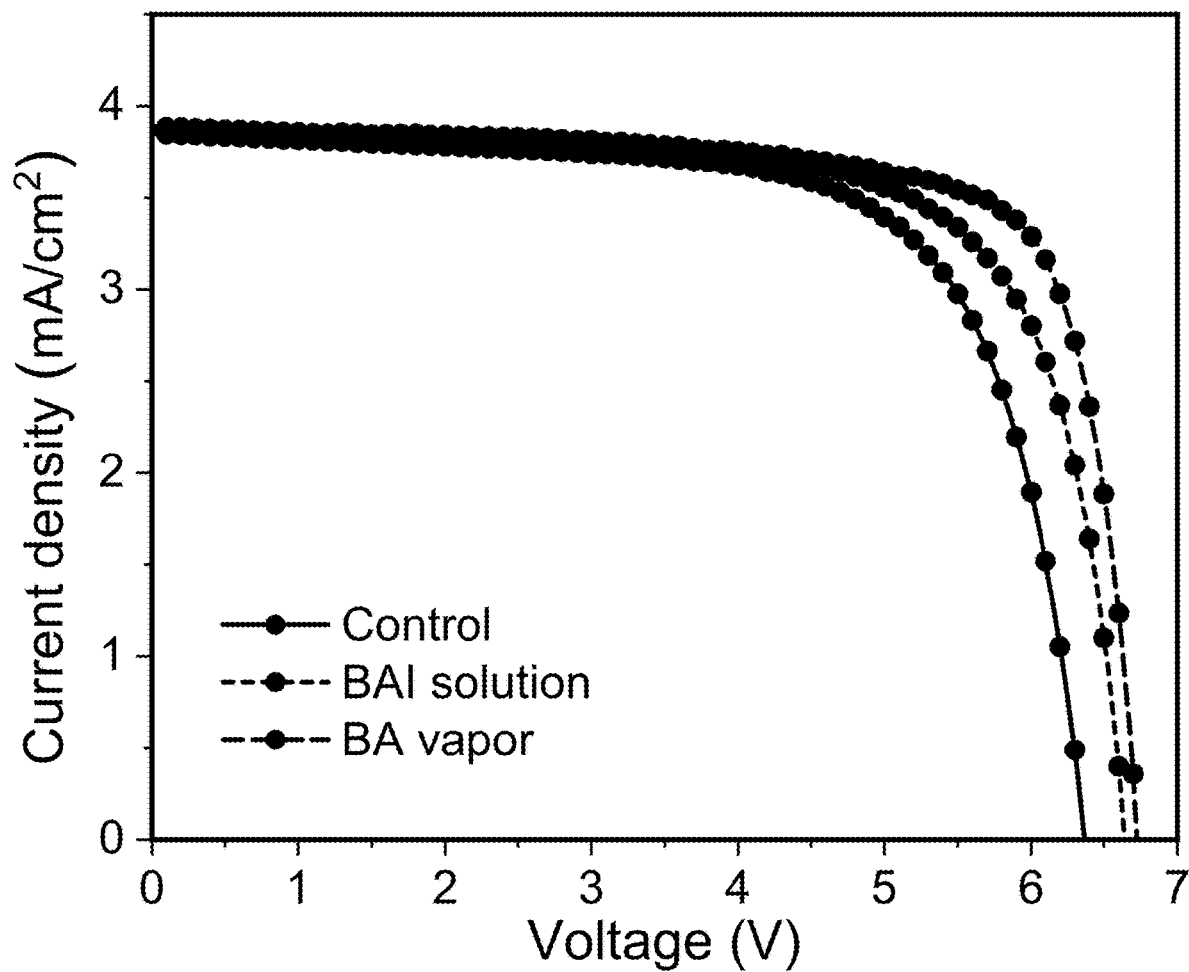
FIG. 23A illustrates J-V characteristics of corresponding modules based on $FA_{0.97}MA_{0.03}PbI_{2.91}Br_{0.09}$ perovskite compositions, according to some embodiments of the present disclosure.
Figure 23B:
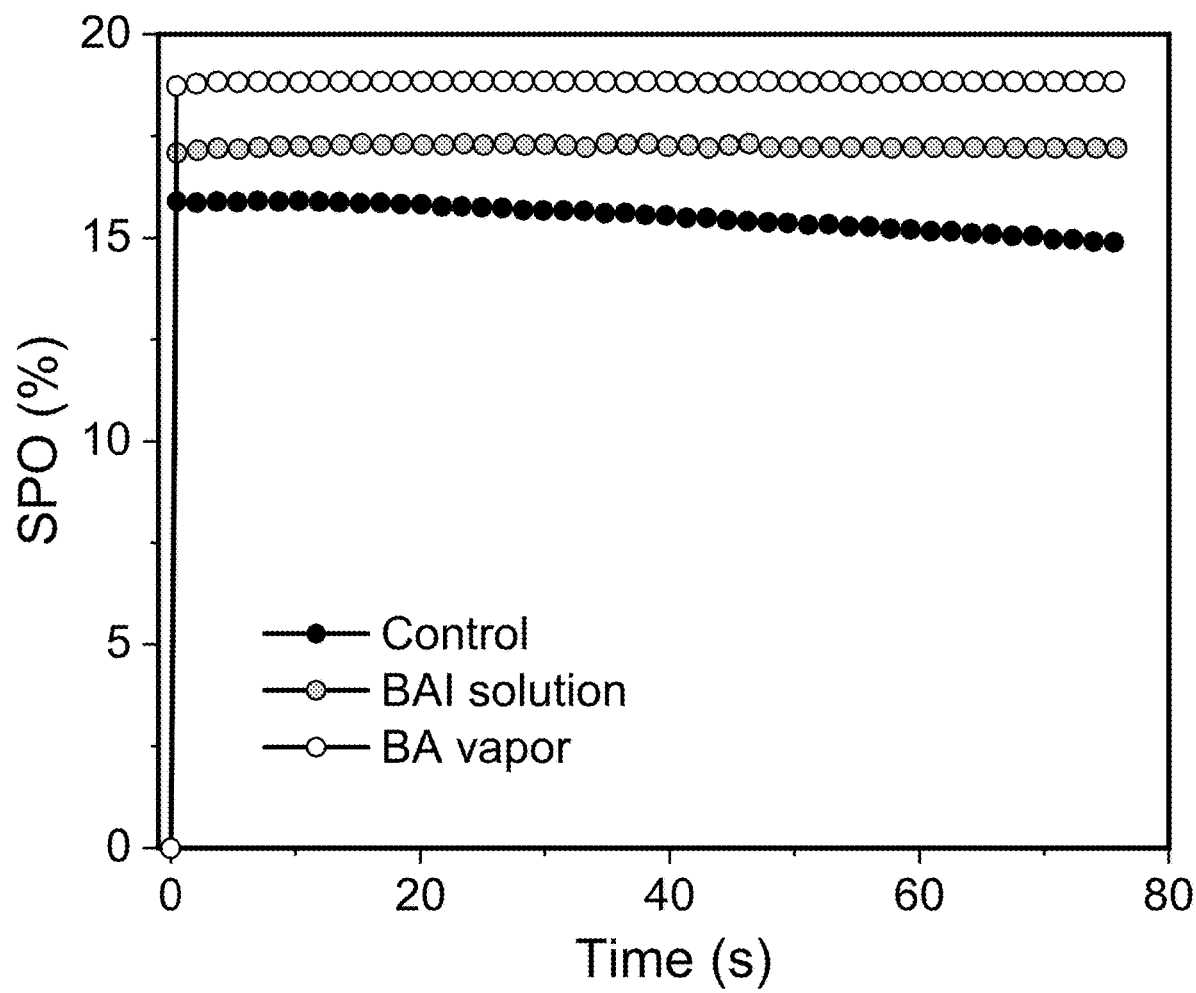
FIG. 23B illustrates stabilized power outputs (SPOs) of the corresponding modules based on $FA_{0.97}MA_{0.03}PbI_{2.91}Br_{0.09}$ perovskite compositions, according to some embodiments of the present disclosure.
Figure 23C:
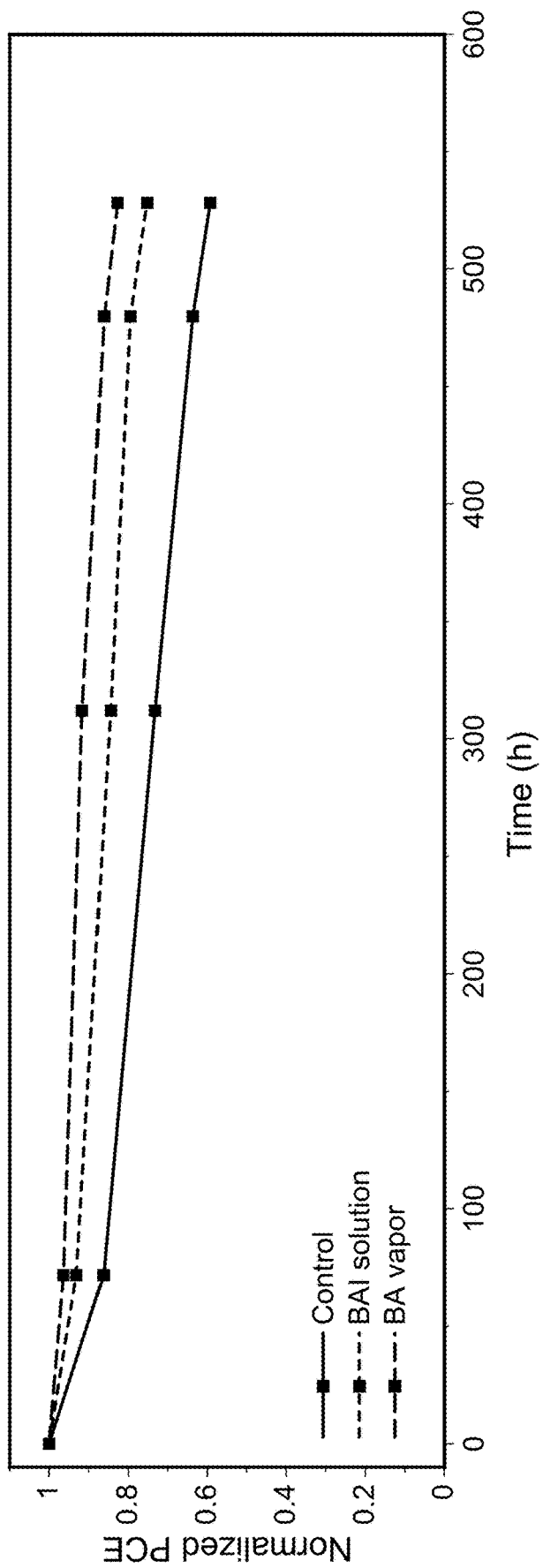
FIG. 23C illustrates a stability comparison of modules based on a control, BAI solution treated, and vapor-phase treated perovskite layers, aged under dark, 30-45% RH and room temperature in air based on $FA_{0.97}MA_{0.03}PbI_{2.91}Br_{0.09}$ perovskite compositions, according to some embodiments of the present disclosure.
Figure 23D:
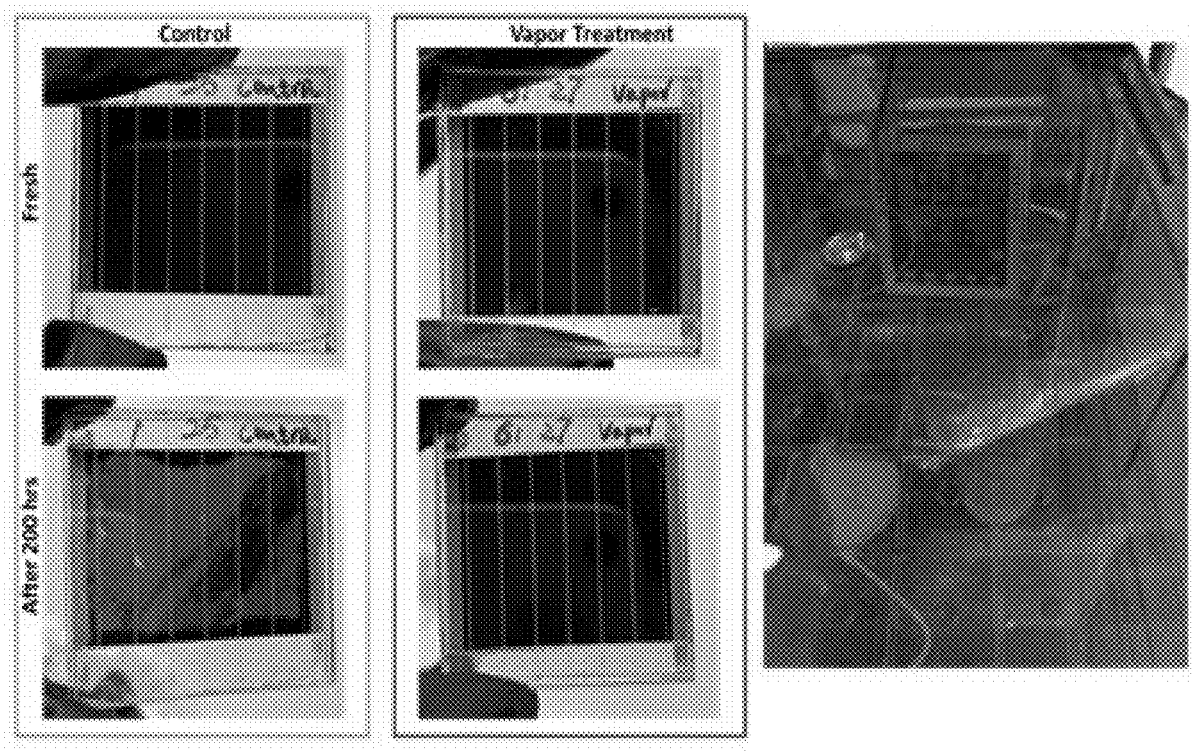
FIG. 23D illustrates photos of the corresponding modules before and after aging to ambient 99%-100% relative humidity for 200 hours based on $FA_{0.97}MA_{0.03}PbI_{2.91}Br_{0.09}$ perovskite compositions, according to some embodiments of the present disclosure.

In addition, we fabricated the mini-modules based on glass/FTO/SnO$_2$/perovskite/spiro-OMeTAD/Au to confirm the practical applications. The module characteristics based on the based on the control, vapor-treated, and BAI-solution-treated perovskite thin films are compared in FIG. 23A. The corresponding PV parameters are summarized in Table 4. The vapor surface treatment improved the module efficiency to 19.9%, in comparison to the control device with 16.9% and the BAI solution treated device with 18.3%. It is evident that the vapor surface treatment enhanced mostly in both $V_{oc}$ and FF, which is consistent with the improved surface property with vapor surface treatment. The BAI-solution-treatment also improved the module performance and this performance level is higher than the control but lower than the vapor-treated modules. The SPOs for modules match well with the J-V measurements (see inset of FIG. 23B). After 528 h testing under dark of 30-45% RH and room temperature in air, the vapor-treated module remains 82% from the initial efficiency values. In contrast, the BAI-solution treated module remains 75%, whereas the control module displayed about 59% from the initial efficiency values (see FIG. 23C). The enhanced stability of the modules based on vapor-treated perovskite film can also be seen from FIG. 23D, which shows that no obvious color change was observed for modules based on vapor-treated perovskite; whereas, those of pristine control perovskite film almost turned to yellow. These results suggest our reported vapor-phase-based surface treatment represents a promising approach to enhance the efficiency and stability of large-area devices.

TABLE 4

PV parameters of PSC modules based on control, BAI-solution- and BA-vapor-modified perovskite thin films using FA$_{0.97}$MA$_{0.03}$PbI$_{2.91}$Br$_{0.09}$ compositions.

| Device | Active Area (cm$^2$) | $J_{sc}$ (mA/cm$^2$) | $V_{oc}$ (V) | FF | PCE (%) |
|---|---|---|---|---|---|
| Control | 5.7 | 3.85 | 6.37 | 0.69 | 16.9 |
| BAI solution | 5.7 | 3.88 | 6.64 | 0.71 | 18.3 |
| Vapor | 7.5 | 3.89 | 6.72 | 0.76 | 19.9 |

Methods:

Materials. Lead oxide (PbO, 99.999%), butylamine (99.5%), N,N-anhydrous dimethylformamide (DMF), ethanol, 2-propanol (IPA), chlorobenzene (CB), and dimethyl sulfoxide (DMSO) were purchased from Sigma-Aldrich and used as-received without any other refinement unless otherwise specified. Formamidinium iodide (FAI), methylammonium bromide (MABr), methylammonium chloride (MACl), and 1,4-butane diammonium iodide (BDAI$_2$) were purchased from Greatcell Solar. Lead iodide (PbI$_2$) and lead bromide (PbBr$_2$) were from TCI Corporation. 2,2',7,7'-Tetrakis[N,N-di(4-methoxyphenyl)amino]-9,9'-spirobifluorene (spiro-OMeTAD) was received from Merck Corporation. The titanium diisopropoxide bis(acetylacetonate), bis(trifluoromethanesulfonyl)imide lithium salt, tert-butylpyridine, and cesium iodide (CsI) were purchased from Sigma-Aldrich. Substrates are patterned fluorine-doped tin-oxide-coated glass (<15 Ω/square) obtained from Advanced Election Technology Co., Ltd.

FAPbI$_3$)$_{0.85}$(MAPbI$_2$Br)$_{0.1}$(CsPbI$_3$)$_{0.05}$-based device fabrication: Devices were prepared on conductive fluorine-doped tin oxide (FTO)-coated glass substrates. The substrates were cleaned extensively by deionized water, acetone, and isopropanol. A compact titanium dioxide ($TiO_2$) layer of about 40 nm was deposited by spray pyrolysis of 9-mL ethanol solution containing 0.6-mL titanium diisopropoxide bis(acetylacetonate) solution (75% in 2-propanol, Sigma-Aldrich) and 0.4-mL acetylacetone at 450° C. in air. On top of this layer, mesoporous titanium dioxide was formed by spin-coating 30-nm-sized nanoparticles (Dyesol 30NRD, Dyesol) diluted in ethanol (1:5.5 w/w) at 4,500 rpm for 15 s. The $(FAPbI_3)_{0.85}$ $(MAPbI_2Br)_{0.1}$ $(CsPbI_3)_{0.05}$ precursor solution was prepared in a glovebox from a 1.60 M $Pb^{2+}$ with 5% excess of $PbI_2$ and in the mixed solvent of DMF and DMSO; the volume ratio of DMF/DMSO was 4:1. The spin-coating procedure was performed at 2,000 rpm for 10 s followed by 6,000 rpm for 30 s. At 15 s before the last spin-coating step, 140 µL of chlorobenzene were pipetted onto the substrate. Thereafter, the substrate was put onto a hotplate for 20 minutes at 120° C.; these are identified as the "control" samples. For vapor treatment, the samples were treated with butylamine vapors at 35° C. using a precursor line on a Beneq TFS200 atomic layer deposition system. Substrates were exposed to sequential butylamine pulses of 200 ms with a 5 s purge between each pulse. Chamber and process nitrogen flows were set to 150 and 350 sccm, respectively, resulting in an operating pressure of approximately 800 mtorr. The best condition is designated "Vapor" samples. Subsequently, the hole-transporting layer (HTM) was deposited on top of the perovskite by spin coating at 4,500 rpm for 15 s. The spiro-OMeTAD solutions were prepared by dissolving the spiro-OMeTAD in 1-mL chlorobenzene at a concentration of 77.6 mg/mL, with the addition of 20.6 µL bis(trifluoromethanesulfonyl)imide lithium salt from a stock solution in acetonitrile, 35.5 µL of tert-butylpyridine. The devices were finalized by thermal evaporation of 100-nm gold.

$FA_{0.97}MA_{0.03}PbI_{2.91}Br_{0.09}$-based device fabrication: FTO glass substrates were washed by ultrasonication in water with detergent, clean water, and 2-propanol sequentially. The $SnO_2$ electron transport layer was deposited using the chemical bath deposition method, and the resulting sample was annealed at 150° C. for 2 h. The perovskite precursor solution was prepared by mixing 1.55 M $PbI_2$, 1.55 M FAI 0.048 M $MAPbBr_3$ and 0.5 M MACl in a mixed solvent (DMF/DMSO=8:1). Then the perovskite precursor solution was deposited onto the UV-ozone treated $SnO_2$ film at 5000 rpm for 20 s, where 1 mL of diethyl ether was dropped on the rotating film 10 s after spinning. The resulting film was annealed at 150° C. for 15 min and 100° C. for 5 min, sequentially. For vapor treatment, the process is the same with previous ones. The spiro-OMeTAD layer was deposited on the perovskite layer by spin coating the spiro-OMeTAD stock solution at 4000 rpm for 30 s. Finally, a 100 nm Au electrode layer was deposited by thermal evaporation.

Perovskite film and device characterization: SEM (FEI Nova 630, field-emission gun) imaging was performed with an electron-beam voltage of 3 kV in the immersion-lens mode. The XRD of the perovskite films was characterized using a Rigaku D-Max 2200 diffractometer with Cu Kα radiation. The optical absorption spectra of perovskite films were measured using an ultraviolet/visible (UV/Vis) spectrophotometer (Cary6000i). Solar cell performance measurements were taken under a simulated AM 1.5G illumination (100 mW/cm², Oriel Sol3A Class AAA Solar Simulator). The photocurrent density-voltage (J-V) characteristics were measured using a Keithley 2400 source meter. The J-V curves of all devices were measured by masking the active area with a metal mask of area 0.12 cm². Both backward-scan and forward-scan curves were measured with a bias step of 10 mV and delay time of 0.05 s. The continuous current and power output were measured using a potentiostat (Princeton Applied Research, Versa STAT MC). External quantum efficiency (EQE) spectra of solar cells were measured using a solar cell quantum-efficiency measurement system (QEX10, PV Measurements).

GIWAXS characterization: GIWAXS data were collected at beamline 11-3 at the Stanford Synchrotron Radiation Source (SSRL) at the SLAC National Accelerator Laboratory. The X-ray photon energy used at this beamline is 12.7 keV. Samples were exposed to the beam for 60 s in a sealed chamber under helium flow in grazing incidence geometry at an incident angle in the range of 0.12°-3.12°. A Rayonix MX225 CCD area detector was placed at a sample-to-detector distance of 200 mm. Collected data was calibrated against a reference sample ($LaB_6$) using a software package pyFAI. The same python package was used for the data processing to obtain 2D and integrated 1D diffraction patterns as a function of a scattering vector $$q = \frac{4\pi}{\lambda}\sin\left(\frac{2\theta}{2}\right).$$

The integration was performed between 0°<χ<90°, where χ is the azimuthal angle.

KPFM characterization: The measurements were performed inside an Ar-filled glovebox with water and oxygen level lower than 0.01 ppm. All the scans were collected via Nanosensor PPP-EFM tips. The KPFM mappings have a spatial resolution of 30 nm and an electrical resolution of 10 mV. We directly cleaved the cells inside the glovebox with no exposure to air or polishing/ion-milling treatments to flatten the surface. Topographic and potential images were collected simultaneously during the probe scanning.

X-ray Photoemission Spectroscopy (XPS) characterization: XPS measurements were performed on a Physical Electronics 5600 photoelectron spectrometer, which has been discussed in detail previously. Briefly, radiation was produced by a monochromatic 350 W Al Kα excitation centered at 1486.7 eV. XPS core-level spectra were collected using a step size of 0.1 eV and pass energy of 11.75 eV. Peak areas were fit using a Gaussian-Lorentzian peak fitting algorithm with a Shirley background. Spectra taken with the Al source are typically assigned an uncertainty of 0.05 eV. Compositional analyses and deconvolutions are typically assigned an uncertainty of 5%.

EXAMPLES

Example 1. A composition comprising: a first layer comprising a perovskite defined by $ABX_3$; and a second layer comprising a perovskite-like material defined by at least one of $A'_2B'X'_4$, $A'_3B'_2X'_9$, $A'B'X'_4$, $A'_2B'X'_6$, or $A'_2AB'_2X'_7$, wherein: the first layer is adjacent to the second layer, A is a first cation, B is a second cation, X is a first anion, A' is a third cation, B' is a fourth cation, X' is a second anion, and A' is different than A.

Example 2. The composition of Example 1, wherein A' comprises an ammonium functional group.

Example 3. The composition of either Example 1 or Example 2, wherein A' comprises at least one of butylammonium (BA), phenylethylammonium (PEA), 4-flouorophenethylammonium (F-PEA), N-methyl-1,3-propane diammonium (ME-PDA), 1,4-butane diammonium (BDA), or N,N-dimethyl-1,3-propane diammonium (DMePDA), dipropylammonium, or diethylammonium.

Example 4. The composition of any one of Examples 1-3, wherein the second layer has a thickness between about 1 nm and about 1 μm.

Example 5. The composition of any one of Examples 1-4, wherein the thickness is between about 10 nm and about 100 nm.

Example 6. The composition of any one of Examples 1-5, wherein the first layer has a thickness between about 200 nm and about 1000 nm.

Example 7. The composition of any one of Examples 1-6, wherein X comprises a halide.

Example 8. The composition of any one of Examples 1-7, wherein X comprises at least one of iodide, bromide, or chloride.

Example 9. The composition of any one of Examples 1-8, wherein B comprises at least one of tin or lead.

Example 10. The composition of any one of Examples 1-9, wherein A comprises at least one of methylammonium (MA), formamidinium (FA), dimethylammonium, or cesium.

Example 11. The composition of any one of Examples 1-10, wherein the perovskite comprises $FA_{(1-x-y)}MA_xCs_yPbI_{(3-z)}Br_z$.

Example 12. The composition of any one of Examples 1-11, wherein X' comprises a halide.

Example 13. The composition of any one of Examples 1-12, wherein X' comprises at least one of iodide, bromide, or chloride.

Example 14. The composition of any one of Examples 1-13, wherein B' comprises at least one of tin or lead.

Example 15. The composition of any one of Examples 1-14, wherein the perovskite-like material comprises $BA_2(MA_xFA_{1-x})Pb_2(I_{1-y}Br_y)_7$.

Example 16. The composition of any one of Examples 1-15, wherein the perovskite-like material comprises at least one of $BA_2PbI_4$, $BA_2PbBr_4$, $BA_2MAPb_2I_7$, $BA_2FAPb_2I_7$, $BA_2MAPb_2Br_7$, or $BA_2FAPb_2Br_7$.

Example 17. A device comprising: a first layer comprising: a perovskite; a surface that is substantially planar; the surface comprises a cut into the surface; and the cut penetrates the surface and the first layer and comprises a width, a depth, a length, and an internal surface; a second layer comprising a perovskite-like material, wherein: the second layer covers at least a portion of the internal surface.

Example 18. The device of Example 17, wherein the cut penetrates the surface and the first layer at an angle substantially perpendicular to the surface.

Example 19. The device of either Example 17 or Example 18, wherein the second layer only coats the portions of the internal surface that are substantially perpendicular to the surface.

Example 20. A method comprising: depositing a second layer onto a first layer, wherein: the first layer comprises a perovskite, the second layer comprises a perovskite-like layer, and the depositing is performed using at least one of a solution method and/or a vapor-phase method.

Example 21. The method of Example 20, wherein the depositing is performed using a vapor-phase method while simultaneously heating at least a portion of the first layer.

Example 22. The method of either Example 20 or Example 21, wherein the depositing is performed using an atomic layer deposition (ALD) technique.

Example 23. The method of any one of Examples 20-22, wherein the ALD technique is performed at a temperature between about 25° C. and about 300° C.

Example 24. The method of any one of Examples 20-23, wherein the temperature is between about 25° C. and about 150° C.

Example 25. The method of any one of Examples 20-24, wherein the ALD technique is performed at a pressure between about 10 mtorr and about 5000 mtorr.

Example 26. The method of any one of Examples 20-25, wherein the pressure is between about 100 mtorr and about 1000 mtorr.

Example 27. The method of any one of Examples 20-26, wherein the depositing is performed using between 1 ALD cycles and 1,000 ALD cycles.

Example 28. The method of any one of Examples 20-27, wherein the number of ALD cycles is between 100 and 300.

Example 29. The method of any one of Examples 20-28, further comprising, prior to the depositing, scribing the surface to produce the cut.

Example 30. The method of any one of Examples 20-29, wherein the scribing is performed using a laser.

Example 31. The method of any one of Examples 20-30, wherein photochemistry is initiated by the laser during the scribing.

Example 32. The method of any one of Examples 20-31, wherein the photochemistry comprises iodo-ene coupling chemistry.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A composition comprising:
   a first layer comprising a perovskite defined by $ABX_3$; and
   a second layer comprising a perovskite-like material defined by at least one of $A'_2B'X'_4$, $A'_3B'_2X'_9$, $A'B'X'_4$, $A'_2B'X'_6$, or $A'_2AB'_2X'_7$, wherein:
   the first layer is adjacent to the second layer,
   A is a first cation, B is a second cation, X is a first anion,
   A' is a third cation, B' is a fourth cation, X' is a second anion, and
   A' is different than A.

2. The composition of claim 1, wherein A' comprises an ammonium functional group.

3. The composition of claim 2, wherein A' comprises at least one of butylammonium (BA), phenylethylammonium (PEA), 4-flouorophenethylammonium (F-PEA), N-methyl-1,3-propane diammonium (ME-PDA), 1,4-butane diammonium (BDA), or N,N-dimethyl-1,3-propane diammonium (DMePDA), dipropylammonium, or diethylammonium.

4. The composition of claim 1, wherein the second layer has a thickness between about 1 nm and about 1 μm.

5. The composition of claim 4, wherein the thickness is between about 10 nm and about 100 nm.

6. The composition of claim 1, wherein the first layer has a thickness between about 200 nm and about 1000 nm.

7. The composition of claim 1, wherein X comprises a halide.

8. The composition of claim 7, wherein X comprises at least one of iodide, bromide, or chloride.

9. The composition of claim 1, wherein B comprises at least one of tin or lead.

10. The composition of claim 1, wherein A comprises at least one of methylammonium (MA), formamidinium (FA), dimethylammonium, or cesium.

11. The composition of claim 10, wherein the perovskite comprises $FA_{(1-x-y)}MA_xCs_yPbI_{(3-z)}Br_z$.

12. The composition of claim 1, wherein X' comprises a halide.

13. The composition of claim 12, wherein X' comprises at least one of iodide, bromide, or chloride.

14. The composition of claim 1, wherein B' comprises at least one of tin or lead.

15. The composition of claim 1, wherein the perovskite-like material comprises $BA_2(MA_xFA_{1-x})Pb_2(I_{1-y}Br_y)_7$.

16. The composition of claim 1, wherein the perovskite-like material comprises at least one of $BA_2PbI_4$, $BA_2PbBr_4$, $BA_2MAPb_2I_7$, $BA_2FAPb_2I_7$, $BA_2MAPb_2Br_7$, or $BA_2FAPb_2Br_7$.

17. A device comprising:
a first layer comprising:
a perovskite;
a surface that is substantially planar;
the surface comprises a cut into the surface; and
the cut penetrates the surface and the first layer and comprises a width, a depth, a length, and an internal surface;
a second layer comprising a perovskite-like material, wherein:
the second layer covers at least a portion of the internal surface.

18. A method comprising:
depositing a second layer onto a first layer, wherein:
the first layer comprises a perovskite,
the second layer comprises a perovskite-like layer, and
the depositing is performed using at least one of a solution method or a vapor-phase method.

19. The method of claim 18, wherein the depositing is performed using the vapor-phase method while simultaneously heating at least a portion of the first layer.

20. The method of claim 19, wherein the depositing is performed using an atomic layer deposition (ALD) technique.

* * * * *